US008188583B2

(12) United States Patent
Arita et al.

(10) Patent No.: US 8,188,583 B2
(45) Date of Patent: May 29, 2012

(54) SEMICONDUCTOR DEVICE AND METHOD OF MANUFACTURING SAME

(75) Inventors: Junichi Arita, Tokyo (JP); Kazuko Hanawa, Tokyo (JP); Makoto Nishimura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 180 days.

(21) Appl. No.: 12/731,201

(22) Filed: Mar. 25, 2010

(65) Prior Publication Data

US 2010/0244214 A1 Sep. 30, 2010

(30) Foreign Application Priority Data

Mar. 31, 2009 (JP) ................................. 2009-086427

(51) Int. Cl.
*H01L 23/495* (2006.01)
(52) U.S. Cl. ................ 257/676; 257/E23.039; 257/669; 257/670; 257/674; 438/123
(58) Field of Classification Search ........... 257/E23.039, 257/E23.031, E21.506, 676, 666, 669, 670, 257/667, 674; 438/123, 124, 112, 127
See application file for complete search history.

(56) References Cited

U.S. PATENT DOCUMENTS

| 4,942,454 | A | * | 7/1990 | Mori et al. ..................... 257/676 |
|---|---|---|---|---|
| 5,150,193 | A | * | 9/1992 | Yasuhara et al. ............... 257/669 |
| 5,378,656 | A | * | 1/1995 | Kajihara et al. ................ 29/827 |
| 5,712,507 | A | * | 1/1998 | Eguchi et al. .................. 257/666 |
| 5,874,773 | A | * | 2/1999 | Terada et al. .................. 257/676 |
| 5,942,794 | A | * | 8/1999 | Okumura et al. .............. 257/666 |
| 5,986,333 | A | * | 11/1999 | Nakamura ..................... 257/667 |
| 6,020,625 | A | * | 2/2000 | Qin et al. ....................... 257/666 |
| 6,087,715 | A | * | 7/2000 | Sawada et al. ................. 257/666 |
| 6,114,752 | A | * | 9/2000 | Huang et al. ................... 257/666 |
| 6,137,160 | A | * | 10/2000 | Ishikawa ........................ 257/676 |
| 6,306,687 | B1 | * | 10/2001 | Corisis et al. .................. 438/123 |
| 6,454,158 | B1 | * | 9/2002 | Takahashi .................... 228/180.5 |
| 6,642,609 | B1 | * | 11/2003 | Minamio et al. ............... 257/666 |
| 6,828,659 | B2 | * | 12/2004 | Iwakiri .......................... 257/666 |
| 6,828,661 | B2 | * | 12/2004 | Araki et al. .................... 257/676 |

(Continued)

FOREIGN PATENT DOCUMENTS

JP 6-216303 A 8/1994

(Continued)

*Primary Examiner* — Chris Chu
(74) *Attorney, Agent, or Firm* — Miles & Stockbridge P.C.

(57) ABSTRACT

To improve the heat dissipation characteristics of a semiconductor device.
The semiconductor device has a die pad, a heat dissipating plate in the form of a frame arranged between the die pad and a plurality of leads so as to surround the die pad, a plurality of members that connect the die pad and the inner edge of the heat dissipating plate, and a suspension lead linked to the outer extension of the heat dissipating plate, wherein a semiconductor chip the outer shape of which is larger than the die pad is mounted over the die pad and the members. The top surface of the die pad and the top surface of the members at the part in opposition to the back surface of the semiconductor chip are bonded to the back surface of the semiconductor chip in their entire surfaces with a silver paste. Heat in the semiconductor chip is conducted from the back surface of the semiconductor chip to the heat dissipating plate via the silver paste, the die pad, and the member, and dissipated to the outside of the semiconductor device therefrom via the lead.

19 Claims, 49 Drawing Sheets

U.S. PATENT DOCUMENTS

| | | | |
|---|---|---|---|
| 6,943,456 B2 * | 9/2005 | Miyaki et al. | 257/784 |
| 7,834,429 B2 * | 11/2010 | Uematsu | 257/666 |
| 7,952,177 B2 * | 5/2011 | Kawasaki et al. | 257/678 |
| 2006/0033185 A1 * | 2/2006 | Kummerl et al. | 257/666 |
| 2007/0007634 A1 * | 1/2007 | Youn et al. | 257/676 |

FOREIGN PATENT DOCUMENTS

| | | |
|---|---|---|
| JP | 8-78605 A | 3/1996 |
| JP | 11-168169 A | 6/1999 |
| JP | 2001-345412 A | 12/2001 |
| JP | 2005-183492 A | 7/2005 |

* cited by examiner

SEMICONDUCTOR DEVICE AND METHOD OF MANUFACTURING SAME

CROSS-REFERENCE TO RELATED APPLICATION

The disclosure of Japanese Patent Application No. 2009-86427 filed on Mar. 31, 2009 including the specification, drawings and abstract is incorporated herein by reference in its entirety.

BACKGROUND OF THE INVENTION

The present invention relates to a semiconductor device and a method of manufacturing the same, in particular, to technology which is effective when applied to a resin-sealed semiconductor package and a method of manufacturing the same.

A QFP semiconductor device is manufactured by mounting a semiconductor chip over a chip mounting part of a lead frame, coupling a plurality of leads of the lead frame and a plurality of electrodes of the semiconductor chip with a bonding wire, forming a sealing resin part that seals the chip mounting part, the semiconductor chip, the bonding wire, and the inner lead part of the leads, cutting the lead from the lead frame, and bending the outer lead part of the lead.

Japanese Patent Laid-Open No. Hei 6-216303 (Patent Document 1) describes a technique to make the outer dimensions of a die pad smaller than the outer dimensions of a semiconductor chip to be mounted thereon.

Japanese Patent Laid-Open No. Hei 11-168169 (Patent Document 2) describes a technique to provide a ground coupling part electrically coupled to a tab suspension lead and supported thereby.

Japanese Patent Laid-Open No. Hei 8-78605 (Patent Document 3) describes a technique to provide a slit in the center of a die pad part and at the same time, to provide a plurality of slits that surround the slit around the outer circumference of the die pad part.

Japanese Patent Laid-Open No. 2001-345412 (Patent Document 4) describes a semiconductor device having a configuration in which a die pad support that supports a die pad has a stress relaxing part in a region located between the die pad and the tip end of an inner lead.

Japanese Patent Laid-Open No. 2005-183492 (Patent Document 5) describes that a die pad has a bonded part in the center, an opened slit part, and a circumferential edge part, the circumferential edge part is formed around the outside of the bonded part, the slit part is formed so as to surround the bonded part and to be located between the bonded part and the circumferential edge part, the four corners of a semiconductor chip bonded to the bonded part are supported while overlapping the circumferential edge part, and part of the slit part bulges out to the outside of the semiconductor chip.

SUMMARY OF THE INVENTION

The examination of the inventors of the present invention has found the following.

A semiconductor package (semiconductor device) used in an automobile etc. is placed in a high temperature environment when on board, and therefore, an LSI formed in a semiconductor chip in the package is operated in a high temperature environment as a result. Further, as the functions of an LSI are improved or its operation speed is increased, power consumption of a semiconductor chip in a package tends to increase and the amount of generated heat also tends to increase. Because of this, the temperature of a semiconductor element in operation, which constitutes the LSI in the semiconductor chip, is the sum of the high temperature in the environment and an increase in temperature due to heat generation, and therefore, the temperature becomes higher and higher.

However, the higher the temperature of a semiconductor element (MISFET element etc.) in operation, which constitutes an LSI in a semiconductor chip, the more likely the deterioration of a gate insulating film etc. occurs, and therefore, its lifetime is reduced. Further, in an operation at high temperatures, the leak current tends to increase and therefore a malfunction becomes more likely to occur. Because of this, it is desired to suppress an increase in temperature of a semiconductor chip in a package by improving the heat dissipation characteristics of the semiconductor package. For example, for a semiconductor package used as a microcomputer for controlling an engine and a transmission of an automobile, it is demanded to suppress the temperature of a semiconductor element formed in a semiconductor chip in the package to 150° C. or less under the conditions that power consumption is 0.7 W and the temperature of the environment when in operation is 125° C.

Because of this, a semiconductor package is desired, which has high reliability and has improved the heat dissipation characteristics (that is, the thermal resistance is low).

The present invention has been made in view of the above circumstances and provides a technique capable of improving the heat dissipation characteristics of a semiconductor device.

The other purposes and the new feature of the present invention will become clear from the description of the present specification and the accompanying drawings.

The following explains briefly the outline of a typical invention among the inventions disclosed in the present application.

A semiconductor device according to a typical embodiment has a semiconductor chip, a plurality of leads arranged around the semiconductor chip, a bonding wire that electrically couples the lead and an electrode, respectively, a chip mounting part on which the semiconductor chip is mounted, a frame body part arranged between the chip mounting part and the lead so as to surround the chip mounting part, and a plurality of suspension leads linked to the outer edge of the frame body part. Further, the semiconductor device comprises a sealing body that seals the semiconductor chip, the bonding wire, the chip mounting part, the frame body part, the suspension lead, and part of the lead. Then, the chip mounting part is located immediately under the semiconductor chip and has a first part smaller than the outer shape of the semiconductor chip and a plurality of second parts that connect the first part and the inner edge of the frame body part, and the main surface of the first part and the main surface of the part of the second part in opposition to the back surface of the semiconductor chip are bonded to the back surface of the semiconductor chip in their entire surfaces with an adhesive.

A semiconductor device according to another typical embodiment has a semiconductor chip, a plurality of leads arranged around the semiconductor chip, a bonding wire that electrically couples the lead and the electrode, respectively, a chip mounting part on which the semiconductor chip is mounted, a frame body part arranged between the chip mounting part and the lead so as to surround the chip mounting part, and a plurality of suspension leads linked to the outer edge of the frame body part. Further, the semiconductor device comprises a sealing body that seals the semiconductor chip, the bonding wire, the chip mounting part, the frame body part, the suspension lead, and part of the lead. Then, the chip mounting part is located immediately under the semiconductor chip and has a first part smaller than the outer shape of the semiconductor chip and a plurality of second parts that connect the first part and the inner edge of the frame body part, the main surface of the first part and the main surface of the part of the second part in opposition to the back surface of the semiconductor chip are bonded to the back surface of the semiconductor chip in their entire surfaces with an adhesive, and the thermal conductivity of the adhesive is higher than the thermal conductivity of the sealing body.

A semiconductor device according to still another typical embodiment has a semiconductor chip, a plurality of leads arranged around the semiconductor chip, a bonding wire that electrically couples the lead and the electrode, respectively, a chip mounting part on which the semiconductor chip is mounted, and a plurality of suspension leads linked to the chip mounting part. Further, the semiconductor device comprises a sealing body that seals the semiconductor chip, the bonding wire, the chip mounting part, the suspension lead, and part of the lead. Then, the outer edge of the chip mounting part is located outside the outer circumference of the semiconductor chip, a plurality of openings that penetrate through from the main surface to the back surface is formed in the chip mounting part, and the respective openings have a part that overlaps the semiconductor chip in a planar manner and a part that does not. Then, the main surface of the chip mounting part in the region in opposition to the back surface of the semiconductor chip and in the region where the openings are not formed is bonded to the back surface of the semiconductor chip in its entire surface with an adhesive.

A method of manufacturing a semiconductor device according to still another typical embodiment has the steps of (a) preparing a lead frame having a chip mounting part having a frame body part, a first part located in the center of a region surrounded by the frame body part, and a plurality of second parts that connect the first part and the inner edge of the frame body part, and a plurality of leads arranged around the frame body part, and (b) applying an adhesive over the main surface of the chip mounting part of the lead frame. Further, the method has the steps of (c) after the step (b), arranging the semiconductor chip via the adhesive over the main surface of the chip mounting part of the lead frame so that the back surface of the semiconductor chip is in opposition to the main surface of the chip mounting part, and spreading the adhesive on the entire surface of the part where the main surface of the chip mounting part and the back surface of the semiconductor chip are in opposition to each other by applying a load to the semiconductor chip, and (d) after the step (c), curing the adhesive.

The following explains briefly the effect acquired by the typical invention among the inventions disclosed in the present application.

According to a typical embodiment, it is possible to improve the heat dissipation characteristics of a semiconductor device.

DETAILED DESCRIPTION OF THE PREFERRED EMBODIMENTS

Figure 1:
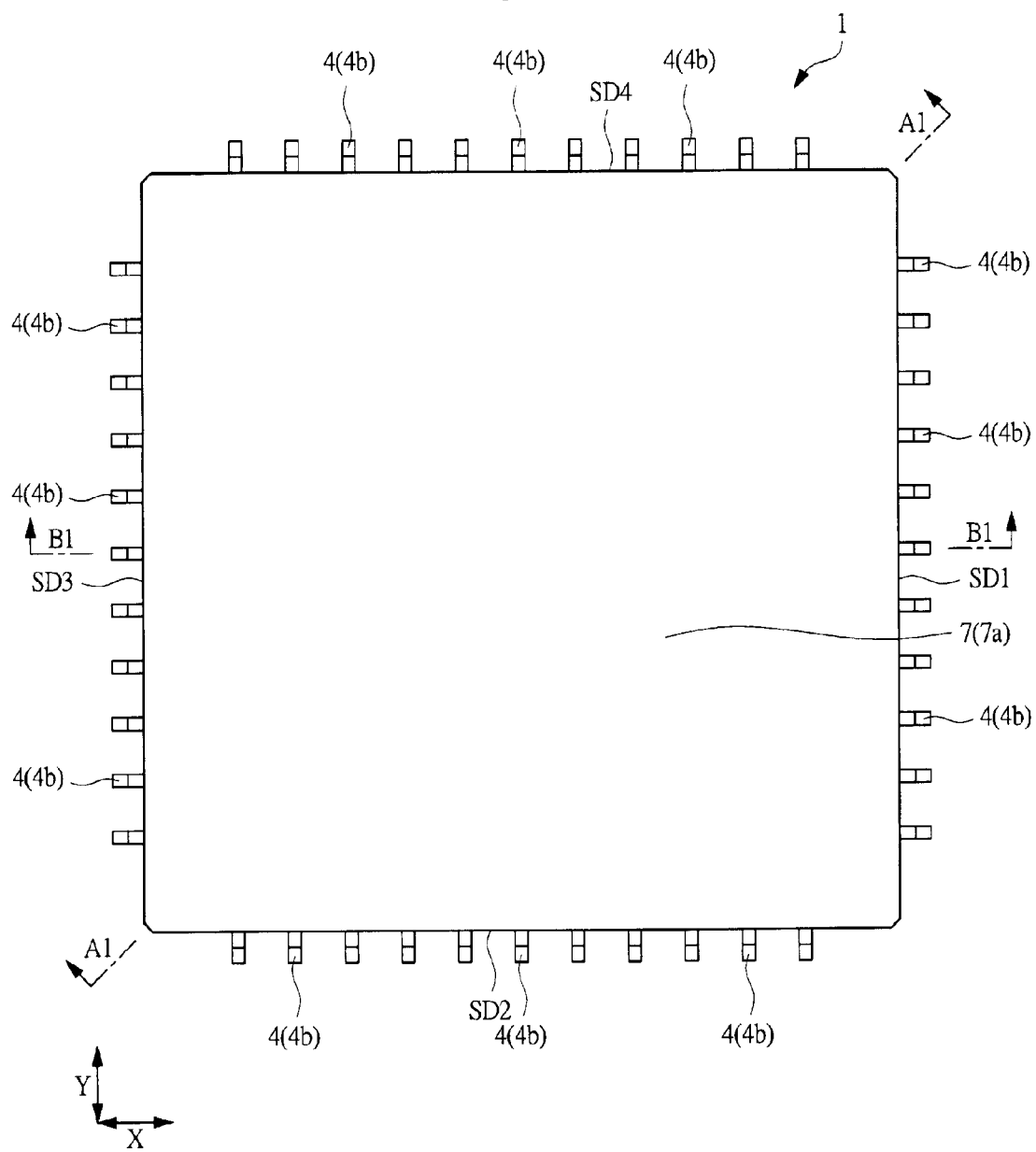
FIG. 1 is a top view of a semiconductor device in a first embodiment of the present invention.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Embodiments of the present invention are explained in detail below based on the drawings. In all the drawings for explaining embodiments, the same symbol is attached to the same member having the same function, as a principle, and the repeated explanation thereof is omitted. In the following embodiments the explanation of the same or similar parts is not given unless it is necessary in particular.

In the drawings used in the embodiments, in order to make a drawing intelligible, hatching may be omitted even if it is a section view. In order to make a drawing intelligible, hatching may be attached even if it is a plan view.

First Embodiment

About Structure of Semiconductor Device

A semiconductor device in an embodiment of the present invention is explained with reference to the drawings.

Figure 2:
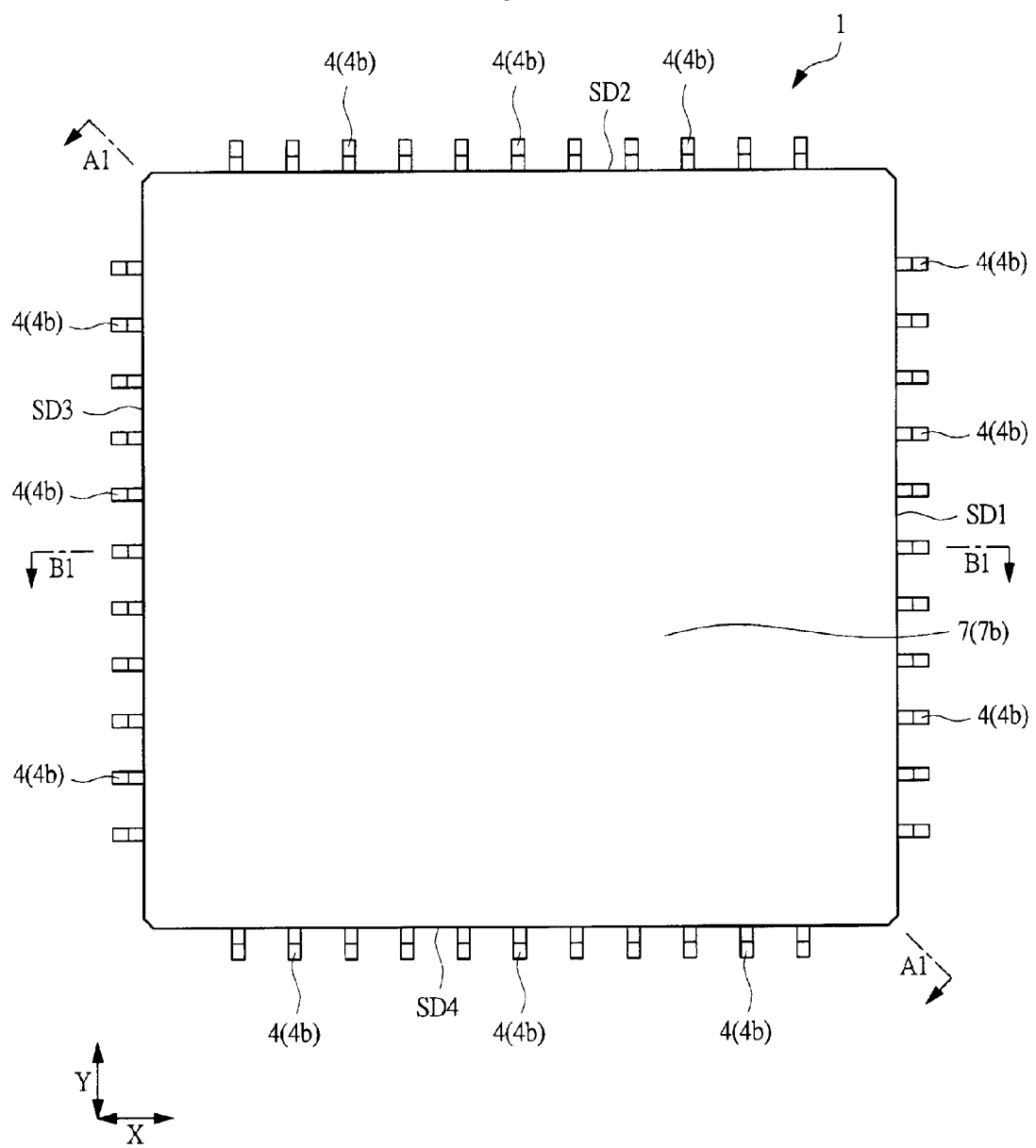
FIG. 2 is a bottom view of the semiconductor device in the first embodiment of the present invention.
Figure 3:
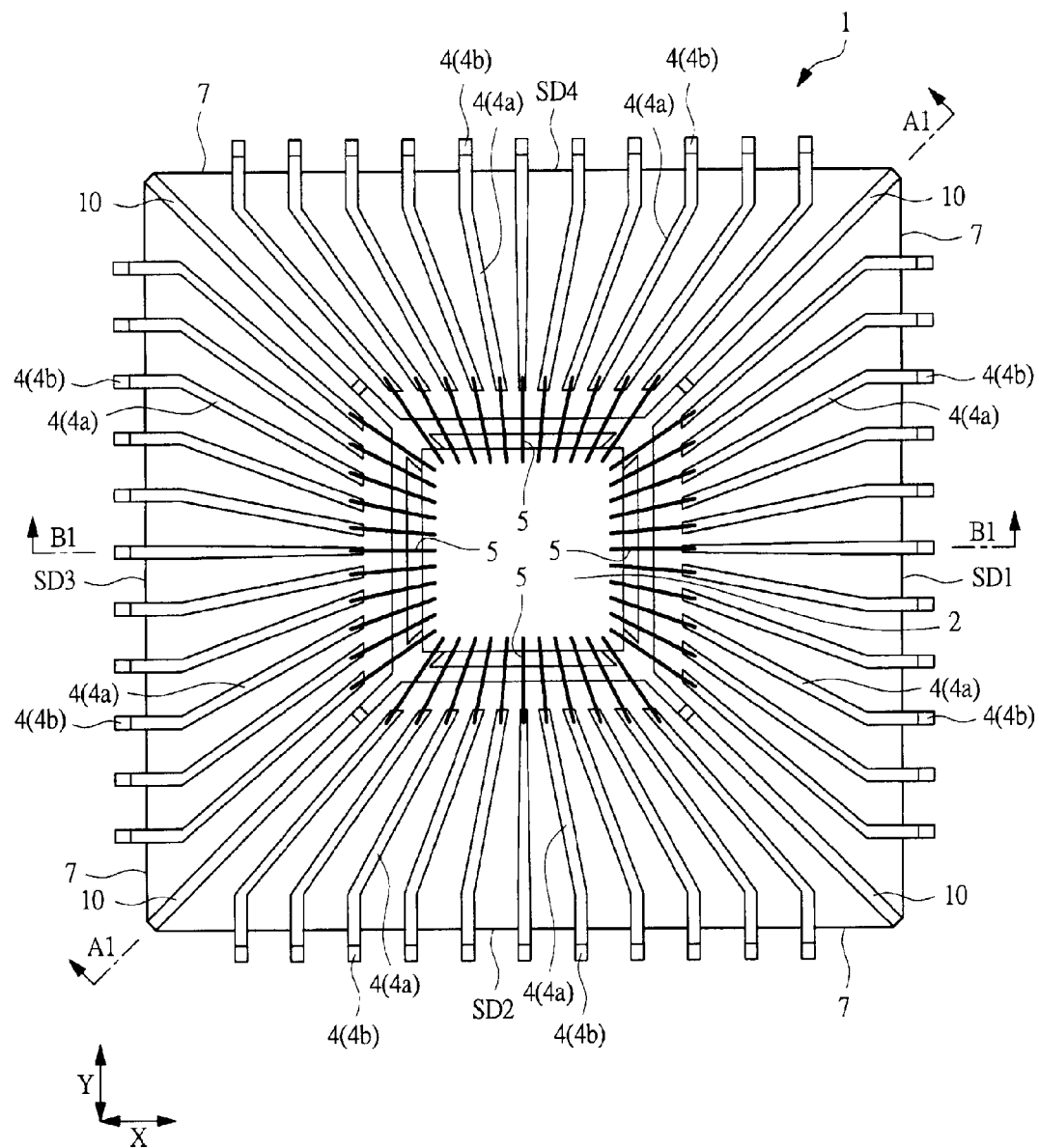
FIG. 3 is a plan perspective view of the semiconductor device in the first embodiment of the present invention.
Figure 4:
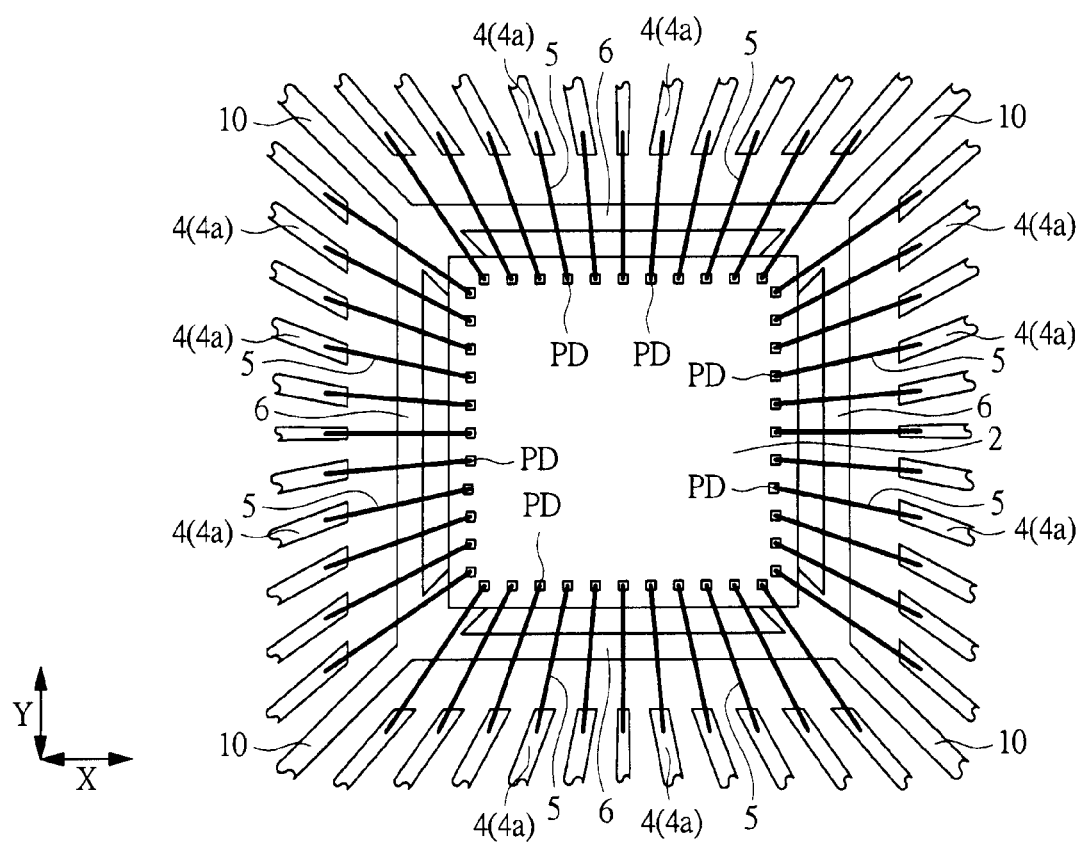
FIG. 4 is a partially enlarged plan perspective view of the semiconductor device in the first embodiment of the present invention.
Figure 5:
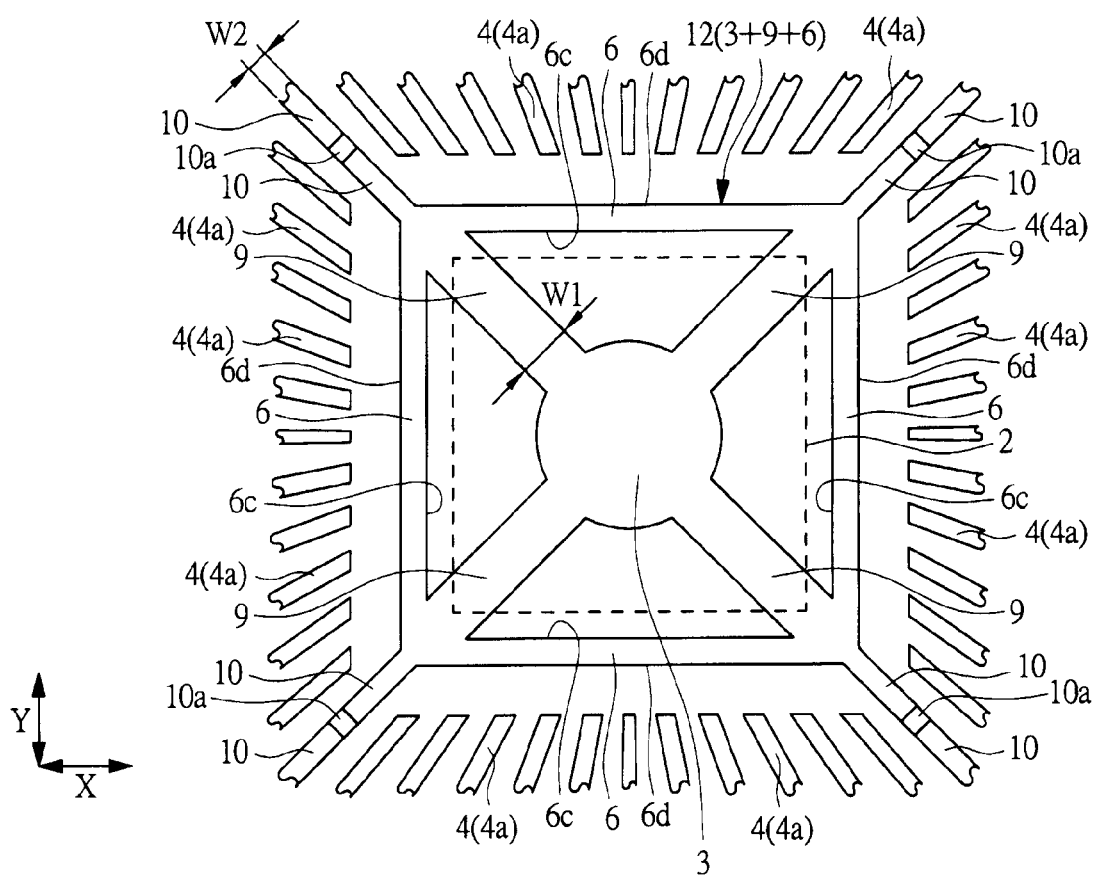
FIG. 5 is a partially enlarged plan perspective view of the semiconductor device in the first embodiment of the present invention.
Figure 6:
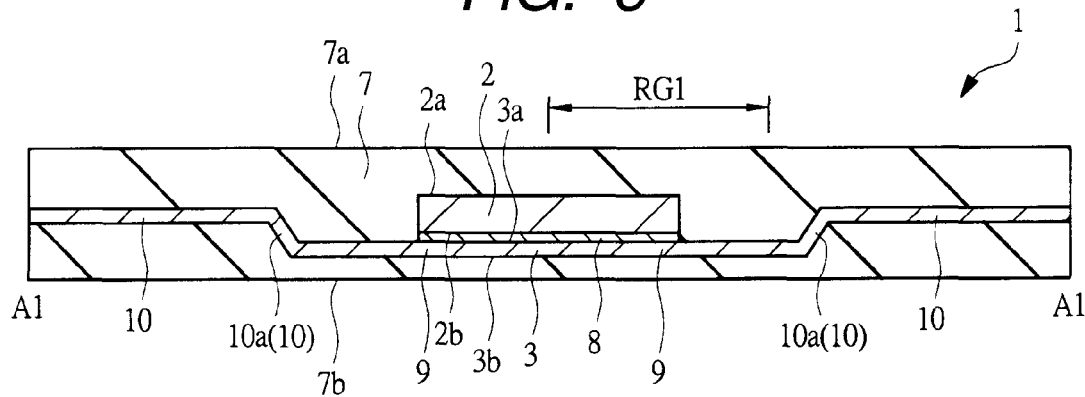
FIG. 6 is a section view of the semiconductor device in the first embodiment of the present invention.
Figure 7:
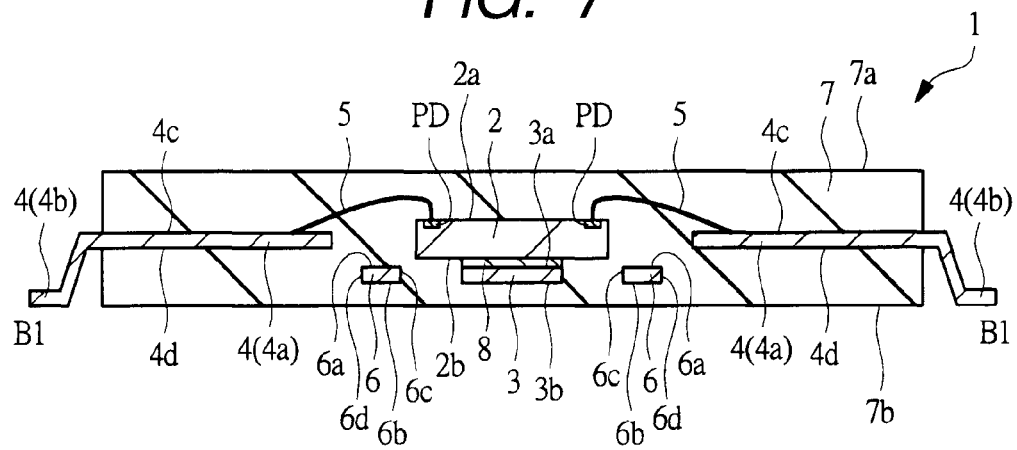
FIG. 7 is a section view of the semiconductor device in the first embodiment of the present invention.

FIG. 1 is a top view (plan view) of a semiconductor device 1, which is an embodiment of the present invention, FIG. 2 is a bottom view (back view) of the semiconductor device 1, and FIG. 3 is a plan perspective view (top view) of the semiconductor device 1 when a sealing resin part 7 is viewed perspectively. FIG. 4 is a partially enlarged view (partially enlarged plan perspective view) of FIG. 3, showing an enlarged view of the part in the vicinity of the center (a semiconductor chip 2 and a region in the vicinity thereof) in FIG. 3. FIG. 5 is a plan perspective view (partially enlarged plan perspective view) of the semiconductor device 1 when the semiconductor chip 2 and a bonding wire 5 are removed (when viewed perspectively). For easier understanding, the position at which the semiconductor chip 2 is mounted (arranged) is shown by a dotted line in FIG. 5. FIG. 6 and FIG. 7 are each a section view (side section view) of the semiconductor device 1 and the section view at the position along A1-A1 line in FIG. 1 to FIG. 3 substantially corresponds to FIG. 6 and the section view at the position along B1-B1 line in FIG. 1 to FIG. 3 substantially corresponds to FIG. 7. Symbol X shown in each plan view (plan views in the first embodiment and in second to ninth embodiments to be described later) indicates a first direction (X direction) and symbol Y indicates a second direction (Y direction) perpendicular to the first direction X.

The semiconductor device 1 in the present embodiment shown in FIG. 1 to FIG. 7 is a semiconductor device in the form of a resin-sealed semiconductor package, that is, a QFP (Quad Flat Package) semiconductor device.

The semiconductor device 1 in the present embodiment has the semiconductor chip 2, a die pad 3 that supports or mounts the semiconductor chip 2, a plurality of leads 4 formed by a conductor, a plurality of the bonding wires 5 that electrically couple the leads 4 and a plurality of electrodes PD on a surface 2a of the semiconductor chip 2, respectively, a heat dissipating plate 6 arranged between the semiconductor chip 2 and the leads 4, and the sealing resin part 7 that seals these parts.

The sealing resin part (sealing part, sealing resin, sealing body) 7 includes, for example, a resin material, such as a thermosetting resin material, and may include a filler etc. By the sealing resin part 7, the semiconductor chip 2, the lead 4, the bonding wire 5, and the heat dissipating plate 6 are sealed and protected both electrically and mechanically. The sealing resin part 7 has a top surface 7a, which is one of the main surfaces, and a bottom surface (back surface, bottom surface) 7b, which is the main surface on the opposite side of the top surface 7a. The plane figure (outer shape) of the sealing resin part 7 that intersects its width is a rectangle and each of sides SD1, SD2, SD3, SD4 of the plane rectangle of the sealing resin part 7 is parallel with the X direction or Y direction. That is, the side SD1 and the side SD3 in opposition to each other of the sealing resin part 7 are parallel with the Y direction and the side SD2 and the side SD4 in opposition to each other of the sealing resin part 7 are parallel with the X direction perpendicular to the Y direction.

The plane figure of the semiconductor chip 2 that intersects its width is a rectangle, and the semiconductor chip 2 is manufactured by, for example, after forming various semiconductor elements or semiconductor integrated circuits on the main surface of a semiconductor substrate (semiconductor wafer) including single crystal silicon etc., separating the semiconductor substrate into each semiconductor chip by dicing etc. The semiconductor element formed in the semiconductor chip 2 includes a MISFET (Metal Insulator Semiconductor Field Effect Transistor) element etc. Hereinafter, when the plane figure is a rectangle, it may sometimes be referred to as a plane rectangle.

On the surface (main surface, top surface) 2a, which is one of the main surfaces of the semiconductor chip 2 and at the same time, is the main surface on the semiconductor element formation side, a plurality of the electrodes (pad electrodes, bonding pads) PD is formed. Each electrode PD of the semiconductor chip 2 is electrically coupled to a semiconductor element or semiconductor integrated circuit formed inside the semiconductor chip 2 or in the surface layer part. It is assumed that the main surface of the semiconductor chip 2 on the side on which the electrode PD is formed is referred to as the surface 2a and the main surface on the opposite side of the main surface (that is, the surface 2a) on which the electrode PD is formed is referred to as a back surface 2b of the semiconductor chip 2. The electrodes PD are arranged along the periphery of the surface 2a of the semiconductor chip 2.

The semiconductor chip 2 is mounted (arranged) over a top surface 3a of the die pad 3 so that the surface 2a of the semiconductor chip 2 faces upward, and the back surface 2b of the semiconductor chip 2 is bonded (joined) to and fixed on the top surface 3a of the die pad 3 via an adhesive (die bond material, joint material) 8. As the adhesive 8, an adhesive having a high thermal conductivity is used. In particular, it is recommended to use a silver paste containing a filler of silver (Ag) in an epoxy resin as the adhesive 8. The thermal conductivity of the adhesive 8 is higher than the thermal conductivity of the sealing resin part 7. For example, when the sealing resin part 7 is an epoxy resin containing a silica filler, its thermal conductivity is about 1 W/m·K and when the adhesive 8 is an epoxy resin containing a silver filler, its thermal conductivity is about 3 to 6 W/m·K. The semiconductor chip 2 is sealed in the sealing resin part 7 and not exposed from the sealing resin part 7. The semiconductor chip 2 is arranged in the sealing resin part 7 so that each side (each of the four sides of the plane rectangular semiconductor chip 2) of the semiconductor chip 2 is parallel with the X direction or the Y direction.

The lead (lead part) 4 includes a conductor, and preferably, is made of a metal material, such as copper (Cu) or copper alloy. Each lead 4 includes an inner lead part 4a, which is a part of the lead 4 located inside the sealing resin part 7, and an outer lead part 4b, which is a part of the lead 4 located outside the sealing resin part 7, and the outer lead part 4b projects from the side surface of the sealing resin part 7 to the outside of the sealing resin part 7.

The leads 4 are arranged around the semiconductor chip 2 so that one end part of each lead 4 (tip end part of the inner lead part 4a) is in opposition to the semiconductor chip 2. Hereinafter, the end part of the lead 4 on the side in opposition to the semiconductor chip 2 is referred to as the tip end part of the inner lead part 4a.

A material that constitutes the sealing resin part 7 is filled between the inner lead parts 4a of the neighboring leads 4. Each electrode PD on the surface 2a of the semiconductor chip 2 is electrically coupled to the inner lead part 4a of each lead 4 via the bonding wire 5, which is a conductive coupling member. That is, one end part of both ends of each bonding wire 5 is coupled to each electrode PD of the semiconductor chip 2 and the other end part is coupled to a top surface 4c of the inner lead part 4a of each lead 4. The bonding wire 5 is a conductive coupling member for electrically coupling the electrode PD of the semiconductor chip 2 and the lead 4, and more specifically, it is a conductive wire and preferably, made of a thin metal wire, such as a gold (Au) wire or copper (Cu) wire. The bonding wire 5 is sealed in the sealing resin part 7 and not exposed from the sealing resin part 7.

The outer lead part 4b of each lead 4 is bent and worked so that the bottom surface of the outer lead part 4b in the vicinity of the end part is located somewhat below the bottom surface 7b of the sealing resin part 7. The outer lead part 4b of the lead 4 functions as an external coupling terminal part (external terminal) of the semiconductor device 1.

The heat dissipating plate (frame body, frame body part) 6 is arranged so as to be located between the semiconductor chip 2 and the leads 4 and to surround the semiconductor chip 2 in a planar view. The heat dissipating plate 6 is a member in the form of a frame (that is, a frame body part) that surrounds the semiconductor chip 2 in a planar manner, and preferably, is arranged at a position and in a form that do not overlap the semiconductor chip 2 in a planar manner. That is, preferably, the semiconductor chip 2 is arranged inside an inner edge (inner circumference) 6c of the heat dissipating plate 6 in the form of a frame so that the outer circumference of the semiconductor chip 2 is located inside (that is, toward the side nearer to the die pad 3) the inner edge 6c of the heat dissipating plate 6 in the form of a frame in a planar view. The inner lead parts 4a of the leads 4 are arranged so as to surround an outer edge (outer circumference) 6d of the heat dissipating plate 6 in the form of a frame along the outer edge 6d of the heat dissipating plate 6 in the form of a frame in a planar view. Preferably, the heat dissipating plate 6 and the leads 4 do not overlap in a planar manner, and if so, it becomes easy to work the die pad 3 and the heat dissipating plate 6 so as to be lowered.

In the present application, the wording "in a planar manner" or "in a planar view" means that something is viewed in a plane parallel with the top surface 2a or the back surface 2b of the semiconductor chip 2. Further, in the present application, the wording "to surround in a planar manner" or just "to surround" means that something is surrounded when viewed in a plane parallel with the top surface 2a or the back surface 2b of the semiconductor chip 2 and the case is also included, where the height of what surrounds differs from the height of what is to be surrounded.

The die pad 3 is surrounded by the heat dissipating plate 6 in the form of a frame in a planar manner, and the die pad (first part of a chip mounting part) 3 is arranged in the center of the region surrounded by the heat dissipating plate 6 in the form of a frame, and the heat dissipating plate 6 and the die pad 3 are linked with a plurality of members (second parts of the chip mounting part) 9. The heat dissipating plate 6, the die pad 3, and the member 9 are formed integrally by the same material, and the member 9 is a linking part that connects (links) an inner edge 6b of the heat dissipating plate 6 and the die pad 3.

In the die pad 3, the inner lead part 4a, the heat dissipating plate 6, and the member 9, respectively, the main surface facing the side of the top surface 7a of the sealing resin part 7 is referred to as a top surface and the main surface facing the side of the bottom surface 7b of the sealing resin part 7 is referred to as a bottom surface (or back surface), and the top surface and the bottom surface are the main surfaces on the opposite sides. The top surfaces of die pad 3, the inner lead part 4a, the heat dissipating plate 6, and the member 9, respectively, face in the same direction (toward the side of the top surface 7a of the sealing resin part 7) and the bottom surfaces of the die pad 3, the inner lead part 4a, the heat dissipating plate 6, and the member 9, respectively, face in the same direction (toward the side of the bottom surface 7b of the sealing resin part 7). Consequently, the heat dissipating plate 6 has a top surface (main surface) 6a facing the side of the top surface 7a of the sealing resin part 7, the bottom surface (back surface) 6b on the opposite side of the top surface 6a and facing the side of the bottom surface 7b of the sealing resin part 7, the inner edge 6c facing the side of the die pad 3, and an outer edge 6d on the opposite side of the inner edge 6c. The top surface of the die pad 3 and the top surface of the member 9 are continuous and flat. Because of this, the top surface of the die pad 3 and the top surface of the member 9 are both assigned symbol 3a and referred to as the top surface (main surface) 3a, and the bottom surface of the die pad 3 and the bottom surface of the member 9 are both assigned symbol 3b and referred to as a bottom surface (back surface) 3b.

One end of each member 9 is formed (linked, coupled) integrally to the inner edge 6c of the heat dissipating plate 6 and the other end is formed (linked, coupled) integrally to the die pad 3. A plurality of the members 9 is formed and preferably, the four members 9 are formed. In the present embodiment, the four members 9 are formed so that the four corners of the heat dissipating plate 6 are connected (linked) to the die pad 3. The plane figure of the die pad 3 is, for example, a circle, and the plane dimensions (outer shape, outer dimensions) of the die pad 3 are less than the plane dimensions (outer shape, outer dimensions) of the semiconductor chip 2 and the die pad 3 is included in a planar manner by the semiconductor chip 2 mounted thereon.

The die pad 3 is arranged immediately under the semiconductor chip 2 and preferably, is arranged immediately under the center part of the semiconductor chip 2 (center part of the back surface 2b). However, the plane dimensions of the die pad 3 are less than the plane dimensions (outer dimensions) of the semiconductor chip 2, and therefore, the entire top surface of the die pad 3 overlaps the semiconductor chip 2 in a planar manner, however, the back surface 2b of the semiconductor chip 2 includes a region that overlaps the die pad 3 in a planar manner, a region that overlaps the member 9 in a planar manner, and a region that overlaps none of the die pad 3, the member 9, and the heat dissipating plate 6.

The region of the back surface 2b of the semiconductor chip 2, which overlaps the die pad 3 in a planar manner and which is in opposition to the top surface 3a of the die pad 3, is bonded to the top surface 3a of the die pad 3 in its entire region via the adhesive 8. Then, the region of the back surface 2b of the semiconductor chip 2, which overlaps the member 9 in a planar manner and which is in opposition to the top surface 3a of the member 9, is bonded to the top surface 3a of the member 9 in its entire region via the adhesive 8. On the other hand, to the region of the back surface 2b of the semiconductor chip 2, which overlaps none of the die pad 3, the member 9, and the heat dissipating plate 6 in a planar manner and which is in opposition to neither the top surface 3a of the die pad 3 nor the top surface 3a of the member 9, the sealing resin part 7 is bonded.

In other words, the whole of the top surface 3a of the die pad 3 and part of the top surface 3a of each member 9 overlap the semiconductor chip 2 in a planar manner and are in opposition to the back surface 2b of the semiconductor chip 2, and in the region that overlaps the semiconductor chip 2 in a planar manner and which is in opposition to the back surface 2b of the semiconductor chip 2, the whole of the top surface 3a of the die pad 3 and the member 9 is bonded to the back surface 2b of the semiconductor chip 2 with the adhesive 8. Because the heat dissipating plate 6 in the form of a frame and the semiconductor chip 2 do not overlap in a planar manner, the part of the top surface 3a of each member 9 in the vicinity of the part linked to the heat dissipating plate 6 may not overlap the semiconductor chip 2 in a planar manner. Because of this, in the region that does not overlap the semiconductor chip 2 in a planar manner and which is not in opposition to the back surface 2b of the semiconductor chip 2, the sealing resin part 7 is bonded over the top surface 6a of the heat dissipating plate 6 and over the top surface 3a of each member 9. That is, all of the regions of the top surface 3a of the die pad 3 and each member 9, which are in opposition to the back surface 2b of the semiconductor chip 2, are bonded to the back surface 2b of the semiconductor chip 2 via the adhesive 8.

In the present embodiment, the semiconductor chip 2 is bonded not only to the die pad 3 but also to the member 9 with the adhesive 8, and therefore, it is possible to regard the combination of both the die pad 3 and the member 9 as a chip mounting part. Because of this, the top surface 3a of the die pad 3 and the member 9 is a chip mounting surface (surface on which the semiconductor chip 2 is mounted). The member 9 further has a function as a heat conduction path (heat dissipation path) that conducts heat produced in the semiconductor chip 2 to the heat dissipating plate 6 via the member 9, in addition to the function to hold the die pad 3 to the heat dissipating plate 6 and the function to mount the semiconductor chip 2.

On the outer edge (outer circumference) 6d of the heat dissipating plate 6, a plurality of suspension leads 10 is formed integrally. The suspension lead 10 is provided in order to hold the die pad 3, the member 9, and the heat dissipating plate 6 to (the frame of) the lead frame for manufacturing the semiconductor device 1 when manufacturing the semiconductor device 1.

Each suspension lead 10 is formed integrally with the heat dissipating plate 6 by the same material as that of the heat dissipating plate 6, and one end is formed (linked, coupled) integrally to the heat dissipating plate 6 and extends outwardly (in the direction of departing from the heat dissipating plate 6 and the die pad 3 in a planar manner), and extends in the sealing resin part 7 until the end part on the opposite side of the side linked to the heat dissipating plate 6 reaches the side surface of the sealing resin part 7. Preferably, to the respective four corners of the outer edge 6d of the heat dissipating plate 6, the suspension lead 10 is formed integrally and extends in the sealing resin part 7 until the end part on the opposite side of the side coupled to the heat dissipating plate 6 of each suspension lead 10 reaches the side surface of the four corners (corner parts) of the sealing resin part 7 in the form of a plane rectangle. In other words, each suspension lead 10 extends in the sealing resin part 7 in the direction from the center of the sealing resin part 7 toward the corner parts (four corners) of the sealing resin part 7 in a planar view.

The part of the suspension lead 10 that projects from the sealing resin part 7 is cut after the sealing resin part 7 is formed, and the cut surface (end surface) produced by the cutting of the suspension lead 10 is exposed at the side surface (here, the side surface of the four corners) of the sealing resin part 7. The cut surface of the suspension lead 10 exposed at the side surface (here, the side surface of the four corners) of the sealing resin part 7 is the end part on the opposite side of the end part on the side coupled to the heat dissipating plate 6 of the suspension lead 10. Each of the (four, here) suspension leads 4 is bent at a bending part (flexing part) 10a so that the top surface 3a of the die pad 3 and the member 9 and the top surface 6a of the heat dissipating plate 6 are lower than the top surface 4c of the inner lead part 4a of the leads 4.

The die pad 3, the (four, here) members 9, the heat dissipating plate 6, and the (four, here) suspension leads 10 are formed integrally by the same material. The heat dissipating plate 6 is arranged in order to promote the dissipation of heat produced in the semiconductor chip 2 to the lead 4. Because of this, it is preferable to use a metal material having a high thermal conductivity as a material to constitute the die pad 3, the member 9, the heat dissipating plate 6, and the suspension lead 10.

Further, it is preferable to form the suspension lead 10 into a thin shape so as not to block the array of the leads 4 as long as it has rigidity capable of holding the die pad 3, the member 9, and the heat dissipating plate 6 to the lead frame when manufacturing the semiconductor device 1. On the other hand, the member 9 has the function to conduct (transmit) heat produced in the semiconductor chip 2 to the heat dissipating plate 6, and therefore, if it is formed into too thin a shape, the heat dissipating characteristics are degraded. Because of this, preferably, a width (width in the direction perpendicular to the direction in which the member 9 extends from the die pad 3 toward the heat dissipating plate 6) W1 of the member 9 is greater than a width (width in the direction perpendicular to the direction in which the suspension lead 10 extends) W2 (that is, W1>W2). As a result, it is possible to cause both the improvement in the thermal conductivity from the semiconductor chip 2 to the heat dissipating plate 6 via the member 9 and the easiness of arraying the leads 4 to coexist.

The lead 4 is separated from the die pad 3, the member 9, the heat dissipating plate 6, and the suspension lead 10 and not formed integrally therewith. However, it is made easy to manufacture the semiconductor device 1 by providing the lead 4, the die pad 3, the member 9, the heat dissipating plate 6, and the suspension lead 10 in the same lead frame. Because of this, it is preferable that the lead 4, the die pad 3, the member 9, the heat dissipating plate 6, and the suspension lead 10 be formed by the same material and due to this, it is possible to manufacture the semiconductor device 1 by providing the lead 4, the die pad 3, the member 9, the heat dissipating plate 6, and the suspension lead 10 in the same lead frame and thereby the manufacture of the semiconductor device 1 is made easy. Because the lead 4 has the function to lead the circuit within the semiconductor chip 2 to the outside of the semiconductor device, and therefore, it is preferable to use a material having a high electric conductivity and because a metal material has a high electric conductivity, it is preferable to use a metal material as a material to constitute the lead 4. Because of this, it is preferable for the die pad 3, the lead 4, the heat dissipating plate 6, the member 9, and the suspension lead 10 to be formed by the same metal material from the standpoint of the high thermal conductivity of the heat dissipating plate 6 and the high electric conductivity of the lead 4. It is particularly preferable for the die pad 3, the lead 4, the heat dissipating plate 6, the member 9, and the suspension lead 10 to be formed by a metal material that contains copper (Cu) as its principal component, such as copper (Cu) and copper alloy, from the standpoint of the high thermal conductivity, high electric conductivity, cost, and easiness of working.

The semiconductor chip 2, the die pad 3, the bonding wire 5, the heat dissipating plate 6, and the member 9 are sealed in the sealing resin part 7 and not exposed from the sealing resin part 7. On the other hand, as to the lead 4, the inner lead part 4a is sealed in the sealing resin part 7 and the outer lead part 4b is exposed from the sealing resin part 7 as described above. The end surface of the suspension lead 10 on the opposite side of the side coupled to the heat dissipating plate 6 is exposed at the corner part side surface of the sealing resin part 7 and other parts are sealed in the sealing resin part 7.

<About Heat Dissipation Path of QFP>

Figure 8:
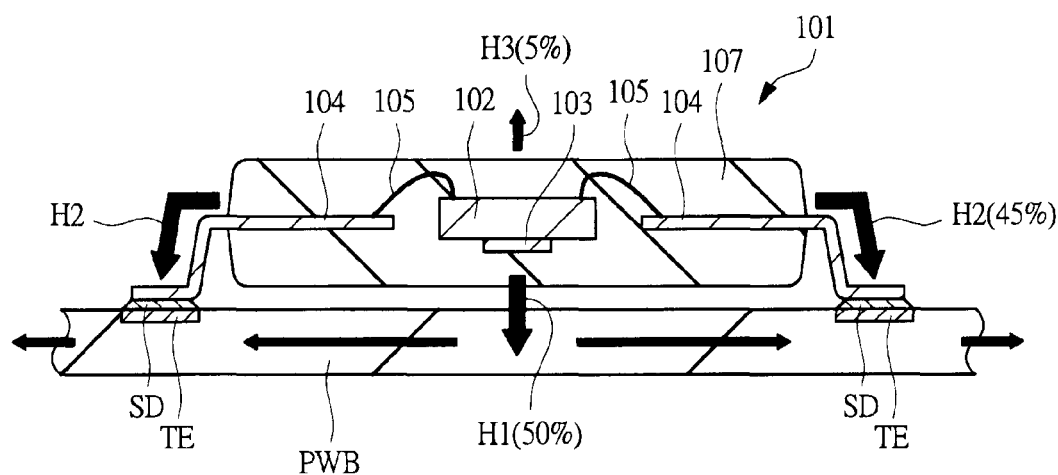
FIG. 8 an explanatory diagram of a heat dissipation path of a QFP semiconductor device.

Next, a heat dissipation path of a QFP semiconductor device is explained. FIG. 8 is an explanatory diagram heat dissipation path of a QFP semiconductor device 101.

In the semiconductor device 101, a semiconductor chip 102 is mounted over a die pad 103 of a lead frame, a lead 104 of the lead frame and the electrode of the semiconductor chip 102 are coupled with a bonding wire 105, the die pad 103, the semiconductor chip 102, the bonding wire 105, and the inner lead part of the lead 104 are sealed by a sealing resin part 107, the lead 104 is cut from the lead frame, and the outer lead part of the lead 104 is bent and worked. The semiconductor device 101 is packaged (by solder) over a packaging substrate (wiring substrate) PWB. At this time, the outer lead part of the lead 104 of the semiconductor device 101 and a terminal TE on the top surface of the packaging substrate PWB are joined and electrically coupled via a solder SD. The method of packaging the semiconductor device 1 described above in the present embodiment on the packaging substrate PWB is the same as that of the semiconductor device 101. That is, when packaging the above-mentioned semiconductor device 1 on the packaging substrate PWB, (the bottom surface 4*c* of) the outer lead part 4*b* of the lead 4 of the semiconductor device 1 is joined and electrically coupled to the terminal TE on the top surface of the packaging substrate PWV via the solder SD. When the above-mentioned semiconductor device 1 is packaged on the packaging substrate PWB, it is only required to read the semiconductor device 101, the semiconductor chip 102, the die pad 103, the lead 104, the bonding wire 105, and the sealing resin part 107 as the semiconductor device 1, the semiconductor chip 2, the die pad 3, the lead 4, the bonding wire 5, and the sealing resin part 7, respectively.

In the case of a general packaging method as shown in FIG. 8, in which a heat dissipating fin etc. is not provided over the top surface of the sealing resin part 107 of the semiconductor device 101, most of the heat produced in the semiconductor chip 2 in the semiconductor device 101 is dissipated through the following three paths (first heat dissipation path, second heat dissipation path, third heat dissipation path).

The first heat dissipation path is a heat dissipation path schematically shown by an arrow H1 in FIG. 8, and heat produced in the semiconductor chip 2 flows directly downward from the semiconductor chip 2 and flows through the die pad 103 and the sealing resin part 107, and then, flows into the packaging substrate PWB through the air from the bottom surface of the sealing resin part 107. Then the heat that has flowed into the packaging substrate PWB is further dissipated in the planar direction within the packaging substrate PWB and dissipated into the air from the packaging substrate PWB.

The second heat dissipation path is a heat dissipation path schematically shown by an arrow H2 in FIG. 8, and heat produced in the semiconductor chip 2 flows from the peripheral part of the semiconductor chip 2 into the inner lead part of the lead 104 via the bonding wire 105 and the sealing resin part 107, and then flows into the packaging substrate PWB along the outer lead part of the lead 104. Then, the heat that has flowed into the packaging substrate PWB is further dissipated in the planar direction within the packaging substrate PWB and dissipates into the air from the packaging substrate PWB.

The third heat dissipation path is a heat dissipation path schematically shown by an arrow H3 in FIG. 8, and heat produced in the semiconductor chip 2 flows directly upward from the semiconductor chip 2 and is dissipated into the air from the top surface of the sealing resin part 107 via the sealing resin part 107.

In the case where the general QFP type semiconductor device 101 is packaged in a general manner, such as one in which a heat dissipating fin etc. is not provide on the top surface thereof, as shown in FIG. 8, heat dissipation through the first and second heat dissipation paths is predominant. For example, in the QFP in which one side of the sealing resin part 107 has a length of 20 mm, the above-mentioned first heat dissipation path (heat dissipation path shown by the arrow H1 in FIG. 8) accounts for about 50% of the total amount of heat dissipation, the above-mentioned second heat dissipation path (heat dissipation path shown by the arrow H2 in FIG. 8) about 45% of the total amount of heat dissipation, and the above-mentioned third heat dissipation path (heat dissipation path shown by the arrow H3 in FIG. 8) about 5% of the total amount of heat dissipation.

<Heat Dissipation Characteristics>

As the functions of an LSI are improved and its operation speed is increased, the power consumption of the semiconductor chip in the package increases and for a recent semiconductor package whose amount of produced heat tends to increase, it is demanded to improve the heat dissipation characteristics to dissipate heat produced in the semiconductor chip in the package to the outside of the semiconductor package. In order to improve the heat dissipation characteristics, it can be conceived to expose the bottom surface of the die pad 103 that mounts the semiconductor chip 102 from the bottom surface of the sealing resin part 107, and thereby, the heat dissipation through the first heat dissipation path is improved and thus the heat dissipation characteristics of the semiconductor device 101 can be improved. However, when the bottom surface of the die pad 103 is exposed from the bottom surface of the sealing resin part 107, there is a possibility that moisture (water) etc. may reach the semiconductor chip 102 through the boundary surface between the die pad 103 exposed at the bottom surface of the sealing resin part 107 and the sealing resin part 107 in a high-temperature and high-humidity load test and there is a risk that the reliability (moisture resistance) of a semiconductor device is degraded. Because of this, it is desirable that the die pad 103 be not exposed at the bottom surface of the sealing resin part 107 from the standpoint of improvement of the reliability (moisture resistance) of a semiconductor device.

Because of the above, in the present embodiment, the heat dissipating plate 6 is provided inside the sealing resin part 7 in order to improve the heat dissipation characteristics without exposing the back surface of the die pad 103. Its working for the first heat dissipation path is to improve the heat dissipation characteristics by increasing the sectional area of the heat dissipation path by causing heat produced in the semiconductor chip 2 to flow downward after once spreading the heat in the heat dissipating plate 6.

For the second heat dissipation path, the heat dissipation characteristics are improved by providing the heat dissipating plate 6 between the chip 2 and the tip end of the inner lead 4 to reduce the resistance of heat flow from the side of the semiconductor chip 2 to the inner lead 4*a*. This will be explained later in detail.

<About Structure of Die Pad in Comparative Example>

Figure 9:
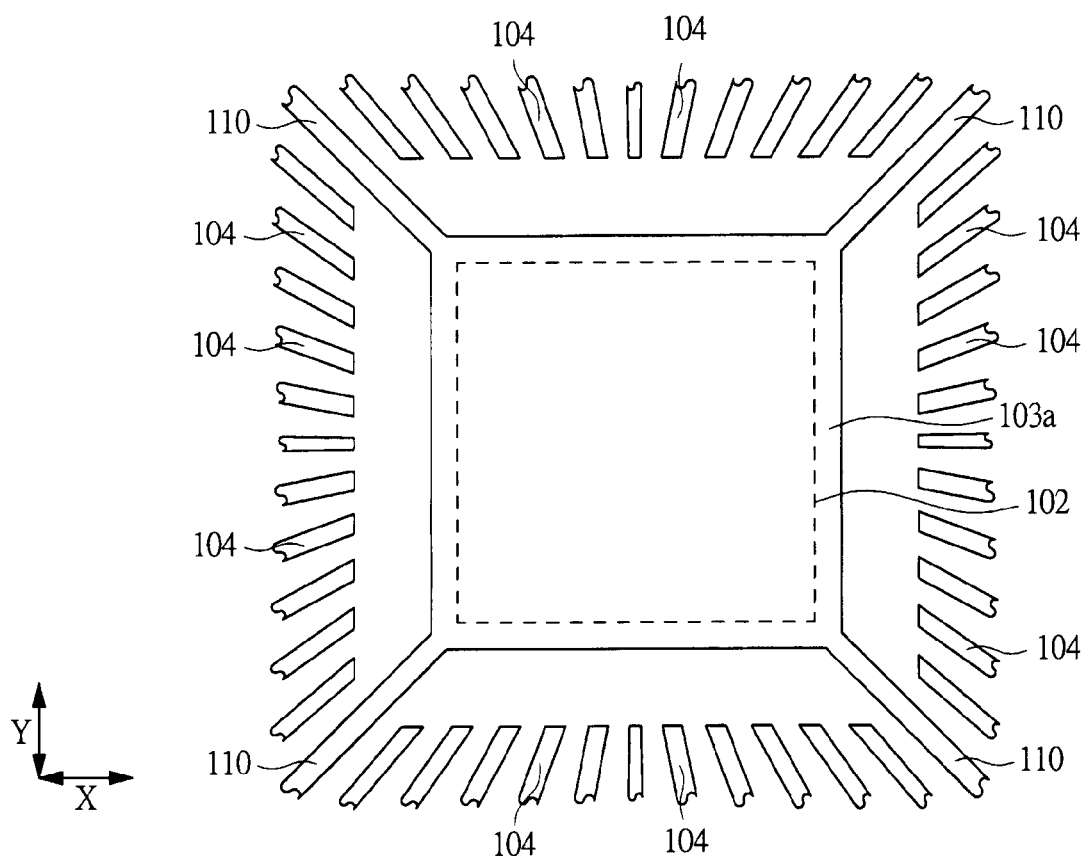
FIG. 9 is a plan perspective view of essential parts of a semiconductor device when a die pad in a first comparative example is applied.
Figure 10:
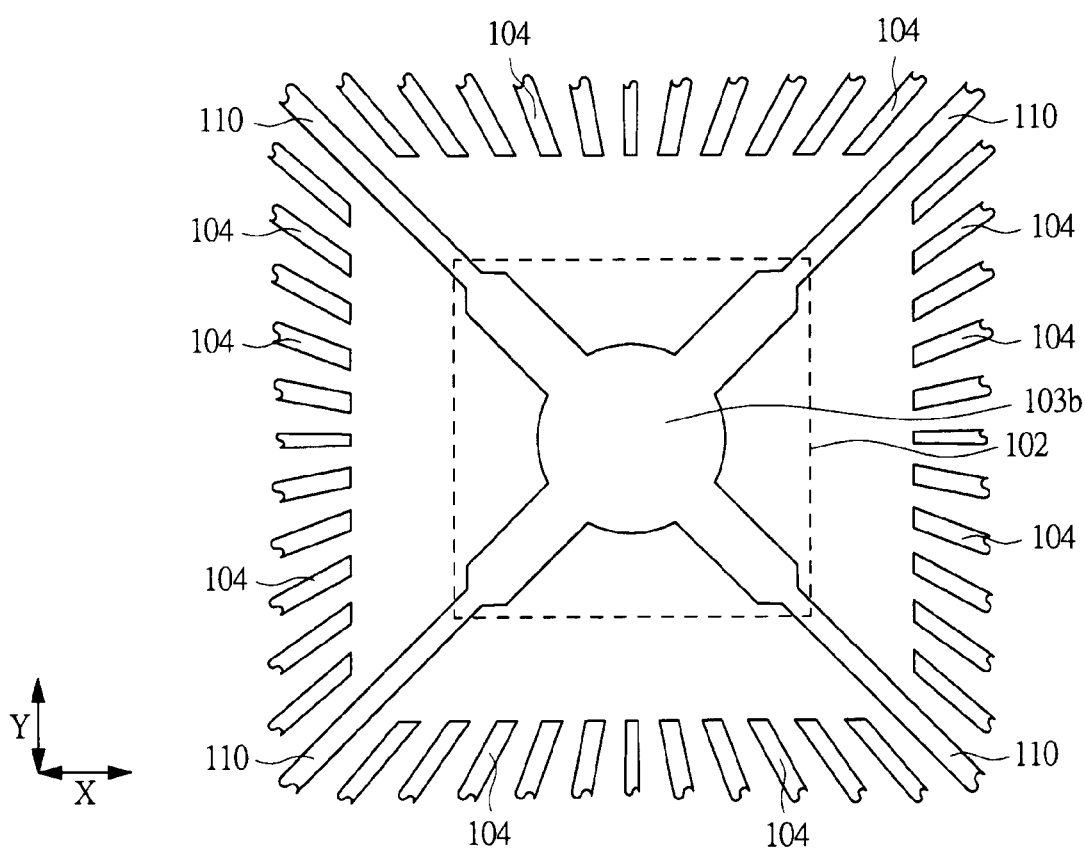
FIG. 10 is a plan perspective view of essential parts of a semiconductor device when a die pad in a second comparative example is applied.
Figure 11:
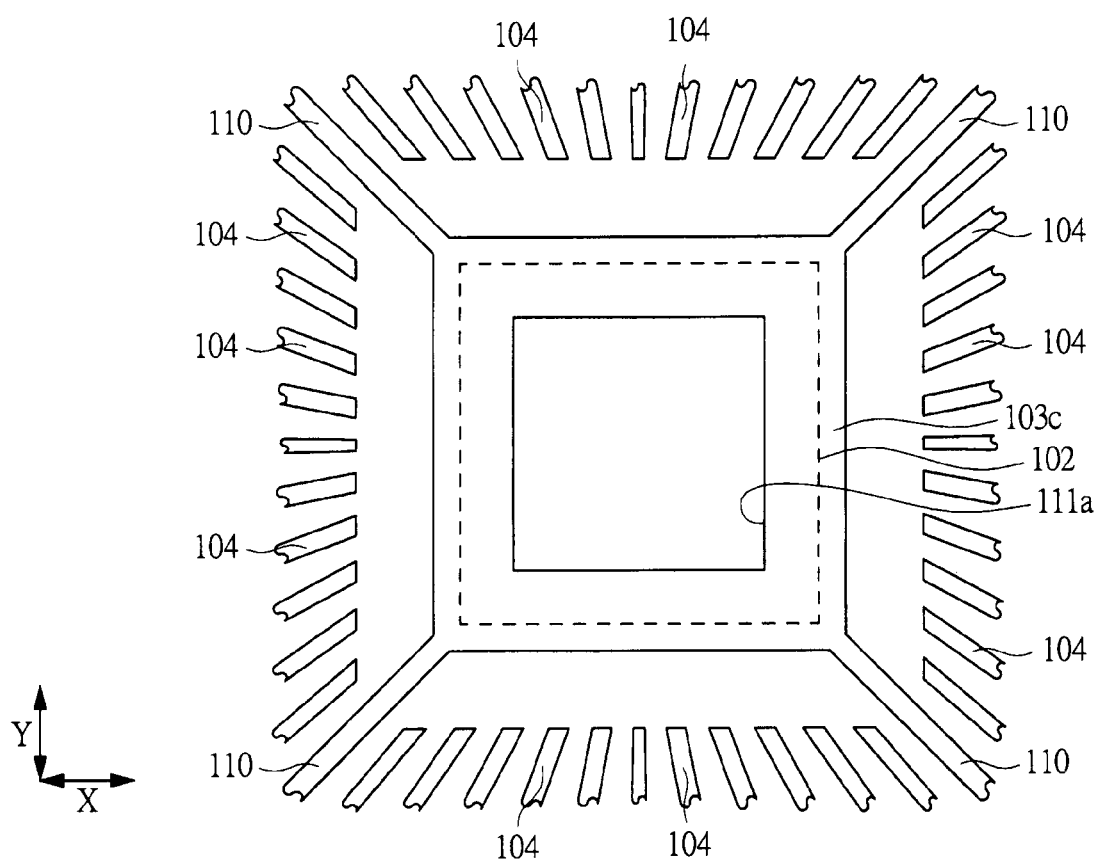
FIG. 11 is a plan perspective view of essential parts of a semiconductor device when a die pad in a third comparative example is applied.
Figure 12:
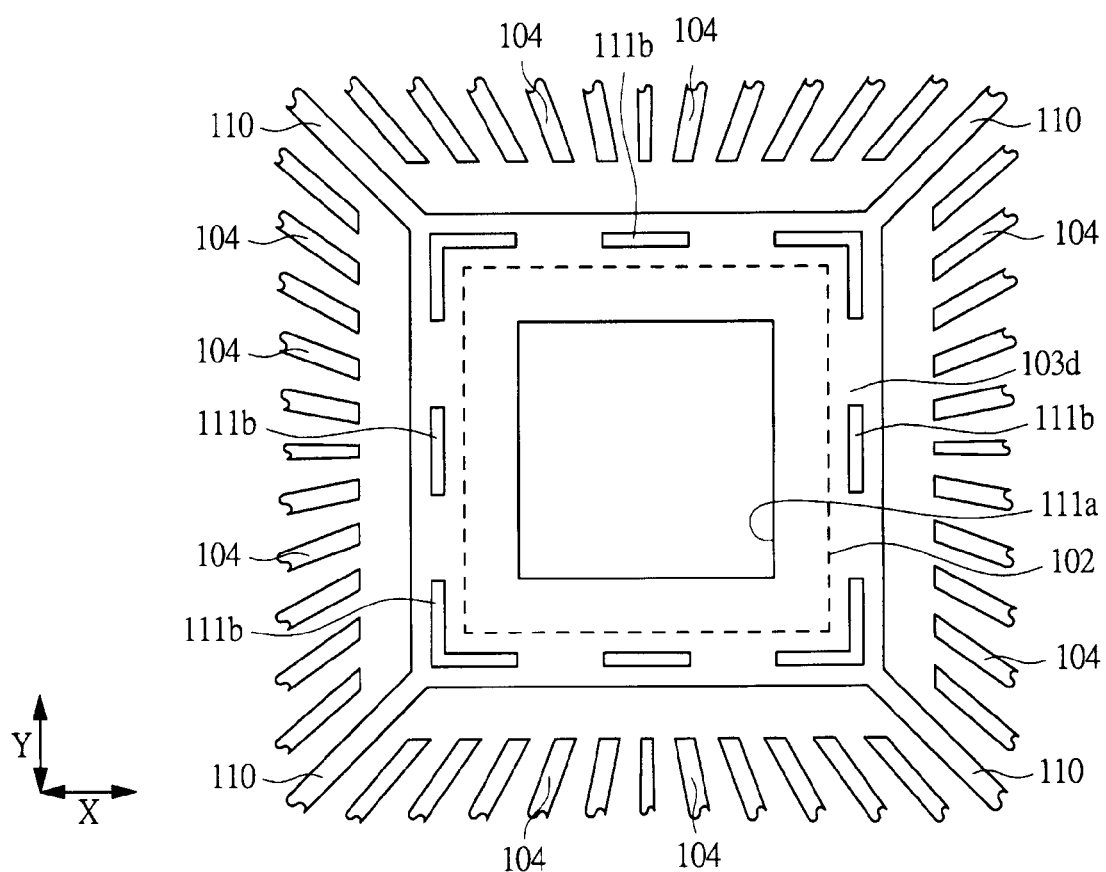
FIG. 12 is a plan perspective view of essential parts of a semiconductor device when a die pad in a fourth comparative example is applied.

FIG. 9 is a plan perspective view of essential parts when a die pad 103*a* in a first comparative example the inventors of the present invention have examined is applied as the die pad 103 in the semiconductor device 101. FIG. 10 is a plan perspective view of essential parts when a die pad 103*b* in a second comparative example the inventors of the present invention have examined is applied, FIG. 11 is that when a die pad 103*c* in a third comparative example the inventors of the present invention have examined is applied, and FIG. 12 is that when a die pad 103*d* in a fourth comparative example the inventors of the present invention have examined is applied. FIG. 9 to FIG. 12 correspond to FIG. 5 in the present embodiment. As in FIG. 5, the position where the semiconductor chip 102 is mounted (arranged) is indicated by a dotted line also in FIG. 9 to FIG. 12. In FIG. 9 to FIG. 12, symbol 110 denotes a suspension lead, provided in order to hold the die pads 103*a* to 103*d* to the lead frame when manufacturing the semiconductor device 101.

FIG. 9 to FIG. 12 are each a plan perspective view when the sealing resin part 107, the semiconductor chip 102, and the bonding wire 105 are viewed perspectively, and therefore, the sealing resin part 107 or the bonding wire 105 is not shown schematically in FIG. 9 to FIG. 12. However, in the semiconductor device, as can also be seen from FIG. 8, the die pads 103*a* to 103*d*, the semiconductor chip 102, the suspension lead 110, and the lead 4 (also including the bonding wire 105 that couples the electrode of the semiconductor chip 102 and the lead 104) shown in FIG. 9 to FIG. 12 are sealed by the sealing resin part 107.

As shown in FIG. 9, the die pad 103*a* in the first comparative example has plane dimensions greater than the plane dimensions of the semiconductor chip 102. Because of this, the entire back surface of the semiconductor chip 102 is bonded to the top surface of the die pad 103*a* with a die bond material (adhesive).

However, when the entire back surface of the semiconductor chip 102 is bonded to the top surface of the die pad 103*a* with a die bond material, the semiconductor chip 102 becomes more likely to be peeled off from the die pad 103*a* at the time of solder reflow when packaging the semiconductor device 101 on the packaging substrate PWB, and therefore, the reliability (solder reflow resistance) of the semiconductor device is degraded. This results mainly from that the strength of the die bond material itself is low and that the strength of adhesion between the sealing resin part 107 and the die pad 103*a* is low.

The plane dimensions of the die pad 103*b* in the second comparative example shown in FIG. 10 are less than the plane dimensions of the semiconductor chip 102. Because of this, if the semiconductor chip 102 is mounted over the die pad 103*b*, the center part of the back surface of the semiconductor chip 102 is bonded to the top surface of the die pad 103*b* with a die bond material (adhesive), however, to the region of the back surface of the semiconductor chip 102, which is not in opposition to the die pad 103, the sealing resin part 107 is bonded as a result. The strength of adhesion between the back surface of the semiconductor chip 102 and the sealing resin part 107 is far higher than the strength of adhesion between the sealing resin part 107 and the die pad 103*b*. Because of this, compared to the case where the die pad 103*a* in the first comparative example in FIG. 9 is used, in the case where the die pad 103*b* in the second comparative example in FIG. 10 is used, it is possible to prevent the semiconductor chip 102 from peeling off from the die pad 103*b* at the time of solder reflow when packaging the semiconductor device 101 on the packaging substrate PWB by the firm adhesion of the part of the back surface of the semiconductor chip 102 to the sealing resin part 107. Consequently, it is possible to improve the reliability (solder reflow resistance) of the semiconductor device 101.

The plane figure of the die pad 103*c* in the third comparative example shown in FIG. 11 is a frame and an opening 111*a* is formed in the center part. Because of this, if the semiconductor chip 102 is mounted over the die pad 103*c*, the peripheral part of the back surface of the semiconductor chip 102 is bonded to the top surface of the die pad 103*c* with a die bond material (adhesive), however, the center part of the back surface of the semiconductor chip 102 is exposed from the opening 111*a* of the die pad 103*c* and the sealing resin part 107 is bonded thereto. Because of this, as in the case where the die pad 103*b* in the second comparative example in FIG. 10 is used, in the case also where the die pad 103*c* in the third comparative example in FIG. 11 is used, it is possible to prevent the semiconductor chip 102 from peeling off from the die pad 103*b* at the time of solder reflow when packaging the semiconductor device 101 on the packaging substrate PWB by the firm adhesion of the part of the back surface of the semiconductor chip 102 to the sealing resin part 107, and therefore, it is possible to improve the reliability of the semiconductor device 101.

However, over the die pad 103*c* in the third comparative example, only the semiconductor chip 102 can be mounted, the plane dimensions of which are greater than the plane dimensions of the opening 111*a*. This is because if the semiconductor chip 102 is smaller than the opening 111*a* of the die pad 103*c*, it will drop from the opening 111*a*. Because of this, when the die pad 103*c* in the third comparative example is used, there are limitations to the plane dimensions of the semiconductor chip 102 that can be mounted and it is no longer possible to use a common lead frame for the semiconductor chip 102 of different plane dimensions. That is, it is necessary to change the plane dimensions of the die pad 103*c* for each of the semiconductor chips 102 of different plane dimensions, resulting in a disadvantage in reducing the cost of the semiconductor device.

On the other hand, in the case of the die pad 103*b* in the second comparative example shown in FIG. 10, the semiconductor chips 102 of various dimensions can be mounted over the die pad 103*b*, and therefore, it is possible to use a common lead frame for the semiconductor chips 102 of different plane dimensions, and therefore, an attempt can be made to reduce the cost of the semiconductor device. However, in the case of the die pad 103*b* in the second comparative example shown in FIG. 10, when the plane dimensions of the semiconductor chip 102 to be mounted are reduced, the space between the semiconductor chip 102 and the lead 104 increases, resulting in a disadvantage in dissipating heat through the second heat dissipation path (heat dissipation path shown by the arrow H2 in FIG. 8). Then, the die pad 103*b* in the second comparative example shown in FIG. 10 has a large space between the die pad 103*b* and the lead 104 and a structure in which heat is hard to conduct from the die pad 103*b* to the lead 104 because the die pad 103*b* is small in size, and therefore, the die pad 103 can hardly contribute in heat dissipation through the second heat dissipation path (heat dissipation path shown by the arrow H2 in FIG. 8).

Like the die pad 103*c* in the third comparative example shown in FIG. 11, the plane figure of the die pad 103*d* in the fourth comparative example shown in FIG. 12 is a frame and the opening 111*a* is provided in the center part, however, compared to the die pad 103*c* in the third comparative example, the outer edge side of the die pad 103*d* is widened so as to come close to the lead part 104. In the die pad 103*d* in the fourth comparative example in FIG. 12, a slit 111*b* is provided at a position where it does not overlap the semiconductor chip 102. As described above, there is a risk that the boundary surface peels off at the time of solder reflow because of the low adhesion strength between the top surface of the die pad 103*d* and the sealing resin part 107. In the fourth comparative example, the width of the die pad 103*d* is greater than that in the third comparative example, and therefore, if a peeling occurs, it develops into a crack of the sealing resin part 107 and there is a risk that the wire is cut. Because of this, the slit 111*b* is provided to confine a peeling to a small area even if it occurs and to prevent it from developing into a crack.

Compared to the case where the die pad 103*c* in the third comparative example in FIG. 11 is used, in the case where the die pad 103*d* in the fourth comparative example in FIG. 12 is used, the distance from the outer edge of the die pad 103*d* to the tip end of the inner lead part of the lead 104 is reduced, and therefore, heat produced in the semiconductor chip 102 can be easily conducted to the inner lead part of the lead 104 via the die pad 103d. Consequently, this is an advantage in heat dissipation through the second heat dissipation path (heat dissipation path shown by the arrow H2 in FIG. 8). However, like the die pad 103c in the third comparative example in FIG. 11, also in the case of the die pad 103d in the fourth comparative example in FIG. 12, there are limitations to the plane dimensions of the semiconductor chip 102 that can be mounted, and it is no longer possible to use a common lead frame for the semiconductor chips 102 of different plane dimensions. That is, it is necessary to change the plane dimensions of the die pad 103d for each of the semiconductor chips 102 of different plane dimensions, resulting in a disadvantage in reducing the cost of the semiconductor device.

<Characteristics of Semiconductor Device>

The characteristics of the die pad structure in the comparative examples shown in FIG. 9 to FIG. 12 are explained as above. In contrast to these comparative examples, in the semiconductor device 1 in the present embodiment, the die pad 3 is arranged immediately under the center part of the back surface 2b of the semiconductor chip 2. That is, the center part of the semiconductor chip 2 overlaps the die pad 3 in a planar manner. In other words, the center part of the back surface 2b of the semiconductor chip 2 is located immediately over the die pad 3.

Because of this, it is possible to mount the semiconductor chips 2 of various dimensions over the die pad 3. FIG. 13 and FIG. 14 are each a partially enlarged plan perspective view of the semiconductor device 1 in the present embodiment, corresponding to FIG. 5 described above, and FIG. 13 corresponds to the case where the semiconductor chip 2 to be mounted is small and FIG. 14 corresponds to the case where the semiconductor chip 2 to be mounted is large. Like FIG. 5 described above, in FIG. 13 and FIG. 14 also, the position where the semiconductor chip 2 is mounted (arranged) is shown by a dotted line, however, unlike FIG. 5, in FIG. 13 and FIG. 14, the region in which the adhesive 8 is arranged (applied) is hatched. A difference between FIG. 5 and FIG. 14 lies only in that the region in which the adhesive 8 is arranged (applied) is hatched in FIG. 14 and the size of the semiconductor chip 2 is the same in both FIG. 5 and FIG. 14. A difference between FIG. 13 and FIG. 14 lies in the plane dimensions (outer size) of the semiconductor chip 2 and the plane dimensions of the semiconductor chip 2 in FIG. 14 are greater than those in FIG. 13.

Figure 13:
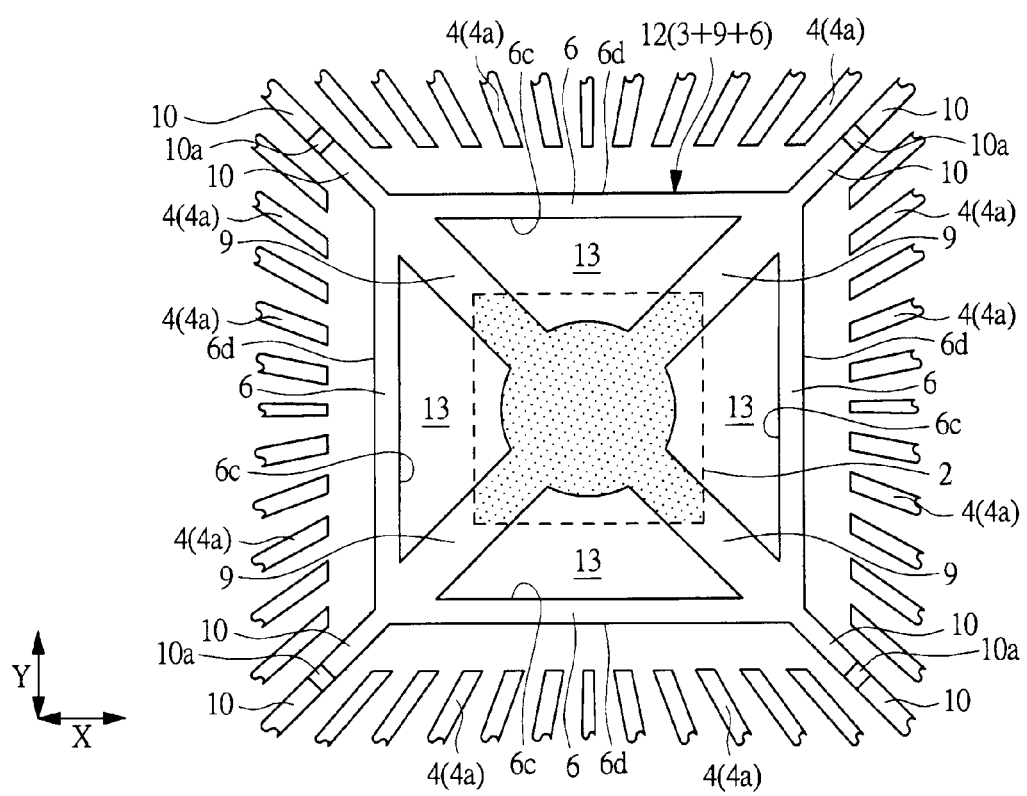
FIG. 13 is a partially enlarged plan perspective view of the semiconductor device in the first embodiment of the present invention.
Figure 14:
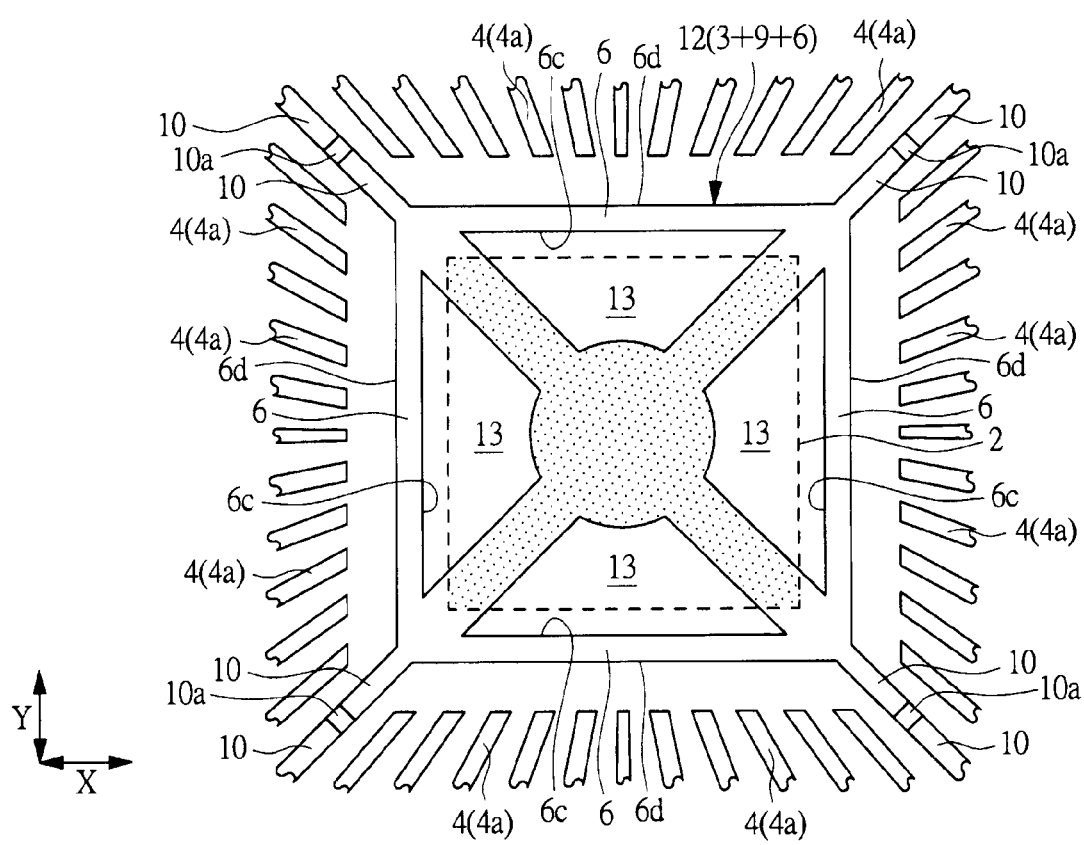
FIG. 14 is a partially enlarged plan perspective view of the semiconductor device in the first embodiment of the present invention.

As can also be seen from FIG. 13 and FIG. 14, it is possible to hold (support) the semiconductor chip 2 by the die pad 3 (and the member 9) even if the plane dimensions of the semiconductor chip 2 are different. This is because it is possible to mount the semiconductor chip 2 so that the die pad 3 is arranged immediately under the center part of the back surface 2b of the semiconductor chip 2 when the semiconductor chip 2 is small as shown in FIG. 13 and when the semiconductor chip 2 is large as shown in FIG. 14. Because of this, it is possible to mount the semiconductor chips 2 of various plane dimensions over the die pad 3. Consequently, it is possible to make an attempt to reduce the cost of a semiconductor device because a common lead frame can be used for the semiconductor chips 2 of various plane dimensions.

Further, in the present embodiment, the plane dimensions of the die pad 3 are made smaller than the plane dimensions of the semiconductor chip 2. Because of this, the part of the back surface 2b of the semiconductor chip 2 mounted over the die pad 3, which is in opposition to the die pad 3 and the member 9, is bonded to the die pad 3 and the member 9 via the adhesive 8, however, there is a part of the back surface 2b of the semiconductor chip 2, which is in opposition to neither the die pad 3 nor the member 9, and the sealing resin part 7 is bonded thereto. That is, at least part of the back surface 2b of the semiconductor chip 2 is in opposition to neither the die pad 3 nor the member 9 and the sealing resin part 7 is bonded thereto in opposition to the sealing resin part 7, and this also applies to second to ninth embodiments to be described later, not only to the present embodiment. Because of this, compared to the case where the die pad 103a in the first comparative example in FIG. 9 is used, in the present embodiment, it is possible to prevent the semiconductor chip 102 from peeling off from the die pad 103b and the member 9 at the time of solder reflow when packaging the semiconductor device 1 on the packaging substrate PWB by the firm adhesion of (the part of the back surface 2b in opposition to neither the die pad 3 nor the member 9) the back surface 2b of the semiconductor chip 2 to the sealing resin part 107. Consequently, it is possible to improve the reliability (solder reflow resistance) of the semiconductor device 1.

Further, in the present embodiment, the heat dissipating plate 6 is provided in order to improve the heat dissipation characteristics of the semiconductor device 1. As a result, it is possible to improve the heat dissipation characteristics through the first heat dissipation path (heat dissipation path shown by the arrow H1 in FIG. 8) by once diffusing the heat produced in the semiconductor chip 2 to the heat dissipating plate 6. It is also possible to improve the heat dissipation characteristics through the second heat dissipation path (heat dissipation path shown by the arrow H2 in FIG. 8) by conducting the heat in the semiconductor chip 2 to the inner lead part 4a of the lead 4. This is explained with reference to FIG. 15 and FIG. 16.

Figure 15:
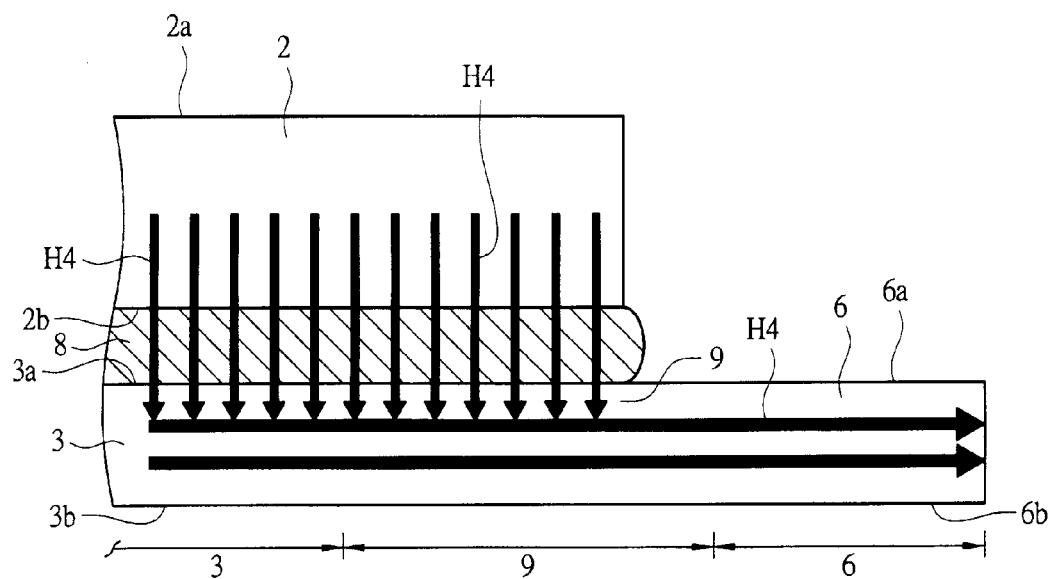
FIG. 15 is an explanatory diagram of heat dissipation of the semiconductor device in the first embodiment of the present invention.
Figure 16:
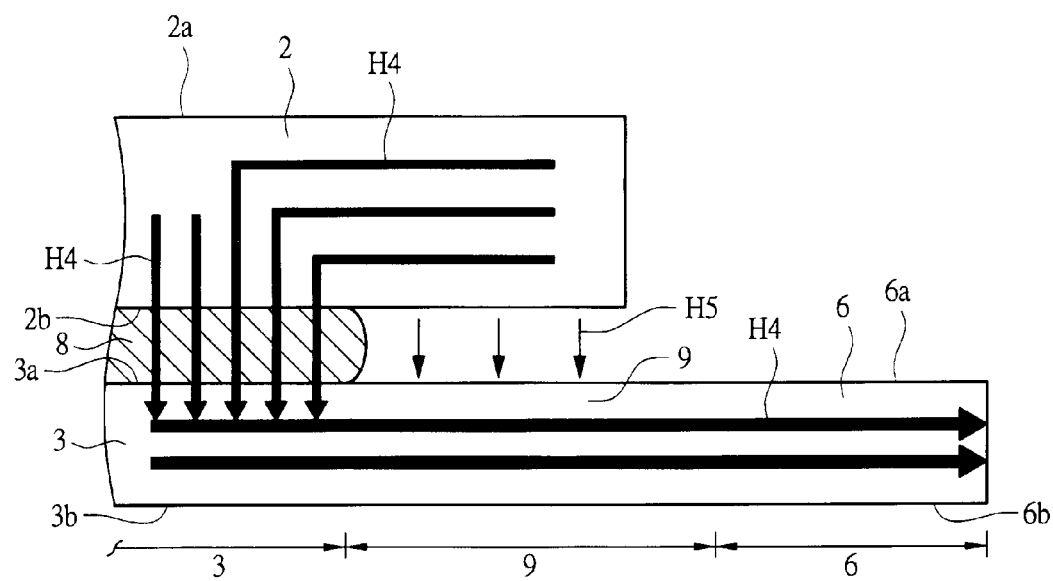
FIG. 16 an explanatory diagram of heat dissipation.

FIG. 15 is an explanatory diagram of heat dissipation of the semiconductor device 1 in the present embodiment and an enlarged view of the region corresponding to the region shown by symbol RG1 in FIG. 6 is shown. In FIG. 15, a sealing resin part 16 is not shown schematically. FIG. 16 is an explanatory diagram of heat dissipation when the back surface 2b of the semiconductor chip 2 is bonded to the die pad 3 with the adhesive 8 but not bonded to the member 9 with the adhesive 8, unlike the present embodiment, and the same region as that in FIG. 15 is shown. In FIG. 15 and FIG. 16, how heat produced in the semiconductor chip 2 flows to the heat dissipating plate 6 is schematically shown by an arrow H4.

In the present embodiment, as can also be seen from FIG. 6, FIG. 7, and FIG. 13 to FIG. 15, the semiconductor chip 2 is mounted over the die pad 3 and the member 9 and the entire surface of the part of the back surface 2b of the semiconductor chip 2, which is in opposition to (the top surface 3a of) the die pad 3 and the member 9, is bonded to the die pad 3 and the member 9 with the adhesive 8. Because of this, as shown schematically in FIG. 15, heat produced in the semiconductor chip 2 is conducted mainly from the back surface 2b of the semiconductor chip 2 to the die pad 3 and the member 9 through the adhesive 8 and is further conducted to the heat dissipating plate 6 via the member 9. Heat conducted from the member 9 to the heat dissipating plate 6 spreads over the entire heat dissipating plate 6 in the form of a frame. Because the heat conduction path from the back surface 2b of the semiconductor chip 2 to the heat dissipating plate 6 does not pass byway of the sealing resin part 7 the thermal conductivity of which is low, it is possible to efficiently conduct heat produced in the semiconductor chip 2 to the heat dissipating plate 6. Part of heat having spread over the entire heat dissipating plate 6 is conducted downward from the bottom surface 6b of the heat dissipating plate 6 and flows into the packaging substrate (PWB) (the packaging substrate PWB that has packaged the semiconductor device 1) from the bottom surface 7b of the sealing resin part 7 via a thin air layer thereunder. Because of this, as to the first heat dissipation path, its sectional area is the sum of the area of the semiconductor chip 2, the area of the heat dissipating plate 6, and the area of the part of the member 9, which does not overlap the semiconductor chip 2 in a planar manner. Further, part of heat having spread over the entire heat dissipating plate 6 is conducted to the inner lead part 4a of the lead 4 via the sealing resin part 7 interposed between the heat dissipating plate 6 and the inner lead part 4a. Heat conducted from the heat dissipating plate 6 to the inner lead part 4a flows into the packaging substrate PWB (the packaging substrate PWB that has packaged the semiconductor device 1) through the outer lead part 4a of the lead 4.

Unlike the present embodiment, in the second comparative example in FIG. 10 described above, in which nothing corresponding to the heat dissipating plate 6 is provided, there is nothing corresponding to the heat dissipating plate 6, and therefore, the sectional area of the first heat dissipation path is limited approximately only to the area of the semiconductor chip 2 and the heat dissipation performance is low. As the second heat dissipation path described above (heat dissipation path shown by the arrow H2 in FIG. 8), there are only a path through which heat is dissipated from the side surface of the semiconductor chip 2 to the inner lead part of the lead 104 via the sealing resin part 107 and a path through which heat is dissipated from the electrode PD over the semiconductor chip 2 to the inner lead part of the lead 104 via the bonding wire 5, and therefore, the heat dissipation characteristics are low and if the semiconductor chip 2 is reduced in size, the heat dissipation characteristics are further deteriorated.

In contrast to the above, in the present embodiment, the sectional area of the first heat dissipation path described above (heat dissipation path shown by the arrow H1 in FIG. 8) is the sum of the area of the semiconductor chip 2, the area of the heat dissipating plate 6, and the area of the part of the member 9, which does not overlap the semiconductor chip 2 in a planar manner. As the second heat dissipation path described above (heat dissipation path shown by the arrow H2 in FIG. 8), in addition to a path through which heat is dissipated from the side surface of the semiconductor chip 2 to the inner lead part 4a via the sealing resin part 7, a path can be used to dissipate heat in the semiconductor chip 2, through which heat is dissipated from the back surface 2b of the semiconductor chip 2 to the heat dissipating plate 6 via the adhesive 8, the die pad 3, and the member 9 and the heat is further dissipated from the heat dissipating plate 6 to the inner lead part 4a via the sealing resin part 7. Because of this, it is possible to improve the heat dissipation characteristics of the semiconductor device 1.

As the plane dimensions of the semiconductor chip 2 become smaller, the sectional area of the first heat dissipation path, that is, the area of the semiconductor chip 2 becomes smaller, and therefore, the heat dissipation performance is deteriorated. Further, as to the second heat dissipation path, the distance from the side surface of the semiconductor chip 2 to the tip end of the inner lead part 4a becomes larger and heat dissipation from the side surface of the semiconductor chip 2 to the inner lead part 4a via the sealing resin part 7 becomes less efficient. However, in the present embodiment, the heat dissipating plate 6 is provided and the sectional area of the first heat dissipation path is the sum of the area of the semiconductor chip 2, the area of the heat dissipating plate 6, and the area of the part of the member 9, which does not overlap the semiconductor chip 2 in a planar manner, and therefore, it is possible to suppress the deterioration of the heat dissipation characteristics. As to the second heat dissipation path, even if the semiconductor chip 2 to be mounted becomes smaller, the distance between the heat dissipating plate 6 and the inner lead part 4a remains unchanged. Because of this, as shown in FIG. 13, even when the plane dimensions of the semiconductor chip 2 to be mounted are small, heat can be dissipated from the back surface 2b of the semiconductor chip 2 to the heat dissipating plate 6 via the adhesive 8, the die pad 3, and the member 9, and the heat can be further dissipated from the heat dissipating plate 6 to the inner lead part 4a via the sealing resin part 7, and therefore, it is possible to suppress the deterioration of the heat dissipation characteristics accompanying the downsizing of the semiconductor chip 2 to be mounted.

On the other hand, in the case of FIG. 16, the semiconductor chip 2 is arranged over the die pad 3 and the member 9, however, while the part of the back surface 2b of the semiconductor chip 2, which is in opposition to the die pad 3, is bonded to the die pad 3 with the adhesive 8, the part of the back surface 2b of the semiconductor chip 2, which is in opposition to the member 9, is not bonded to the member 9 with the adhesive 8. That is, the member 9 and the back surface 2b of the semiconductor chip 2 are not bonded to each other with the adhesive 8. Because of this, a state is brought about where a void is formed between the back surface 2b of the semiconductor chip 2 and the top surface of the member 9, or the material of the sealing resin part 7 is interposed therebetween. That is, FIG. 16 corresponds to a structure in which the back surface 2b of the semiconductor chip 2 is bonded only to the die pad 3 with the adhesive 8 (that is, the back surface 2b is not bonded to the member 9 with the adhesive 8).

As shown in FIG. 16, when the back surface 2b of the semiconductor chip 2 is bonded only to the die pad 3 with the adhesive 8, heat produced in the end part (peripheral part) of the semiconductor chip 2 is conducted from the center part of the back surface 2b of the semiconductor chip 2 to the die pad 3 through the adhesive 8 after the heat is made to skirt (conduct) in the direction of the center part side of the semiconductor chip 2 in the semiconductor chip 2 as shown schematically by the flow of the heat by the arrow H4, and then, is conducted to the heat dissipating plate 6 via the member 9. Because of this, the length of the heat dissipation path from the semiconductor chip 2 to the heat dissipating plate 6 becomes longer compared to the case of FIG. 15, and therefore, the heat dissipation characteristics are deteriorated. Further, when the back surface 2b of the semiconductor chip 2 is bonded only to the die pad 3 with the adhesive 8 as shown in FIG. 16, a void exists between the back surface 2b of the semiconductor chip 2 and the top surface of the member 9 or the material of the sealing resin part 7 is interposed therebetween. The thermal conductivity of the void and the thermal conductivity of the material of the sealing resin part 7 are lower than the thermal conductivity of the adhesive 8, and therefore, the heat dissipation efficiency of the heat dissipation path (heat dissipation path shown by an arrow H5 in FIG. 16) from the back surface 2b of the semiconductor chip 2 to the member 9 via the void or the material of the sealing resin part 7 is very low.

In contrast to the above, in the present embodiment, as shown in FIG. 6, FIG. 7 and FIG. 13 to FIG. 15, the entire surface of the part of the back surface 2b of the semiconductor chip 2, which is in opposition to the die pad 3 and the member 9, is bonded to the die pad 3 and the member 9 with the adhesive 8. In other words, the semiconductor chip 2 is mounted over the die pad 3 and the members 9 and the top surface 3a of the die pad 3 and the top surface 3a of the part of the members 9, which is in opposition to the back surface 2b of the semiconductor chip 2, are bonded to the back surface 2b of the semiconductor chip 2 in their entire surfaces with the adhesive 8. Because of this, as shown schematically by the flow of heat by the arrow H4 in FIG. 16, the heat produced in the end part (peripheral part) of the semiconductor chip 2 can also be conducted to the member 9 located immediately thereunder via the adhesive 8 the thermal conductivity of which is higher than that of the sealing resin part 7. Because of this, the heat dissipation path from the semiconductor chip 2 to the heat dissipating plate 6 becomes shorter compared to the case of FIG. 15, and therefore, it is possible to improve the heat dissipation characteristics.

As described above, in the present embodiment, what is important is that the top surface 3a of the die pad 3 and the top surface 3a of the part of the members 9, which is in opposition to the back surface 2b of the semiconductor chip 2, are bonded to the back surface 2b of the semiconductor chip 2 in their entire surfaces with the adhesive 8, and this also applies to second to ninth embodiment, to be described later.

By the provision of the heat dissipating plate 6, the heat dissipation path from the back surface 2b of the semiconductor chip 2 to the inner lead part 4a via the adhesive 8, the die pad 3, the member 9, and the heat dissipating plate 6 becomes effective for the first time, and without the heat dissipating plate 6 itself, there arises no trouble even if the back surface 2b of the semiconductor chip 2 is bonded only to the die pad 3 with the adhesive 8. Because of this, it can be said that the technique to bond the entire surface of the part of the back surface 2b of the semiconductor chip 2, which is in opposition to the die pad 3 and the member 9, to the die pad 3 and the member 9 with the adhesive is a technique that is not necessary until the heat dissipating plate 6 is provided.

Further, it is necessary for the thermal conductivity of the adhesive 8 to be higher than at least the thermal conductivity of the sealing resin part 7, however, preferably, the thermal conductivity of the adhesive 8 is as high as possible. Because of this, it is possible to use a silver paste preferably as the adhesive 8 and due to this, it is possible to increase the thermal conductivity of the adhesive 8, for example, as high as five to six times the thermal conductivity of the sealing resin part 7. As a silver paste used as the adhesive 8, an epoxy resin-based adhesive containing a silver (Ag) filler etc. can be used.

Preferably, the die pad 3 is located in the center of the region surrounded by the heat dissipating plate 6 in the form of a frame, and due to this, it is possible to surround the semiconductor chip 2 mounted so that the die pad 3 is located immediately under the center part of the back surface 2b of the semiconductor chip 2 by the heat dissipating plate 6 in the form of a frame in a planar, well-balanced manner, and therefore, it is possible to magnify the effect to improve the heat dissipation characteristics due to the provision of the heat dissipating plate 6.

Further, the semiconductor chip 2 is mounted over the die pad 3 and the member 9, and therefore, it is possible to regard the combination of the die pad 3 and the member 9 as a chip mounting part. In this case, it is possible to regard the heat dissipating plate 6 as the frame body part arranged so as to surround the chip mounting part (combination of the die pad 3 and the member 9) instead of the chip mounting part.

In another view, it is possible to regard the heat dissipating plate 6 also as the chip mounting part, not only the die pad 3 and the member 9, because the die pad 3, the member 9, and the heat dissipating plate 6 are integrally formed. That is, as assigned a symbol in FIG. 13 and FIG. 14, it is also possible to regard the whole of the combination of the die pad 3, the member 9, and the heat dissipating plate 6 as a chip mounting part 12. In the chip mounting part 12, a plurality of openings 13 surrounded by the heat dissipating plate 6, the member 9, and the die pad 3 is formed. The outer edge (corresponding to the outer edge 6d of the heat dissipating plate 6) of the chip mounting part 12 is located outside the outer circumference of the semiconductor chip 2. Each of the openings 13 of the chip mounting part 12 is an opening and penetrates through from the top surface of the chip mounting part 12 to the bottom surface of the chip mounting part 12. Here, the top surface of the semiconductor chip 2 includes the top surface 3a of the die pad 3 and the member 9 and the top surface 6a of the heat dissipating plate 6 and the bottom surface of the chip mounting part 12 includes the bottom surface 3b of the die pad 3 and the member 9 and the bottom surface 6b of the heat dissipating plate 6. The entire surface of the region of the top surface of the chip mounting part 12, which is in opposition to the back surface 2b of the semiconductor chip 2 and in which the opening 13 is not formed, is bonded to the back surface 2b of the semiconductor chip 2 with the adhesive 8. In the chip mounting part 12, immediately under the center part of the semiconductor chip 2, the opening 13 is not arranged because the die pad 3 is arranged immediately under the center part of the semiconductor chip 2.

Figure 17:
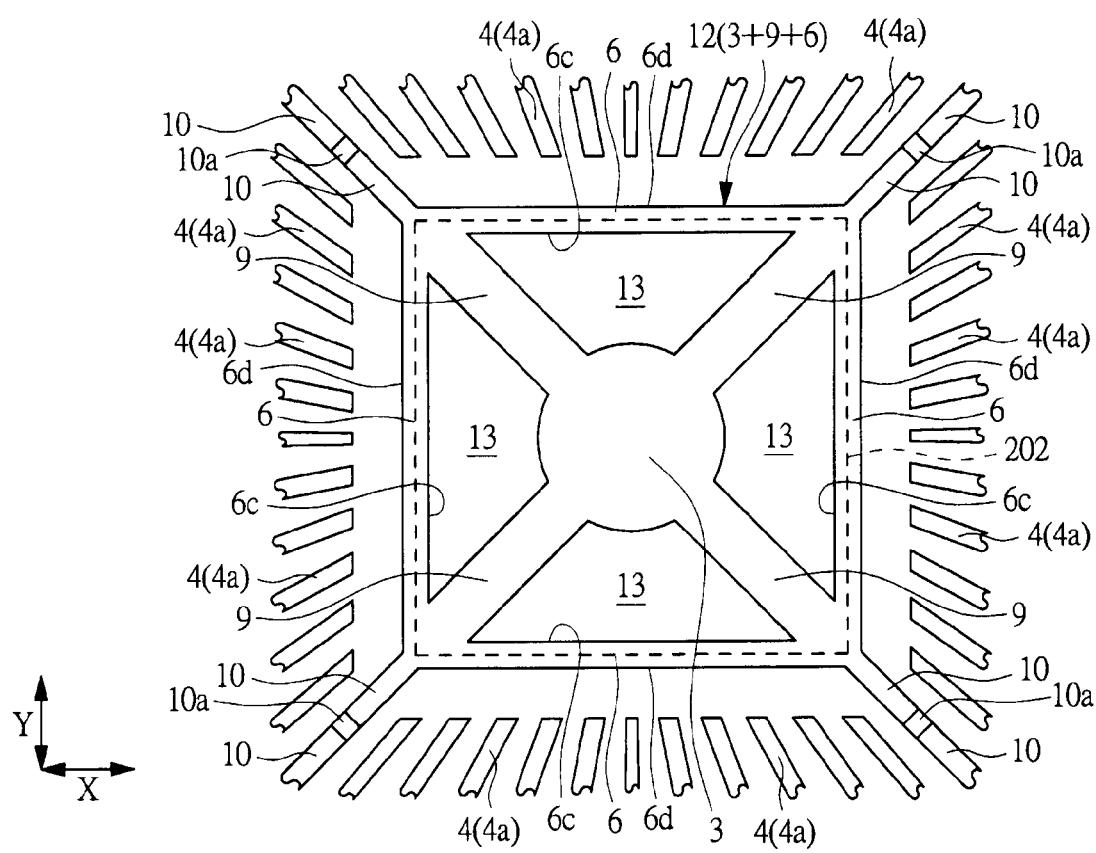
FIG. 17 is a plan perspective view of essential parts of a semiconductor device when a large semiconductor chip is mounted.

Unlike the present embodiment, FIG. 17 is a plan perspective view (partially enlarged plan perspective view) of essential parts of a semiconductor device when a semiconductor chip 202, the plane dimensions of which are further increased than those of the semiconductor chip 2, is mounted instead of the semiconductor chip 2 in the present invention, corresponding to FIG. 5. Like FIG. 5, in FIG. 17 also, the position where the semiconductor chip 202 is mounted (arranged) is indicated by a dotted line.

In the case of FIG. 17, unlike the present embodiment, the inner edge 6c of the heat dissipating plate 6 is located immediately under the semiconductor chip 2 and the entire outer circumference of the semiconductor chip 2 overlaps the heat dissipating plate 6 in a planar view. That is, in the case of FIG. 17, the state is such that the entire region of the opening 13 when the total combination of the heat dissipating plate 6, the member 9, and the die pad 3 is regarded as the chip mounting part 12 is covered by the semiconductor chip 2 in a planar manner. In other words, in the case of FIG. 17, the state is such that the opening 13 is included by the semiconductor chip 2 in a planar manner.

As shown in FIG. 17, when the opening 13 is included by the semiconductor chip 2 in a planar manner, in a molding step of forming the sealing resin part 7 (resin sealing step), the state is such that the opening 13 is covered with the lid by the semiconductor chip 2, and therefore, when the mold resin (resin material of the sealing resin part 7) flows into the opening 13, a void is likely to be produced. Because of this, in a manufactured semiconductor device, a void is likely to be produced in the sealing resin part 7 within the opening 13 (under the semiconductor chip 202), and because a void acts to deteriorate the reliability of a semiconductor device, and therefore, it is unacceptable from the standpoint of the reliability of a semiconductor device.

In contrast to the above, in the present embodiment, as shown in FIG. 13 and FIG. 14, the outer circumference of the semiconductor chip 2 is located between the inner edge 6c of the heat dissipating plate 6 and the die pad 3 and the outer circumference of the semiconductor chip 2 does not overlap the heat dissipating plate 6 in a planar view. In another view (a view in which the total combination of the die pad 3, the member 9, and the heat dissipating plate 6 is regarded as the chip mounting part 12), the opening 13 has a part that overlaps the semiconductor chip 2 in a planar manner and a part that does not overlap in a planar manner. That is, each opening 13 is in a state where a part is covered by the semiconductor chip 2 in a planar manner, however, the other part is not covered by the semiconductor chip 2 in a planar manner.

Because of this, in the present embodiment, in the molding step (resin sealing step) of forming the sealing resin part 7, even when the mold resin (resin material of the sealing resin part 7) enters the opening 13, it is possible for the mold resin to flow upward and downward from the chip mounting part 12 in the opening 13 of the part not covered by the semiconductor chip 2, and therefore, it is possible to suppress or prevent a void from occurring in the sealing resin part 7 within the opening 13. As a result, it is possible to improve the reliability of the semiconductor device 1.

Consequently, in the present embodiment, it is possible to manufacture the semiconductor device 1 using a common lead frame (lead frame having the die pad 3, the member 9, the heat dissipating plate 6, the suspension lead 10, and the lead 4) for the semiconductor chips 2 of different plane dimensions, however, it is necessary to create a design as follows.

That is, when there is a possibility that a plurality of kinds of the semiconductor chips 2 of different plane dimensions may be mounted, the plane dimensions of the die pad 3 are made smaller than the plane dimensions of the semiconductor chip 2 of the minimum dimensions that has a possibility of being mounted. As a result, even when the semiconductor chip 2 of the minimum dimensions is bonded over the die pad 3 and the member 9 with the adhesive 8, part of the back surface 2b of the semiconductor chip 2 can be bonded to the sealing resin part 7 without opposing the die pad 3 or the member 9. With the arrangement, as described above, it is possible to prevent the semiconductor chip 2 from peeling off from the die pad 3 or the member 9 at the time of solder reflow when packaging the semiconductor device 1 on the packaging substrate PWB, as described above, and therefore, it is possible to improve the reliability (solder reflow resistance) of the semiconductor device 1.

Further, when there is a possibility that a plurality of kinds of the semiconductor chips 2 of different plane dimensions may be mounted, the inner edge 6c of the heat dissipating plate 6 is made to be located outside the position of the outer circumference of the semiconductor chip 2 of the maximum dimensions having a possibility of being mounted. That is, even when the semiconductor chip 2 of the maximum dimensions having a possibility of being mounted is mounted, the outer circumference of the semiconductor chip 2 is made to be located between the inner edge 6c of the heat dissipating plate 6 and the die pad 3 in a planar view (the outer circumference of the semiconductor chip 2 does not overlap the heat dissipating plate 6 in a planar view). In other words, even when the semiconductor chip 2 of the maximum dimensions having a possibility of being mounted is mounted, it is required to bring about a state where part of the opening 13 is covered by the semiconductor chip 2 in a planar manner, however, the other part is not covered by the semiconductor chip 2 in a planar manner. As a result, it is possible to suppress or prevent a void from occurring in the sealing resin part 7 under the semiconductor chip 2, and therefore, it is possible to improve the reliability of the semiconductor device 1.

Further, it is preferable for the space between the outer circumference of the semiconductor chip 2 and the inner edge 6c of the heat dissipating plate 6 to be designed by taking into consideration the mounting position precision of the semiconductor chip in a die boding step. That is, preferably, even when the semiconductor chip 2 of the maximum dimensions having a possibility of being mounted is mounted and a certain amount of shift is caused in the mounting position of the semiconductor chip resulting from the boding device etc., the outer circumference of the semiconductor chip 2 is made to be located between the inner edge 6c of the heat dissipating plate 6 and the die pad 3 in a planar view (the outer circumference of the semiconductor chip 2 does not overlap the heat dissipating plate 6 in a planar view). From this standpoint, it is possible to design the inner edge 6c of the heat dissipating plate 6 so that the space between the outer circumference of the semiconductor chip 2 and the inner edge 6c of the heat dissipating plate 6 is, for example, about 0.1 mm in a planar view when the semiconductor chip 2 of the maximum dimensions having a possibility of being mounted is mounted.

According to the experiment conducted by the inventors of the present invention, the thermal resistance of the semiconductor device 101, to which the second comparative example in FIG. 10 in which nothing corresponding to the heat dissipating plate 6 was not provided was applied, was 41° C./W (when the heat generation of the semiconductor chip 102 is 1 W, the rise in temperature of the semiconductor chip 102 is 41° C. from the ambient temperature). In contrast to this, in the semiconductor device 1 in the present embodiment, the thermal resistance was 35.4° C. (when the heat generation of the semiconductor chip 2 is 1 W, the rise in temperature of the semiconductor chip 2 is 35.4° C. from the ambient temperature). According to the present embodiment, as described above, it is possible to improve the heat dissipation characteristics (that is, to reduce the thermal resistance) of a semiconductor device.

Second Embodiment

Figure 18:
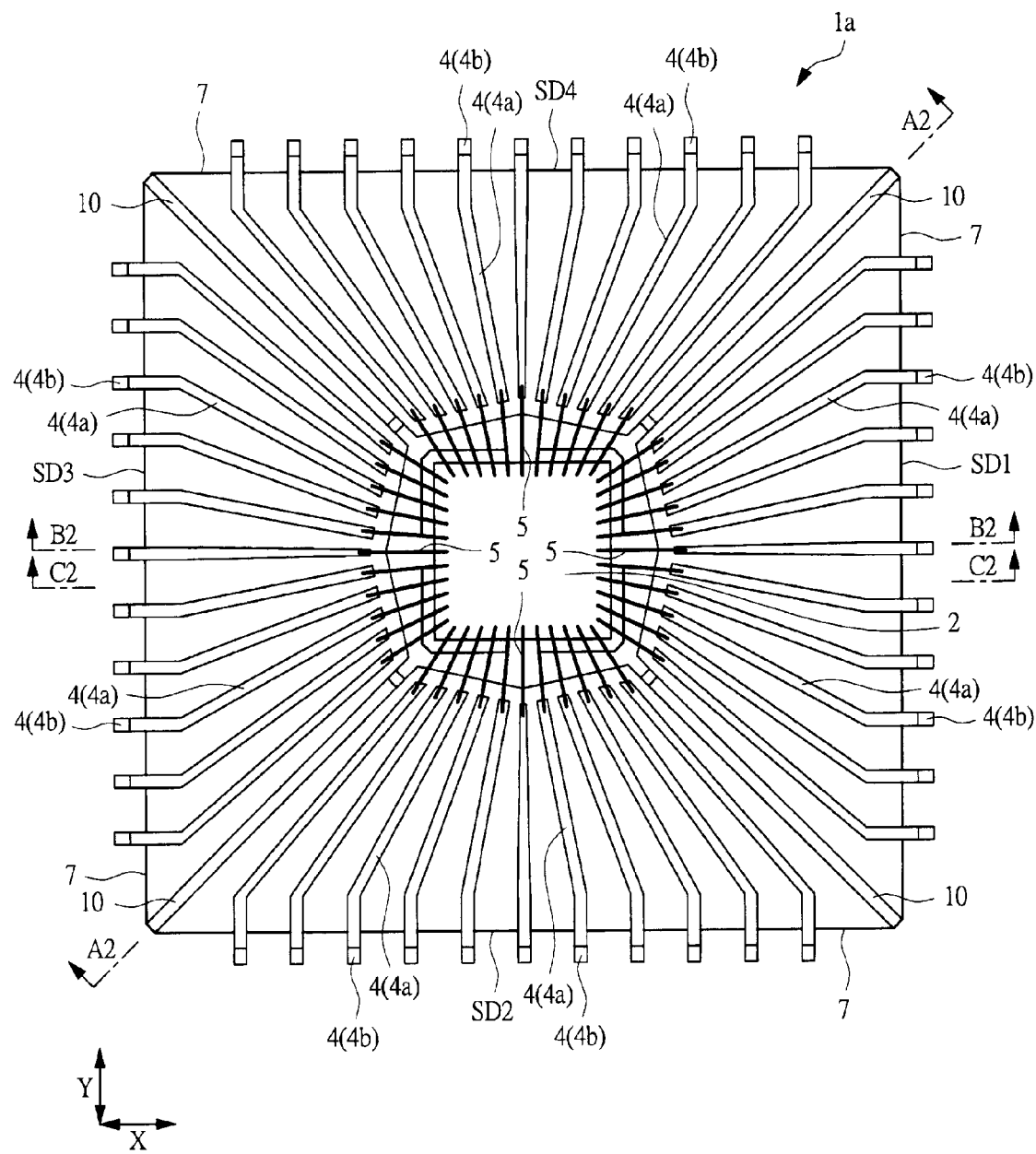
FIG. 18 is a plan perspective view of a semiconductor device in a second embodiment of the present invention.
Figure 19:
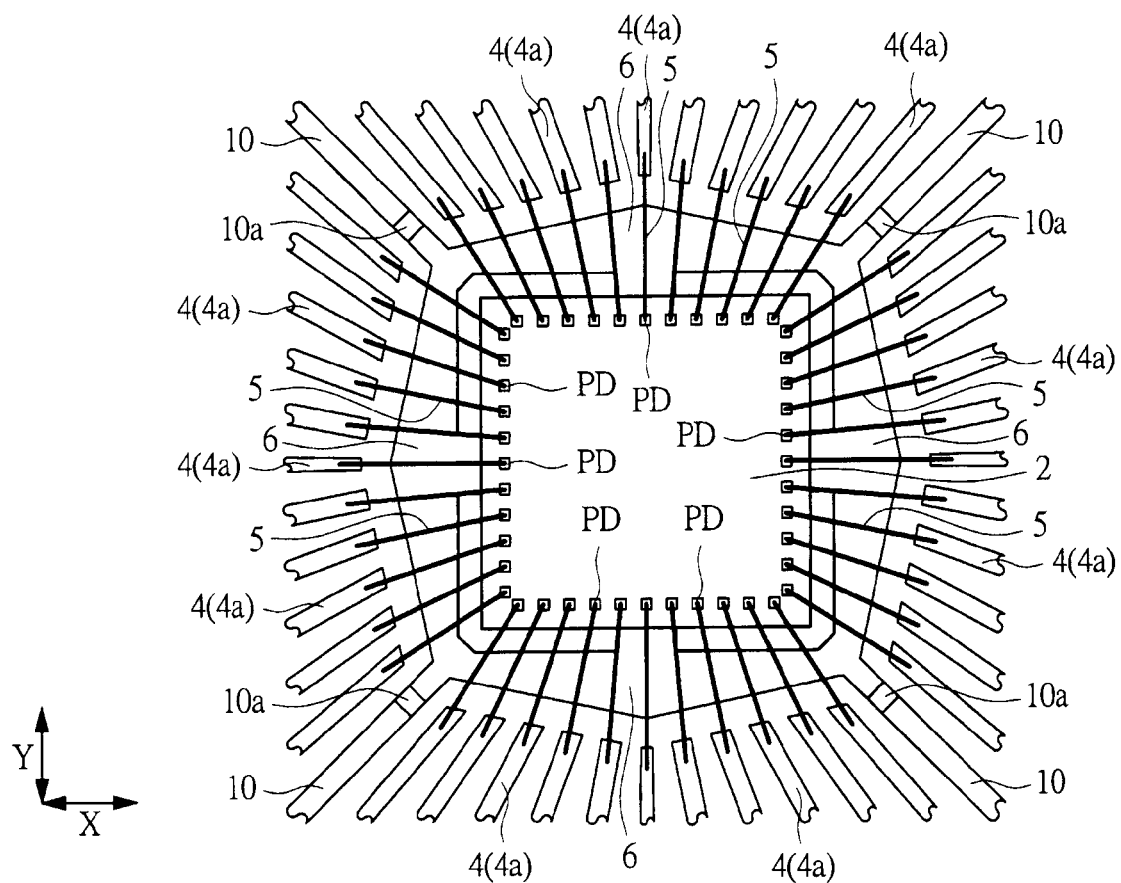
FIG. 19 is a partially enlarged plan perspective view of the semiconductor device in the second embodiment of the present invention.
Figure 20:
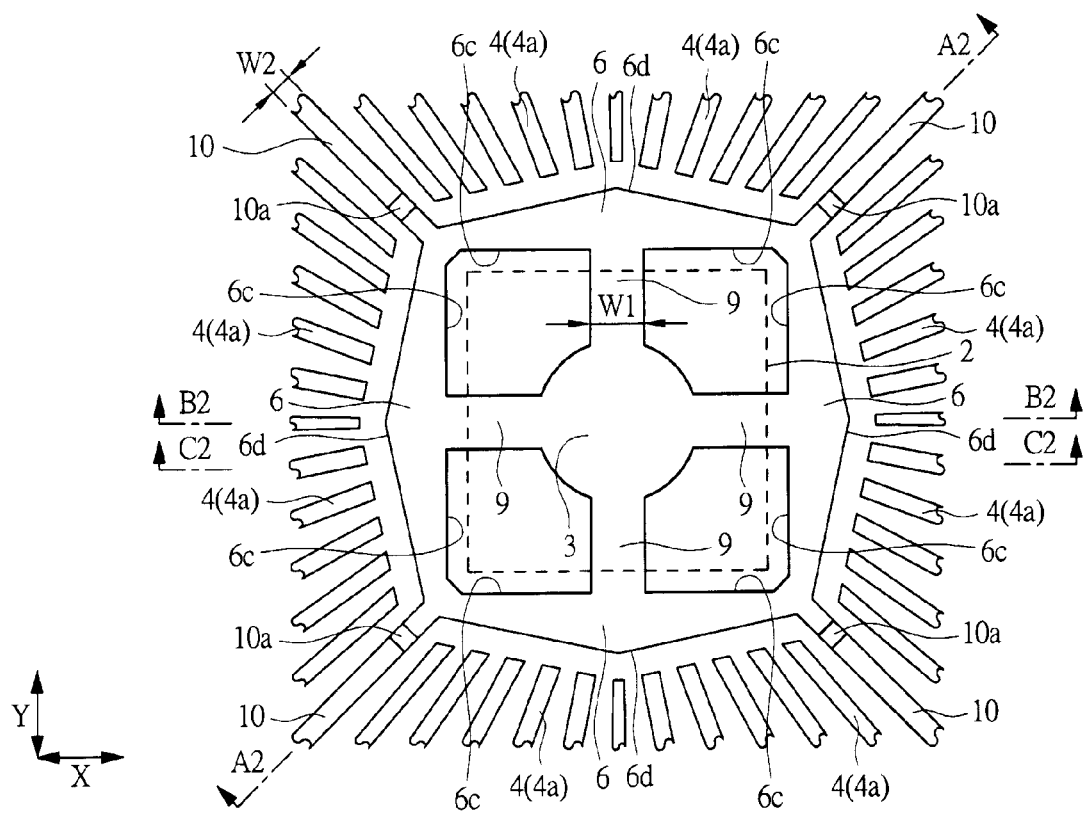
FIG. 20 is a partially enlarged plan perspective view of the semiconductor device in the second embodiment of the present invention.
Figure 21:
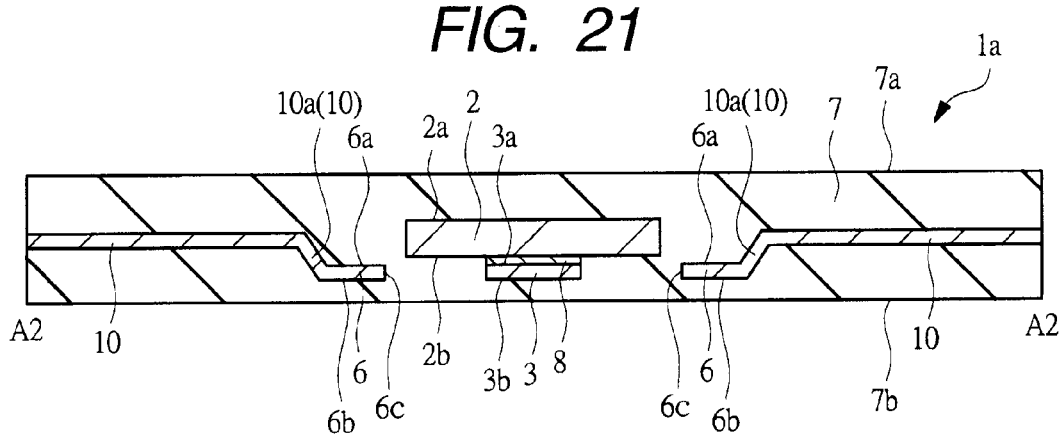
FIG. 21 is a section view of the semiconductor device in the second embodiment of the present invention.
Figure 22:
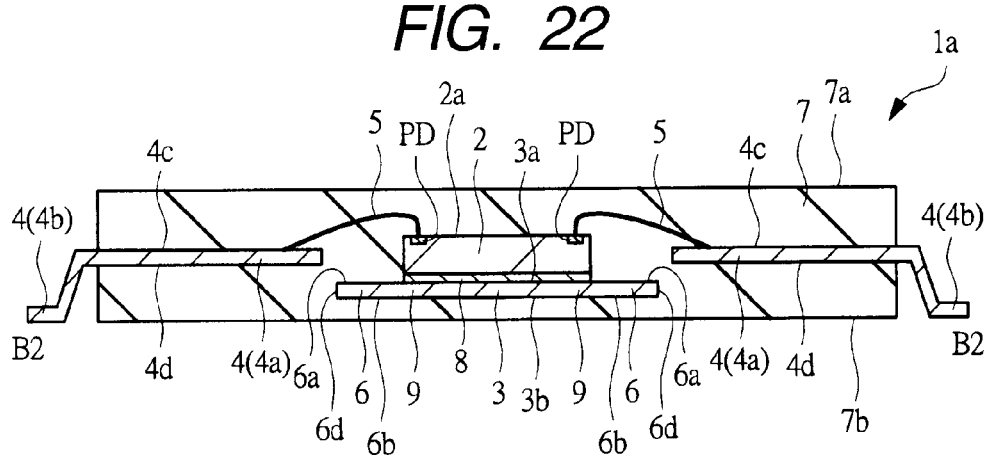
FIG. 22 is a section view of the semiconductor device in the second embodiment of the present invention.
Figure 23:
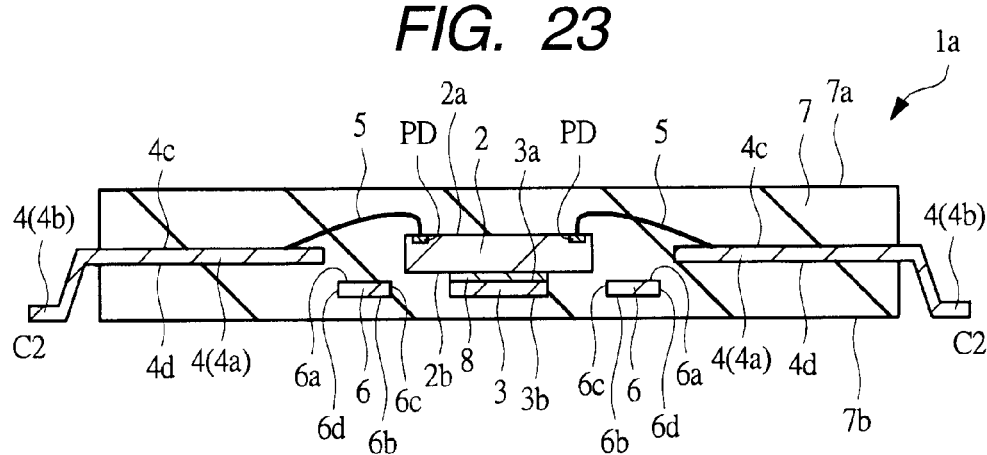
FIG. 23 is a section view of the semiconductor device in the second embodiment of the present invention.
Figure 24:
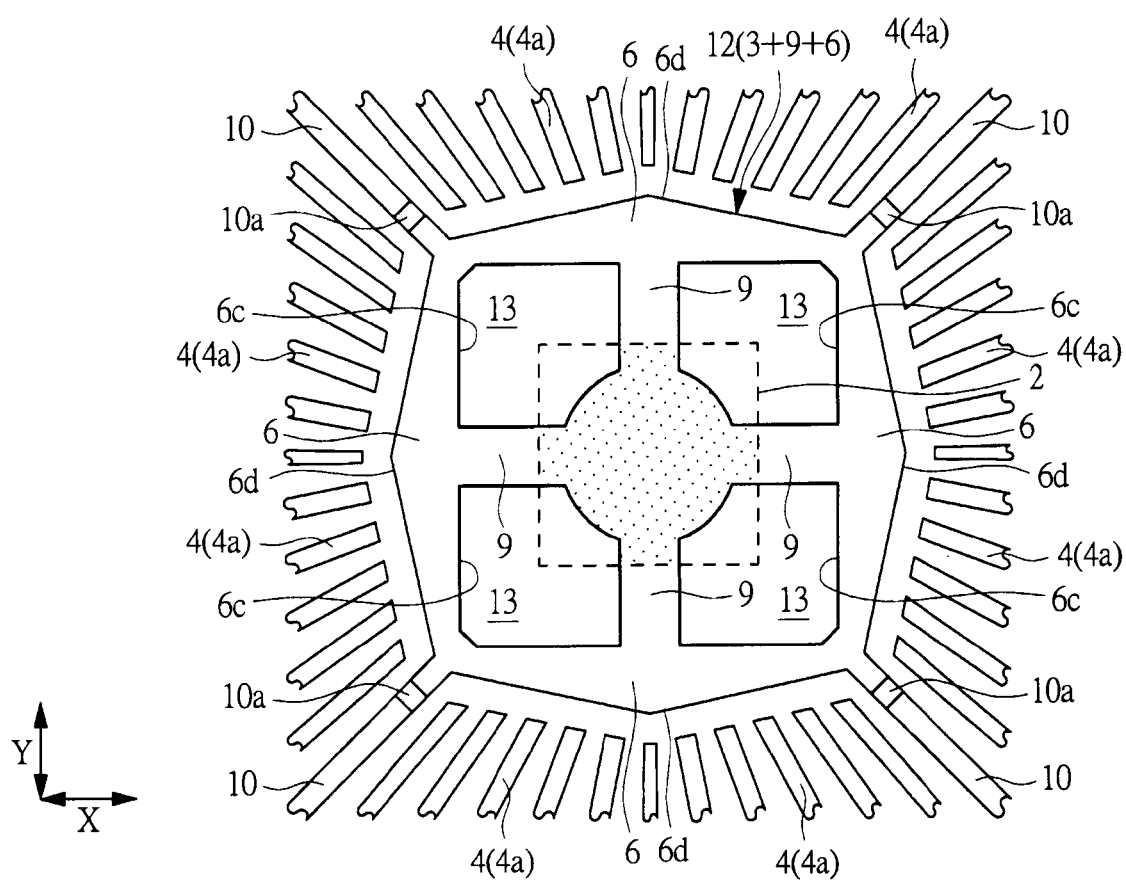
FIG. 24 is a partially enlarged plan perspective view of the semiconductor device in the second embodiment of the present invention.
Figure 25:
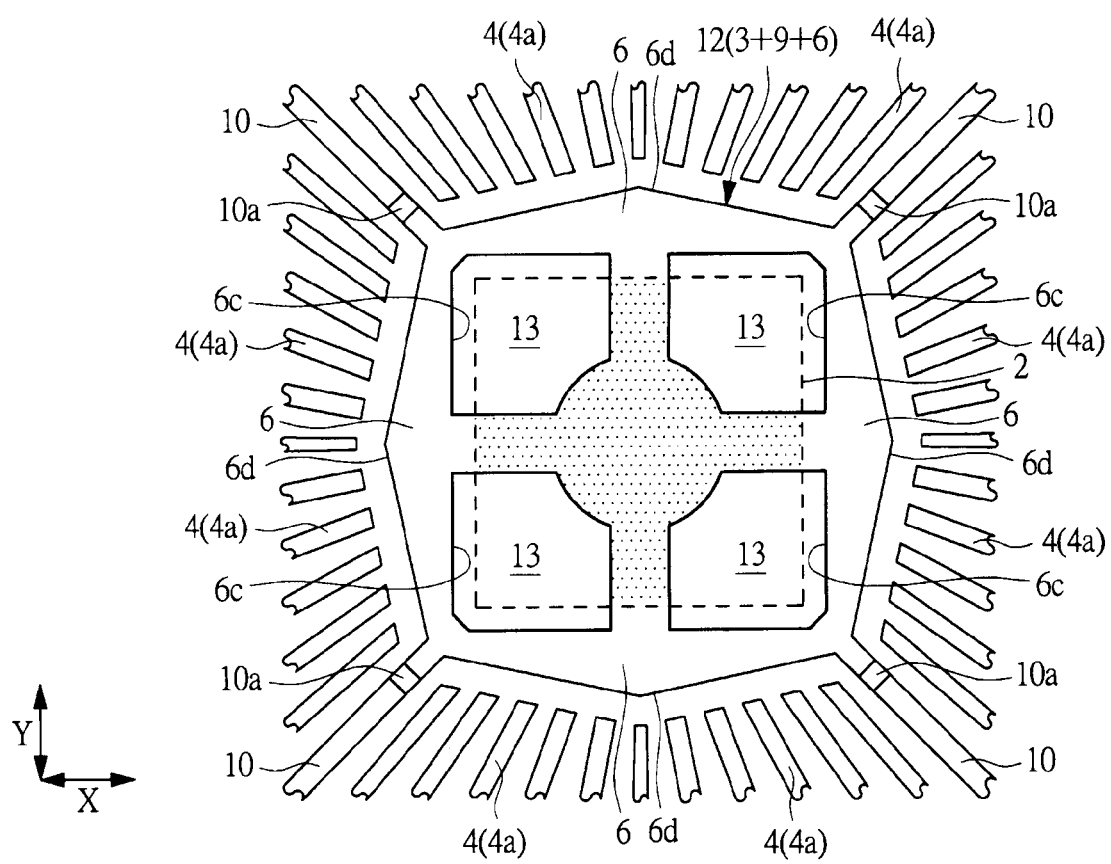
FIG. 25 is a partially enlarged plan perspective view of the semiconductor device in the second embodiment of the present invention.

FIG. 18 is a plan perspective view (top view) of semiconductor device 1a in the present embodiment, showing a plan perspective view of the semiconductor device 1a when the sealing resin part 7 is viewed perspectively. FIG. 19 is a partially enlarged view (partially enlarged plan perspective view) of FIG. 18, showing an enlarged view of the part in the vicinity of the center part in FIG. 19 (the semiconductor chip 2 and the region in the vicinity thereof). FIG. 20 is a plan perspective view (partially enlarged plan perspective view) of the semiconductor device 1a when the semiconductor chip 2 and the bonding wire 5 are removed (viewed perspectively) in FIG. 19. FIG. 18, FIG. 19, and FIG. 20 correspond to FIG. 3, FIG. 4, and FIG. 5 in the first embodiment, respectively. As in FIG. 5, in FIG. 20, the position where the semiconductor chip 2 is mounted (arranged) is shown by a dotted line for easier understanding. FIG. 21 to FIG. 23 are each a section view (side section view) of the semiconductor device 1a in the present embodiment and the section view of the position along A2-A2 line in FIG. 18 substantially corresponds to FIG. 21, the section view of the position along B2-B2 in FIG. 18 substantially corresponds to FIG. 22, and the section view of the position along C2-C2 in FIG. 18 substantially corresponds to FIG. 23. For easier understanding, in FIG. 20 also, the positions corresponding to the A2-A2 line, the B2-B2 line, and the C2-C2 line in FIG. 18 are assigned the A2-A2 line, the B2-B2 line, and the C2-C2 line, however, while only part of the semiconductor device 1a is shown in FIG. 20, FIG. 21 to FIG. 23 are each a section view of the entire semiconductor device 1a (the entire region shown in FIG. 18). FIG. 24 and FIG. 25 are each a partially enlarged plan perspective view of the semiconductor device 1 in the present embodiment, wherein FIG. 24 corresponds to the case where the semiconductor chip 2 to be mounted is small and FIG. 25 corresponds to the case where the semiconductor chip 2 to be mounted is large, corresponding to FIG. 13 and FIG. 14, respectively. As in FIG. 13 and FIG. 14, in FIG. 24 and FIG. 25 also, the position where the semiconductor chip 2 is mounted (arranged) is shown by a dotted line and the region where the adhesive 8 is arranged (applied) is hatched by dots. The size of the semiconductor chip 2 is the same both in FIG. 20 and in FIG. 25, however, the plane dimensions of the semiconductor chip 2 in FIG. 24 are smaller than those in FIG. 25. Because the top view and the bottom view of the semiconductor device 1a in the present embodiment are the same as the top view and the bottom view in the first embodiment, and therefore, they are not shown schematically here.

A structure of the semiconductor device 1a in the present embodiment shown in FIG. 18 to FIG. 25 is explained, the points different from the semiconductor device 1 in the first embodiment being focused on.

As can also be seen from FIG. 20, in the semiconductor device 1a in the present embodiment shown in FIG. 18 to FIG. 23, the direction in which each member 9 that connects the die pad 3 and the inner edge 6c of the heat dissipating plate 6 extends is the X direction and the Y direction. That is, the four members 9 are provide in total, the two members 9 extending in opposite directions from the die pad 3 and parallel with the X direction and the other two members 9 extending in opposite directions from the die pad 3 and parallel with the Y direction. The four sides (sides SD1 to SD4) of the sealing resin part 7 in the shape of a plane rectangle include the two sides (sides SD2, SD4) in parallel with the X direction and the other two sides (sides SD1, SD3) parallel with the Y direction, and therefore, the direction in which each member 9 extends is perpendicular to each side (of the sides SD1 to SD4) of the sealing resin part 7 in the shape of a plane rectangle.

From another viewpoint, in the semiconductor device 1a in the present embodiment, the heat dissipating plate 6 in the form of a frame has four sides respectively along the four sides of the semiconductor chip 2 in the shape of a plane rectangle, and the center part of each side of the heat dissipating plate 6 and the die pad 3 are connected by the member 9. That is, the four members 9 are provided and the position in the inner edge 6c of the heat dissipating plate 6, where the member 9 is linked, is each center part of the four sides of the heat dissipating plate 6. More specifically, each side of the heat dissipating plate 6 in the form of a frame extends in the X direction and Y direction, and to the center part of the side of the heat dissipating plate 6 extending in the X direction, the member 9 extending in the Y direction is connected, and to the center part of the side of the heat dissipating plate 6 extending in the Y direction, the member 9 extending in the X direction is connected.

In this manner, it is possible to connect the die pad 3 and the heat dissipating plate 6 with the member 9 by the shortest distance. That is, when the position and the shape of the die pad 3 and the heat dissipating plate 6 are the same, if the case where the four corners of the heat dissipating plate 6 and the die pad 3 are connected with the member 9 as in the first embodiment is compared with the case where each of the center parts of the four sides of the heat dissipating plate 6 and the die pad 3 are connected with the member 9 as in the present embodiment, it is possible to reduce the length of the member 9 more in the present embodiment. Here, the length of the member 9 corresponds to the length in the direction parallel with the direction in which the member 9 extends from the die pad 3 toward the heat dissipating plate 6.

Because it is possible to reduce the length of the member 9 in the present embodiment, the thermal resistance can be reduced when heat in the semiconductor chip 2 diffuses from the back surface 2b of the semiconductor chip 2 to the heat dissipating plate 6 via the adhesive 8, the die pad 3, and the member 9, and therefore, it is possible to further improve the heat dissipation characteristics of the semiconductor device.

In the semiconductor device 1a of the present embodiment, the width (width or distance from the outer edge 6d to the inner edge 6c) of the heat dissipating plate 6 is greater at each center part of the four sides of the heat dissipating plate 6 than at the part other than the center parts. That is, as to the width (width from the outer edge 6d to the inner edge 6c) of the heat dissipating plate 6, the width (width from the outer edge 6d to the inner edge 6c) at each center part of the four sides of the heat dissipating plate 6 is greater than the width (width from the outer edge 6d to the inner edge 6c) at the part other than the center parts. In other words, each shape of the four sides of the heat dissipating plate 6 is such that the outer edge 6d of the center part extends toward the direction in which the inner lead part 4a is arranged. Then, the tip end of the inner lead part 4a of the leads 4 is arranged along the outer edge 6d of the heat dissipating plate 6 in a planar view.

From another viewpoint, it is possible to regard that each side of the heat dissipating plate 6 is a part sandwiched by the suspension leads 10 of the heat dissipating plate 6 because the suspension lead 10 is linked to each end part of the four sides (that is, each of the four corners) of the heat dissipating plate 6 in the form of a frame and each of the four sides of the heat dissipating plate 6 is sandwiched by the suspension leads 10. Because of this, in the semiconductor device 1a in the present embodiment, it can be said that the distance (width) from the outer edge 6d to the inner edge 6c of the part sandwiched by the suspension leads 10 (that is, each side of the heat dissipating plate 6) is greater at the center part of the part sandwiched by the suspension leads 10 of the heat dissipating plate 6 (that is, each side of the heat dissipating plate 6) than at the part other than the center part. It can also be said that the shape of the part sandwiched by the suspension leads 10 of the heat dissipating plate 6 (that is, each side of the heat dissipating plate 6) is such that the outer edge 6d of the center part extends toward the direction in which the inner lead 4a is arranged. Then, in a planar view, the tip end of the inner lead part 4a of the leads 4 is arranged along the outer edge 6d of the heat dissipating plate 6.

The inner lead parts 4a and the electrodes PD of the semiconductor chip 2 are electrically coupled via the bonding wires 5. In order to arrange and design the bonding wire so as to satisfy the restrictions on the processing of the wire bonding, it is effective to arrange the inner lead part 4a to be wire-bonded to the electrode PD located at the center of the two sides of the semiconductor chip 2 so that its tip end is distant from the semiconductor chip 2 and to arrange the inner lead part 4a to be wire-bonded to the electrode PD at a position distant from the center of the two sides of the semiconductor chip 2 so that its tip end is close to the semiconductor chip 2. Further, in order to reduce the thermal resistance, it is effective to increase the width of the heat dissipating plate 6, however, it is necessary to lay out the heat dissipating plate 6 so as not to overlap the lead 4 in a planar manner because of the restrictions on processing etc.

Because of the above, in the present embodiment, the tip end of the inner lead part 4a of the leads 4 surrounding the semiconductor chip 2 is arranged at a position where the wire-bonding can be done easily, and a layout is designed so that the width of the heat dissipating plate 6 is as great as possible. That is, as described above, it is designed so that the width of the heat dissipating plate 6 is greater at each center part of the four sides of the heat dissipating plate 6 than at the part other than the center part, and the tip end of the inner lead part 4a of the leads 4 is arranged along the outer edge 6d of the heat dissipating plate 6 in a planar view. In other words, the shape of each of the four sides of the heat dissipating plate 6 is made to be such that the outer edge 6d of the center part extends toward the direction in which the inner lead part 4a is arranged and the tip end of the inner lead part 4a of the leads 4 is arranged along the outer edge 6d of the heat dissipating plate 6 in a planar view, and thereby, it is possible to obtain the easiness of wire-bonding and the effect of the further improvement of the heat dissipation characteristics (effect to reduce the thermal resistance) due to the increase in the width of the heat dissipating plate 6.

Other configurations of the semiconductor 1a in the present embodiment are the same as those of the semiconductor 1 in the first embodiment, and therefore, its explanation is omitted here.

According to the experiment conducted by the inventors of the present invention as described above, while the thermal resistance of the semiconductor device 101, to which the second comparative example in FIG. 10 in which nothing corresponding to the heat dissipating plate 6 was not provided was applied, was 41° C./W and the thermal resistance in the semiconductor device 1 in the first embodiment was 35.4° C., in the semiconductor device 1a in the present embodiment, the thermal resistance was 33.0° C./W (when the heat generation in the semiconductor chip 2 is 1 W, the rise in temperature of the semiconductor chip 2 is 33.0° C. from the ambient temperature). According to the present embodiment, as described above, it is possible to further improve the heat dissipation characteristics (that is, to further reduce the thermal resistance) of a semiconductor device.

Further, as in the first embodiment described above, in the present embodiment also, the top surface 3a of the die pad 3 and the top surface 3a of the part of the members 9, which is in opposition to the back surface 2b of the semiconductor chip 2, are bonded to the back surface 2b of the semiconductor chip 2 in their entire surfaces with the adhesive 8 regardless of the size of the semiconductor chip 2 to be mounted, as can also be seen from FIG. 21 to FIG. 25.

Furthermore, as in the first embodiment, in the present embodiment also, it is possible to regard the combination of the die pad 3 and the member 9 as the chip mounting part because the semiconductor chip 2 is mounted over the die pad 3 and the member 9, and in this case, it is possible to regard the heat dissipating plate 6 as the frame body part arranged so as to surround the chip mounting part (combination of the die pad 3 and the member 9), instead of the chip mounting part.

From another view different from that in the first embodiment described above, in the present embodiment also, the die pad 3, the member 9, and the heat dissipating plate 6 are formed integrally, and therefore, it is possible to regard the heat dissipating plate 6 as the chip mounting part, not only the die pad 3 and the member 9. That is, as symbols are assigned in FIG. 24 and FIG. 25, it is possible to regard the total combination of the die pad 3, the member 9, and the heat dissipating plate 6 as the chip mounting part 12 and in the chip mounting part 12, a plurality of the openings 13 surrounded by the heat dissipating plate 6, the member 9, and the die pad 3 is formed. The outer edge (corresponding to the outer edge 6d of the heat dissipating plate 6) of the chip mounting part 12 is located outside the outer circumference of the semiconductor chip 2 and each opening 13 penetrates through from the top surface of the chip mounting part 12 to the bottom surface of the chip mounting part 12. The region of the top surface of the chip mounting part 12, which is in opposition to the back surface 2b of the semiconductor chip 2 and in which the opening 13 is not formed, is bonded to the back surface 2b of the semiconductor chip 2 in its entire surface with the adhesive 8. In the chip mounting part 12, the opening 13 is not arranged immediately under the center part of the semiconductor chip 2, and this is because the die pad 3 is arranged immediately under the center part of the semiconductor chip 2.

Figure 26:
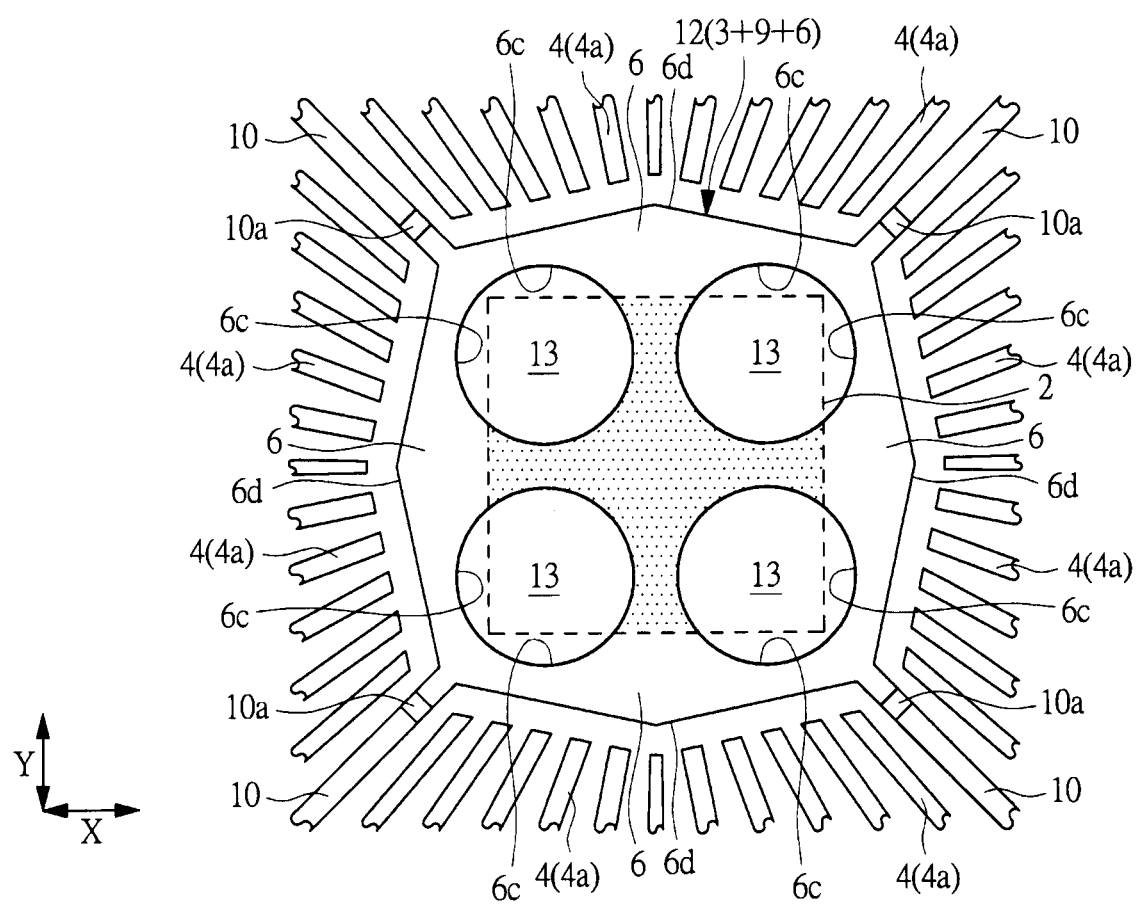
FIG. 26 is a partially enlarged plan perspective view showing a modified example of the semiconductor device in the second embodiment of the present invention.

FIG. 26 is a partially enlarged plan perspective view showing a modified example of the semiconductor device 1a in the present embodiment, corresponding to FIG. 25 described above. The plane figure of the opening 13 is not limited to a rectangle, but another shape, for example, a circle as in FIG. 26 may be acceptable.

That is, regardless of the shape of the opening 13, each opening 13 has a part that overlaps the semiconductor chip 2 in a planar manner and a part that does not. That is, it is necessary for each opening 13 to be in a state where a part is covered by the semiconductor chip 2 in a planar manner but the other part is not covered by the semiconductor chip 2 in a planar manner regardless of the shape of the opening 13. As a result, as explained in the first embodiment, in the molding step, when the mold resin enters the opening 13, it is possible for the mold resin to flow both upward and downward from the chip mounting part 12 in the opening 13 of the part not covered by the semiconductor chip 2, and therefore, it is possible to suppress or prevent avoid from occurring in the sealing resin part 7 in the opening 13 and thus the reliability of the semiconductor device can be improved.

Most preferably, the four corners of the semiconductor chip 2 in the shape of a plane rectangle do not overlap the chip mounting part 12 in a planar manner and are located over the opening 13. That is, most preferably, the opening 13 is arranged over a plane so as to surround the corners of the semiconductor chip 2. In other words, most preferably, the openings 13 are arranged so as to surround the corners of the semiconductor chip 2 in a planar view. As a result, the part that does not overlap the semiconductor chip 2 in a planar manner is not divided but continuous in each opening 13, and therefore, when the mold resin enters the opening 13, it is possible for the mold resin to flow smoothly both upward and downward from the opening 13, and therefore, it becomes possible to appropriately prevent a void from forming. Further in the molding step, a void is likely to occur in the vicinity of the corner parts of the opening 13 corresponding to the four corners of the semiconductor chip 2, however, if the four corners of the semiconductor chip 2 are arranged over the opening 13, the part where a void is likely to occur can be released without being covered by the semiconductor chip 2, and therefore, this arrangement is advantageous in preventing formation of a void.

If the plane figure of the member 9 includes a part with a narrow width and a part with a great width mixedly, the thermal resistance is increased by the part with a narrow width. Because of this, when the area of the member 9 is the same, it is possible to reduce the thermal resistance more when the width of the member 9 is uniform than when the width of the member 9 varies in the direction in which the member 9 extends. Because of this, in order to reduce the thermal resistance of the member 9, it is most preferable for the member 9 to extend from the die pad 3 toward the member 9 with the same width.

Third Embodiment

Figure 27:
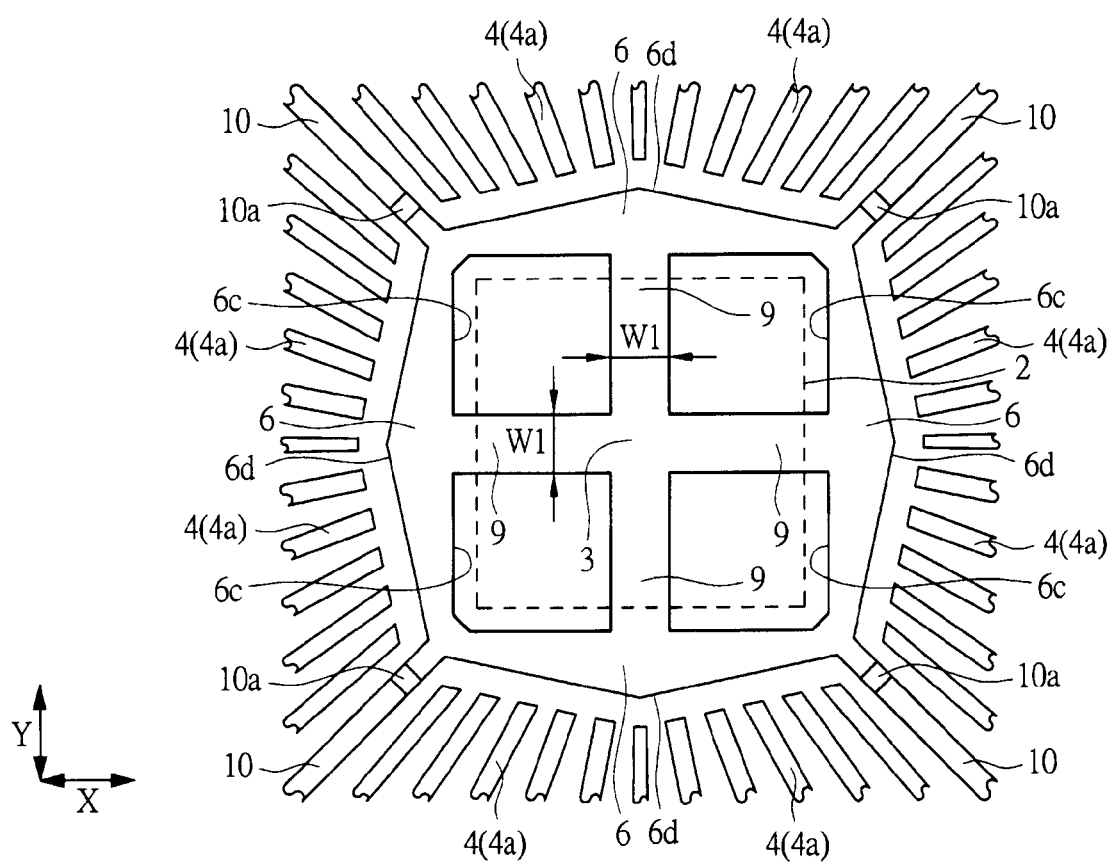
FIG. 27 is a plan perspective view of essential parts of a semiconductor device in a third embodiment of the present invention.

FIG. 27 is a plan perspective view of essential parts of a semiconductor device of the present invention, corresponding to FIG. 20 in the above-mentioned second embodiment. The present embodiment corresponds to a modified example of the second embodiment. As in FIG. 20, in FIG. 27 also, a plan perspective view of essential parts of a semiconductor device is shown when the sealing resin part 7 is viewed perspectively and further, the semiconductor chip 2 and the bonding wire 5 are removed (viewed perspectively), and for easier understanding, the position where the semiconductor chip 2 is mounted (arranged) is shown by a dotted line.

In the first and second embodiments described above, the plane figure of the die pad 3 is a circle having a diameter greater than the width (width in the direction perpendicular to the direction in which the member 9 extends from the die pad 3 toward the heat dissipating plate 6) W1 of the member 9. In contrast to that, in the present embodiment, the plane figure of the die pad 3 is a rectangle, in which the length of each side of the die pad 3 in the shape of a rectangle is the same as the width (width in the direction perpendicular to the direction in which the member 9 extends from the die pad 3 toward the heat dissipating plate 6) W1 of the member 9. That is, the region of intersection of the member 9 extending in the X direction and the member 9 extending in the Y direction is the die pad 3, and the width of the region of intersection (die pad 3) is the same as the width W1 of the member 9 other than the region of intersection (die pad 3).

Other configurations of the semiconductor device in the present embodiment are the same as those in the semiconductor device 1a in the second embodiment, and therefore, their explanation is omitted here.

In the present embodiment, compared to the semiconductor device 1a in the second embodiment described above, it is possible to increase the area of adhesion between the back surface 2b of the semiconductor chip 2 and the sealing resin part 7 by an amount corresponding to the amount of reduction in the area of the die pad 3. Because of this, it is possible to appropriately prevent the semiconductor chip 2 from peeling off from the die pad 3 and the member 9 at the time of solder reflow when packaging the semiconductor device on the packaging substrate PWB etc., and therefore, the reliability (solder reflow resistance) of the semiconductor device can be improved further.

On the other hand, as in the first and second embodiments described above, when the plane figure of the die pad 3 is a circle having a diameter greater than the width W1 of the member 9, it is possible to stably perform the die bonding step of the semiconductor chip 2 stably, and therefore, the assembling characteristics (easiness of assembling) of the semiconductor device can be improved. Further, the larger the area of the die pad 3, the more the thermal resistance can be reduced, and therefore, the heat dissipation characteristics can be improved further.

The present embodiment can be applied to any of the first and second embodiments, and fifth to ninth embodiments, to be described later.

Fourth Embodiment

Figure 28:
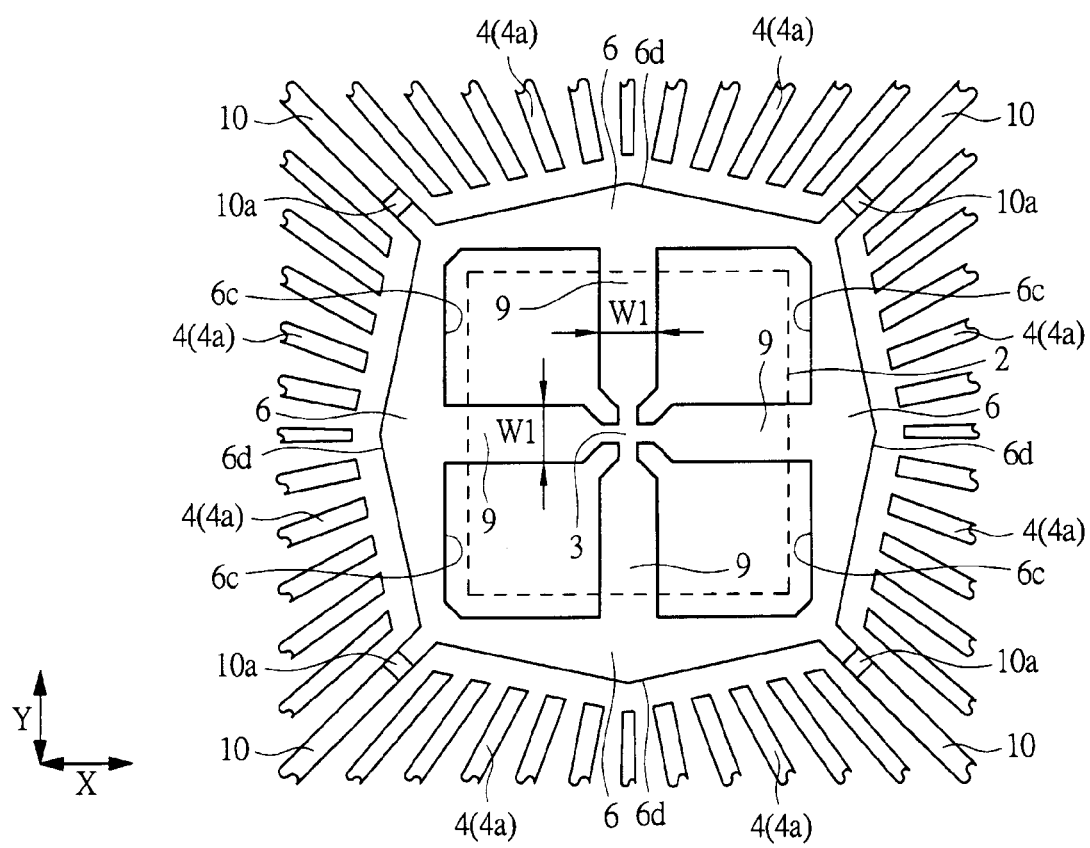
FIG. 28 is a plan perspective view of essential parts of a semiconductor device in a fourth embodiment of the present invention.

FIG. 28 is a plan perspective view of essential parts of a semiconductor device in the present embodiment, corresponding to FIG. 20 and FIG. 27 in the second and third embodiments. The present embodiment corresponds to a further modified example of the third embodiment. As in FIG. 20 and FIG. 27, in FIG. 28 also, a plan perspective view of essential parts of a semiconductor device is shown when the sealing resin part 7 is viewed perspectively and further, the semiconductor chip 2 and the bonding wire 5 are removed (viewed perspectively), and for easier understanding, the position where the semiconductor chip 2 is mounted (arranged) is shown by a dotted line.

In the third embodiment, the plane figure of the die pad 3 is a rectangle and the length of each side of the rectangular die pad 3 is the same as the width W1 of the member 9. In contrast to that, in the present embodiment, the plane figure of the die pad 3 is a rectangle, however, the length of each side of the die pad 3 is shorter than the width (width in the direction perpendicular to the direction in which the member 9 extends from the die pad 3 toward the heat dissipating plate 6) W1 of the member 9. That is, the region of intersection of the member 9 extending in the X direction and the member 9 extending in the Y direction is the die pad 3 and the width of the region of intersection (die pad 3) is less than the width W1 of the member 9 other than the region of intersection (die pad 3).

Other configurations of the semiconductor device in the present embodiment are the same as those of the semiconductor device in the third embodiment, and therefore, their explanation is omitted here.

In the third embodiment, the dimension of the chip mounting part to be bonded with the adhesive 8 is greatest in the diagonal direction of the region of intersection of the member 9 extending in the X direction and the member 9 extending in the Y direction, however, in the present embodiment, it is possible to reduce the length of the plane of adhesion between the back surface 2b of the semiconductor chip 2 and the die pad 3 via the adhesive 8 compared to the above, and therefore, it is possible to further appropriately prevent the semiconductor chip 2 from peeling off from the die pad 3 and the member 9 at the time of solder reflow when packaging the semiconductor device on the packaging substrate PWB, and the reliability (solder reflow resistance) of the semiconductor device can be improved further.

The back surface 2b of the semiconductor chip 2 is bonded also to the member 9 not only to the die pad 3 with the adhesive 8, and it is effective to increase the width W1 of the member 9 in order to efficiently conduct heat produced in the semiconductor chip 2 to the heat dissipating plate 6. However, although it is advantageous to increase the width W1 of the member 9 in improving the heat dissipation characteristics, it is disadvantage from the standpoint of preventing the semiconductor chip 2 from peeling off from the die pad 3 and the member 9 at the time of solder reflow when packaging the semiconductor device on the packaging substrate PWB etc. Because of this, when increasing the width W1 of the member 9 in order to further improve the heat dissipation characteristics, if the present embodiment is applied, its effect will be great. By applying the present embodiment, it will become easier to suppress the semiconductor chip 2 from peeling off from the die pad 3 and the member 9 at the time of solder reflow when packaging the semiconductor device on the packaging substrate PWB etc. even if the width W1 of the member 9 is increased.

The present embodiment can also be applied to any of the first and second embodiments and fifth to ninth embodiments, to be described later.

Fifth Embodiment

Figure 29:
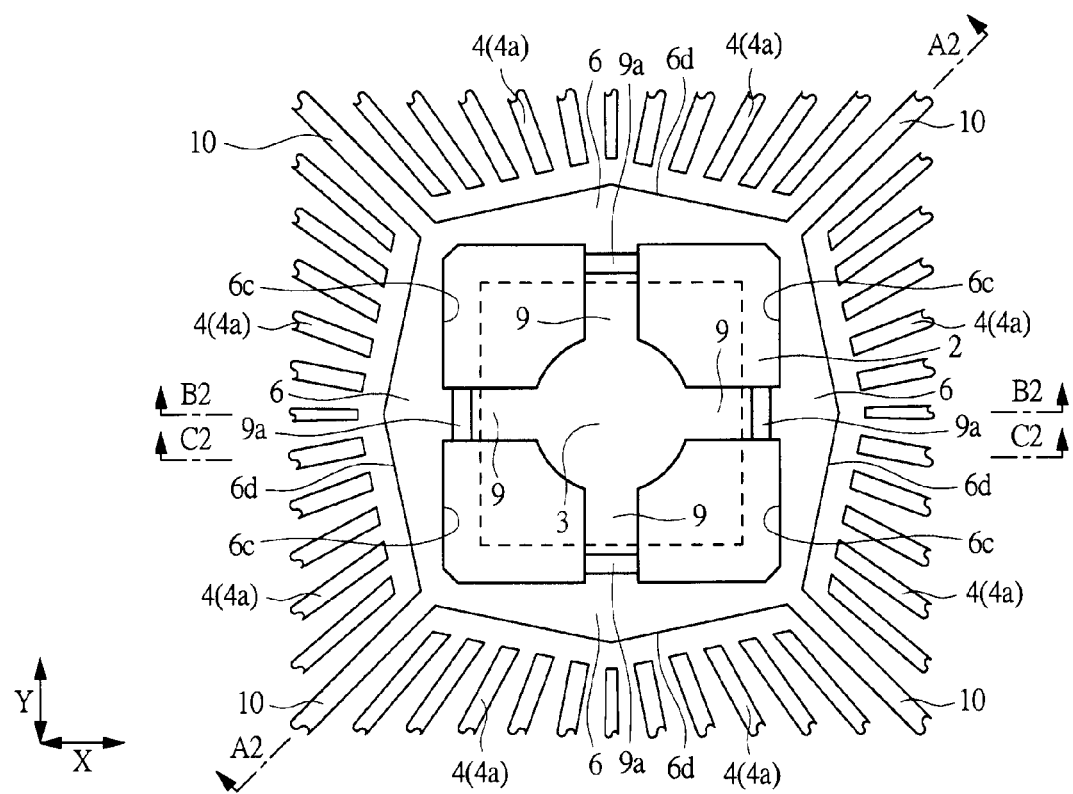
FIG. 29 is a plan perspective view of essential parts of a semiconductor device in a fifth embodiment of the present invention.
Figure 30:
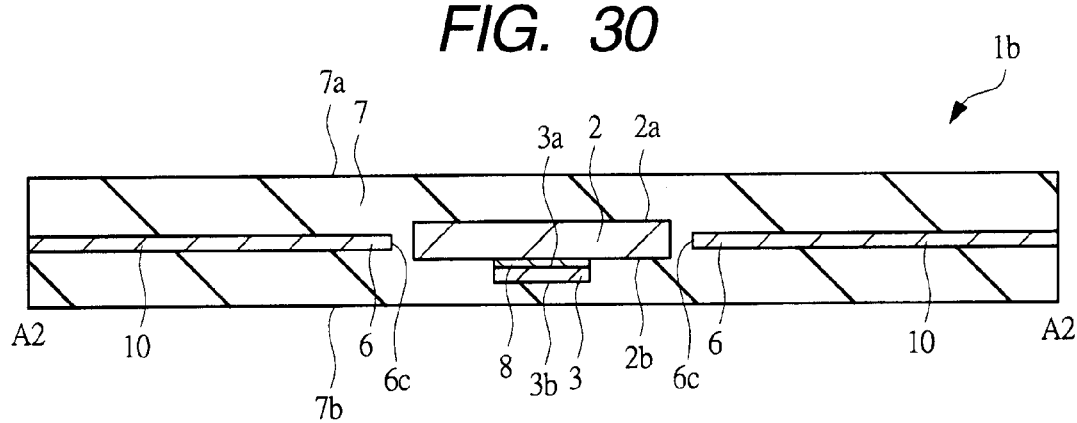
FIG. 30 is a section view of the semiconductor device in the fifth embodiment of the present invention.
Figure 31:
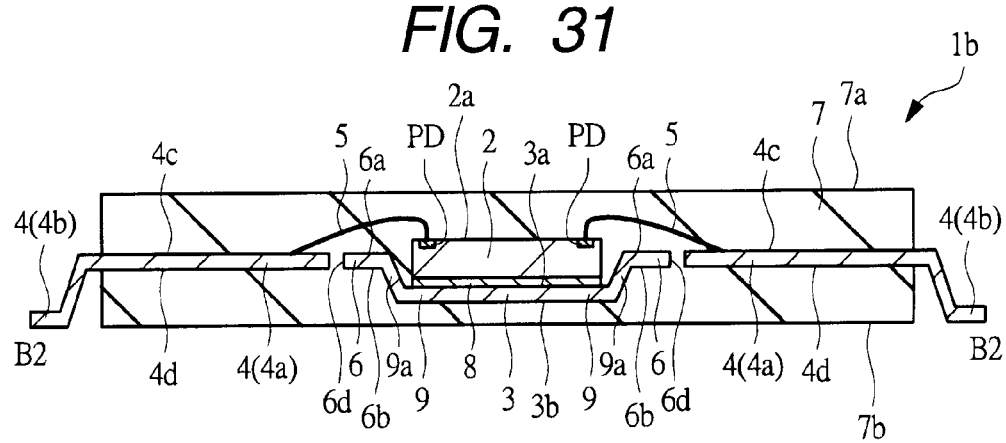
FIG. 31 is a section view of the semiconductor device in the fifth embodiment of the present invention.
Figure 32:
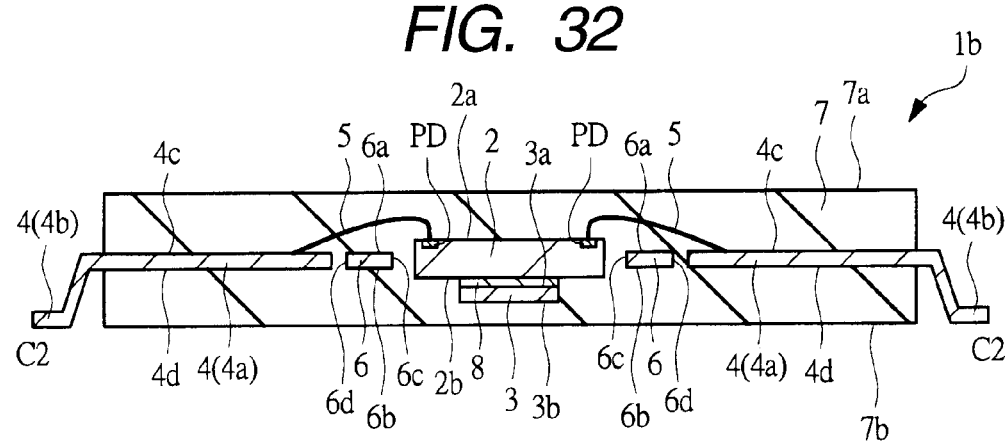
FIG. 32 is a section view of the semiconductor device in the fifth embodiment of the present invention.

FIG. 29 is a plan perspective view of essential parts of a semiconductor device 1b in the present embodiment and FIG. 30 to FIG. 32 are each a section view of the semiconductor device 1b in the present embodiment. The present embodiment corresponds to a modified example of the second embodiment. FIG. 29 corresponds to FIG. 20 in the second embodiment, FIG. 30 corresponds to FIG. 21 in the second embodiment (that is, the section at the position corresponding to the A2-A2 line in FIG. 18), FIG. 31 corresponds to FIG. 22 in the second embodiment (that is, the section at the position corresponding to the B2-B2 line in FIG. 18), and FIG. 32 corresponds to FIG. 23 in the second embodiment (that is, the section at the position corresponding to the C2-C2 line in FIG. 18). As in FIG. 20, in FIG. 29 also, a plan perspective view of essential parts of a semiconductor device is shown when the sealing resin part 7 is viewed perspectively and further, the semiconductor chip 2 and the bonding wire 5 are removed (viewed perspectively), and for easier understanding, the position where the semiconductor chip 2 is mounted (arranged) is shown by a dotted line. Further, for easier understanding, in FIG. 29 also, the positions corresponding to the A2-A2 line, the B2-B2 line, and the C2-C2 line in FIG. 18 are assigned the A2-A2 line, the B2-B2 line, and the C2-C2 line, however, while only part of the semiconductor device 1b is shown in FIG. 29, FIG. 30 to FIG. 32 are each a section view of the entire semiconductor device 1b (the entire region shown in FIG. 18).

Both in the second embodiment and in the present embodiment, the height position of the die pad 3 and the member 9 is set lower than the height position of the inner lead part 4a so that wire bonding between the inner lead part 4a and the electrode PD of the semiconductor chip 2 is easy to perform. However, the height position of the heat dissipating plate 6 is different between the second embodiment and the present embodiment.

The height or the height position referred to in the present application corresponds to the height from the back surface 7b of the sealing resin part 7, which is the reference, to the top surface of each member. For example, the height position of the die pad 3 corresponds to the height from the back surface 7b of the sealing resin part 7 to the top surface 3a of the die pad 3, the height position of the member 9 corresponds to the height from the back surface 7b of the sealing resin part 7 to the top surface 3a of the member 9, the height position of the heat dissipating plate 6 corresponds to the height from the back surface 7b of the sealing resin part 7 to the top surface 6a of the heat dissipating plate 6, and the height position of the inner lead part 4a corresponds to the height from the back surface 7b of the sealing resin part 7 to the top surface 4c of the inner lead part 4a.

That is, in the second embodiment, as can also be seen from FIG. 21 to FIG. 23, (the respective top surfaces 3a, 6a of) the die pad 3, the member 9, and the heat dissipating plate 6 are at the same height position and the heat dissipating plate 6 is arranged at a position (height position) lower than the inner lead part 4a. Because of this, in the second embodiment, as shown in FIG. 20 and FIG. 21, the bending part (flexing part) 10a is provided in the midway of the suspension lead 10. By bending the suspension lead 10 at the bending part 10a, the height position of the suspension lead 10, the heat dissipating plate 6, the member 9, and the die pad 3 inside the bending part 10a (on the side nearer to the center of the die pad 3 or the semiconductor chip 2) is made to be lower than the height position of the suspension lead 10 outside the bending part 10a (on the side more distant from the center of the die pad 3 or the semiconductor chip 2). The height position of the suspension lead 10 outside the bending part 10a is substantially the same as the height position of the inner lead part 4a. In the second embodiment, by providing the bending part 10a to the suspension lead 10, it is possible to arrange the die pad 3, the member 9, and the heat dissipating plate 6 at a position (height position) lower than the inner lead part 4a.

On the other hand, in the semiconductor device 1b in the present embodiment, as can also be seen from FIG. 30 to FIG. 32, the height position of (the top surface 6a of) the heat dissipating plate 6 is higher than the height position of (the top surface 3a of) the die pad 3 and the member 9, and preferably, (the top surface 6a of) the heat dissipating plate 6 is at the same height position as that of (the top surface 4c of) the inner lead 4a. Because of this, nothing corresponding to the bending part 10a formed in the second embodiment is provided to the suspension lead 10 in the present embodiment. Instead, in the present embodiment, a bending part 9a is provided between each member 9 and the inner edge 6c of the heat dissipating plate 6, and the bending part 9a is bent so that the top surface 3a of the die pad 3 and the member 9 is lower than the top surface 6a of the heat dissipating plate 6. The bending part 9a is formed integrally with the heat dissipating plate 6 and the member 9. By the bending part 9a, the height position of the member 9 and the die pad 3 is made to be lower than the height position of the suspension lead 10 and the heat dissipating plate 6.

In the present embodiment, nothing corresponding to the bending part 10a is provided to the suspension lead 10, and therefore, the height position of the suspension lead 10, the height position of the heat dissipating plate 6, and the height position of the inner lead part 4a are substantially the same. Then, by providing the bending part 9a between the member 9, not the suspension lead 10, and the heat dissipating plate 6, it is possible to arrange (the top surface 3a of) the die pad 3 and the member 9 at a position lower than (the top surface 4c of) the inner lead part 4a, and at the same time, it is also possible to arrange (the top surface 6a of) the heat dissipating plate 6 at a position higher than (the top surface 3a of) the die pad 3 and the member 9. Preferably, it is possible to arrange (the top surface 6a of) the heat dissipating plate 6 at the same height position as (the top surface 4c of) the inner lead 4a.

In the present embodiment, the bending part 9a is provided between the member 9 and the heat dissipating plate 6, however, it is not possible to mount the semiconductor chip 2 over the bending part 9a, and the semiconductor chip 2 is bonded to the member 9 and the die pad 3, which are flat, other than the bending part 9a with the adhesive 8. Because of this, as also shown in FIG. 29 and FIG. 31, the semiconductor chip 2 is arranged over the member 9 and the die pad 3, which are flat, inside the bending part 9a (on the side nearer to the center of the die pad 3) so as not overlap the bending part 9a in a planar manner and is bonded to the member 9 and the die pad 3, which are flat, via the adhesive 8. Preferably, the bending part 9a is provided at a position as close as possible to the inner edge 6 of the heat dissipating plate 6 so that the upper limit of the plane dimensions of the semiconductor chip 2 that can be mounted is as great as possible.

Other configurations of the semiconductor device 1b in the present embodiment are the same as those of the semiconductor device 1a in the second embodiment, and therefore, their explanation is omitted here.

The closer the height position of the heat dissipating plate 6 to the height position of the inner lead part 4a, the more likely heat is conducted from the heat dissipating plate 6 to the inner lead part 4a, and if the height position of the heat dissipating plate 6 is the same as the height position of the inner lead part 4a, the outer edge 6d of the heat dissipating plate 6 and the tip end of the inner lead part 4a oppose each other by the shortest distance, and therefore, it is possible to conduct heat most efficiently from the heat dissipating plate 6 to the inner lead part 4a. In the present embodiment, by providing the bending part 9a between the heat dissipating plate 6 and the member 9, the height position of (the top surface 6a of) the heat dissipating plate 6 is made to be higher than the height position of (the top surface 3a of) the die pad 3 and the member 9, and thereby, it is possible to make the height position of the heat dissipating plate 6 close to the height position of the inner lead part 4a and preferably, it is possible to make the height position (of the top surface 6a) of the heat dissipating plate 6 equal to the height position of (the top surface 4c of) the inner lead 4a. Consequently, it is possible to efficiently conduct heat from the heat dissipating plate 6 to the inner lead part 4a, and therefore, it is possible to efficiently conduct heat produced in the semiconductor chip 2 from the heat dissipating plate 6 to the inner lead part 4a via the die pad 3, the member 9, and the heat dissipating plate 6, and the heat dissipation characteristics through the second heat dissipation path (heat dissipation path shown by the arrow H2 in FIG. 8) can be improved further. Because of this, it is possible to further improve the heat dissipation characteristics of the semiconductor device 1b.

In the present embodiment, it is possible to make the height position of (the top surface 6a of) the heat dissipating plate 6 equal to a height position between the back surface 2b of the semiconductor chip 2 and the top surface 2a of the semiconductor chip 2 by the bending part 9a. As a result, the heat dissipating plate 6 enters a state of opposing the side surface of the semiconductor chip 2, and therefore, it is possible to conduct heat in the semiconductor chip 2 from the side surface of the semiconductor chip 2 to the heat dissipating plate 6 via the sealing resin part 7 between the side surface of the semiconductor chip 2 and the heat dissipating plate 6, in addition to the path through which heat is conducted from the back surface 2b of the semiconductor chip 2 to the heat dissipating plate 6 via the adhesive 8, the die pad 3, and the member 9. Consequently, it is possible to more efficiently conduct heat in the semiconductor chip 2 to the heat dissipating plate 6, and the heat dissipation characteristics of the semiconductor device 1b can be further improved.

In the present embodiment, the heat dissipating plate 6, which occupies a comparatively large area, is located in the vicinity of the center in the thickness direction of the sealing resin part 7, and therefore, the thickness of the sealing resin part 7 is substantially the same at the top part of the heat dissipating plate 6 and at the bottom part of the heat dissipating plate 6, thereby it becomes possible to more appropriately suppress the warp of the semiconductor device 1b when subjected to the change in temperature.

On the other hand, as in the second embodiment, when the height position of the heat dissipating plate 6 is made equal to the height position of the die pad 3 by providing the bending part 10a to the suspension lead 10, it is possible to make flat the position of the member 9, where the bending part 9a is provided, and therefore, it is possible to increase the maximum dimensions of the semiconductor chip 2 that can be mounted.

The present embodiment can be applied to any of the first to fourth embodiments and sixth to ninth embodiments, to be described later.

Sixth Embodiment

In the present embodiment, a method of manufacturing the semiconductor device 1a in the second embodiment is explained. It is also possible to manufacture the semiconductor device in the first, third to fifth embodiments, and in seventh to ninth embodiments, to be described later, in substantially the same manner as that of the semiconductor device 1a in the second embodiment, and therefore, a manufacturing step of the semiconductor device 1a in the second embodiment is explained here as a typical example with reference to the drawings.

Figure 33:
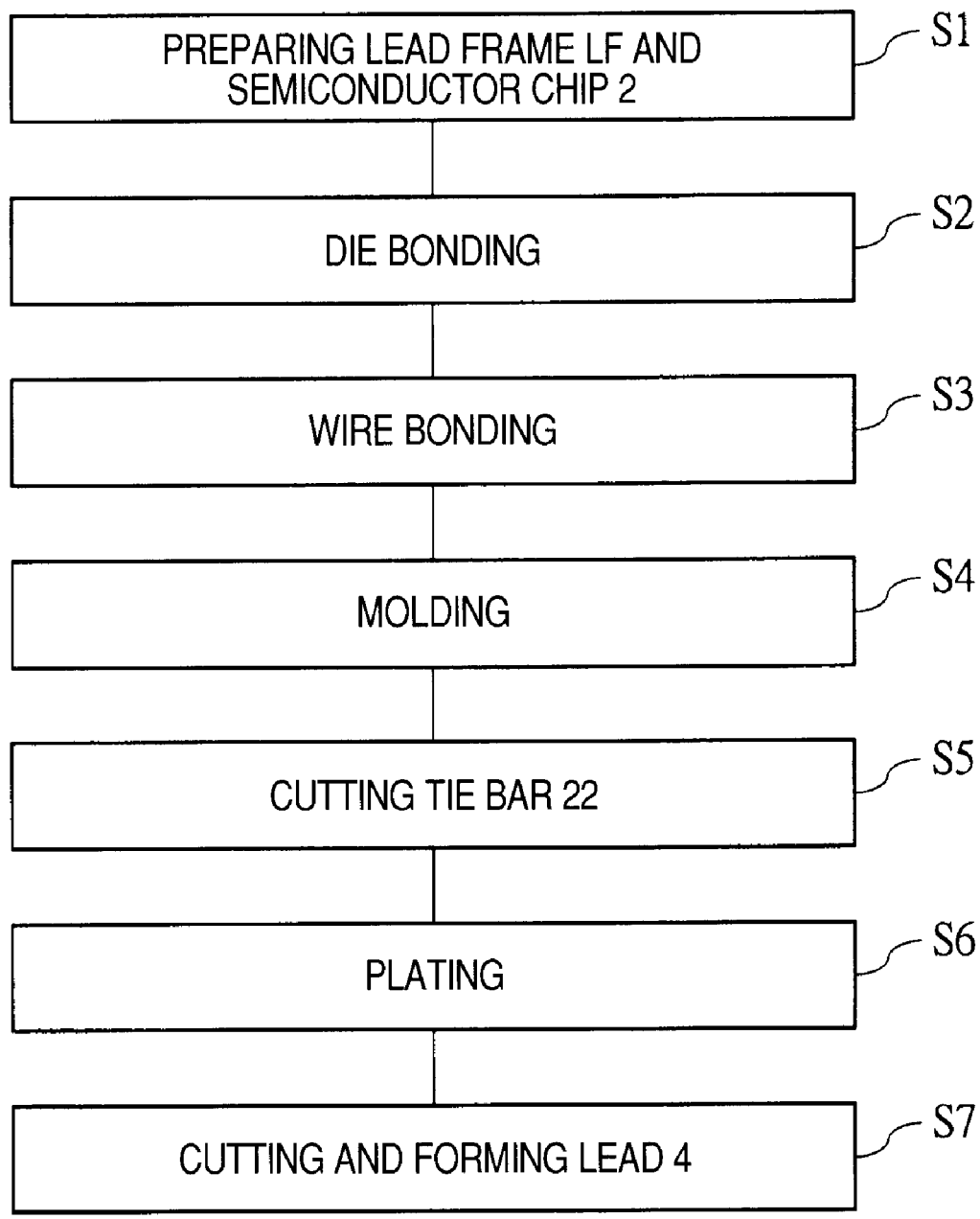
FIG. 33 is a manufacturing process flowchart showing manufacturing steps of the semiconductor device in the second embodiment of the present invention.
Figure 34:
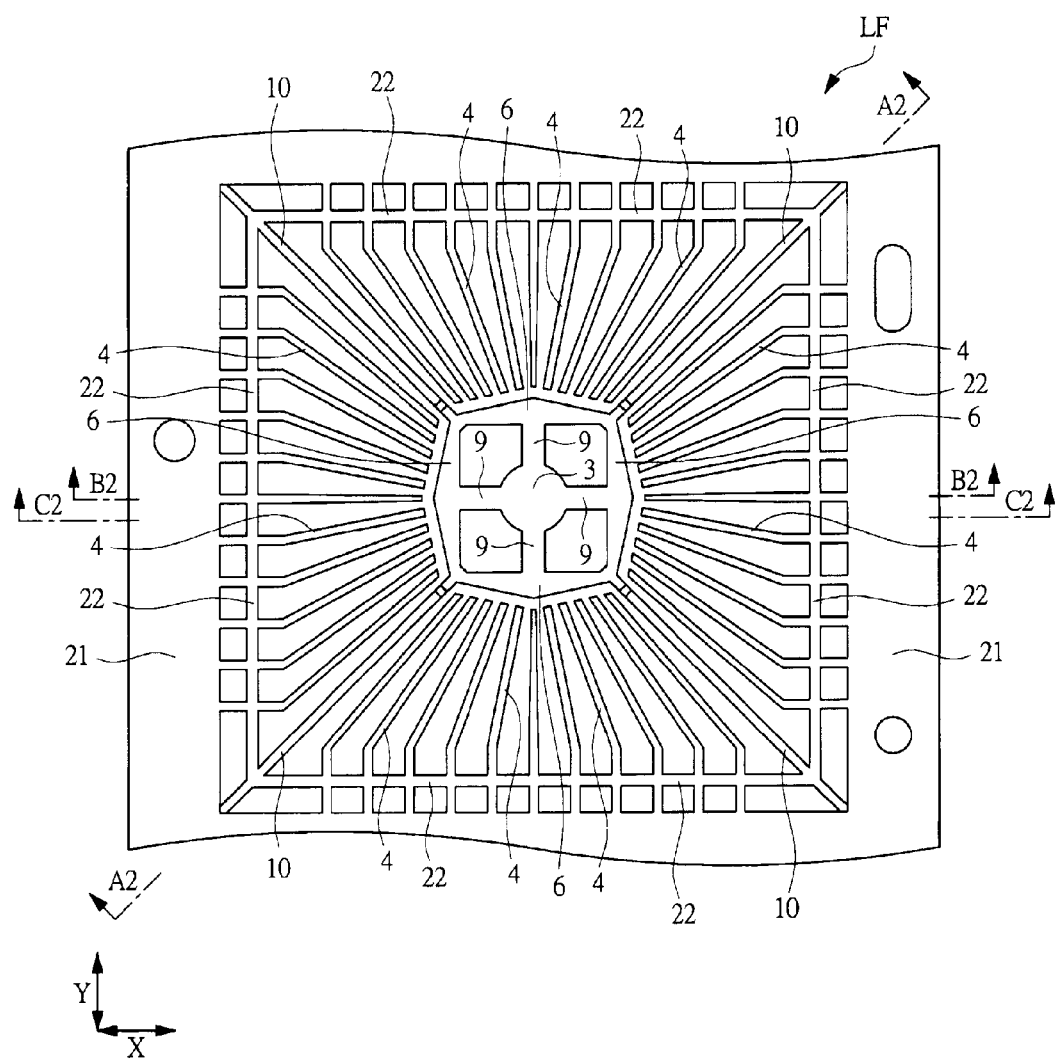
FIG. 34 is a plan view of a lead frame used to manufacture the semiconductor device in the second embodiment of the present invention.

FIG. 33 is manufacturing process flow diagram showing a manufacturing step of the semiconductor device 1a. FIG. 34 is a plan view (top view) of a lead frame LF used in manufacturing the semiconductor device 1a, and FIG. 35 and FIG. 36 are each a section view of essential parts of the lead frame LF.

FIG. 34 shows a region (region from which one semiconductor device 1a is manufactured) corresponding to one semiconductor package of the lead frame LF. In reality, the lead frame LF is a multiple lead frame, in which a plurality of unit structures shown in FIG. 34 is linked (repeated) in the Y direction shown in FIG. 34, or a matrix lead frame, in which a plurality of unit structures is linked (repeated) both in the X direction and in the Y direction, respectively. In FIG. 34, the positions corresponding to the A2-A2 line, the B2-B2 line, and the C2-C2 line in FIG. 18 are assigned the A2-A2 line, the B2-B2 line, and the C2-C2 line, and the section of the lead frame LF along the B2-B2 line in FIG. 34 substantially corresponds to FIG. 35 and the section of the lead frame LF along the C2-C2 line in FIG. 34 substantially corresponds to FIG. 36. Because of this, the section view in FIG. 35 is a section view at the corresponding sectional position in FIG. 22 (along the B2-B2 line) and the section view in FIG. 36 is a section view at the corresponding sectional position in FIG. 23 (along the C2-C2 line).

In order to manufacture the semiconductor device 1a, first, the lead frame LF and the semiconductor chip 2 are prepared (step S1 in FIG. 33).

Figure 35:
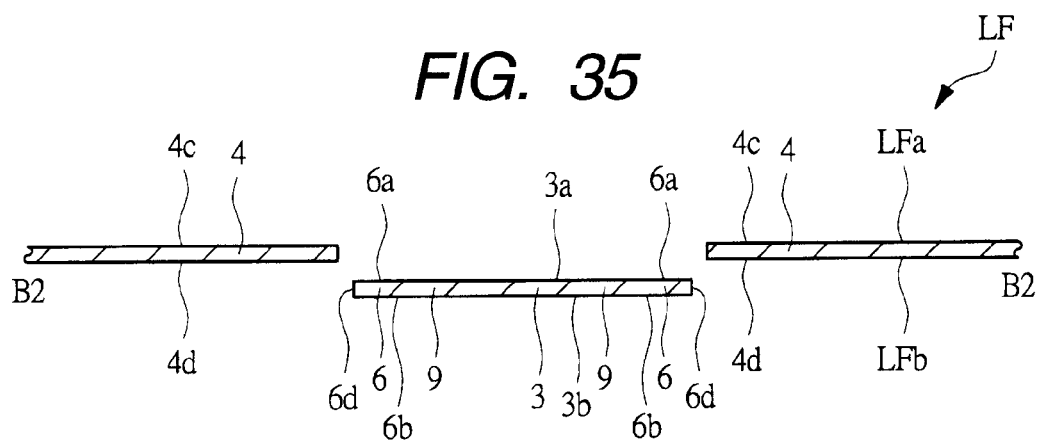
FIG. 35 is a section view of the lead frame in FIG. 34.
Figure 36:
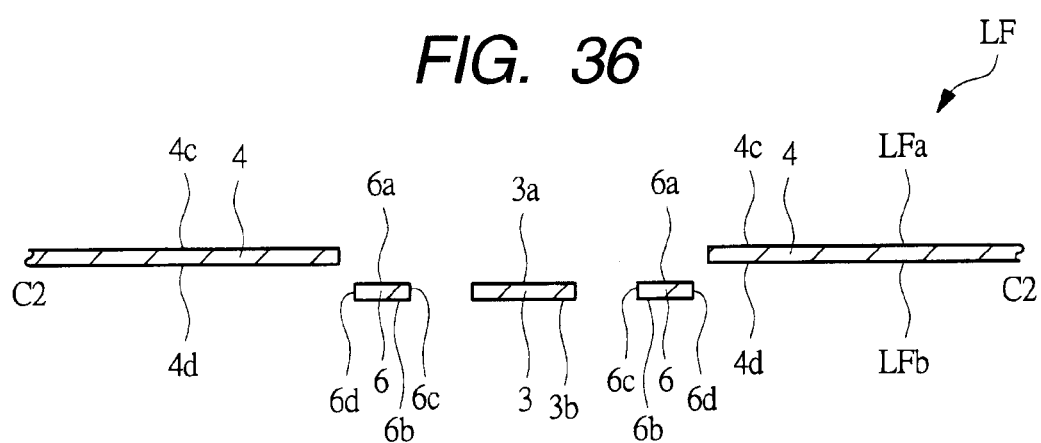
FIG. 36 is a section view of the lead frame in FIG. 34.

The lead frame LF shown in FIG. 34 to FIG. 36 is made of a conductor material (preferably, metal material), for example, a metal material containing copper or copper alloy as its principal component.

The lead frame LF has a frame 21, the leads 4 linked to the frame 21, the heat dissipating plate 6 linked to the frame 21 via the suspension leads 10 (four, here), and the die pad 3 linked to the heat dissipating plate 6 via the members 9 (four, here) in the form of integration. Further, the lead frame 21 has a tie bar (dam bar, link part) 22 that links the leads 4 and the suspension leads 10 in the form of integration and (the outer lead parts 4b of) the neighboring leads 4 are linked by the tie bar 22. It is possible to form the lead frame LF by, for example, processing a metal plate. The shapes and positional relationship of the die pad 3, the member 9, the heat dissipating plate 6, the lead 4, and the suspension lead 10 in the part located in the sealing resin part 7, to be formed later, are the same as those of the semiconductor device after manufactured, and are already explained, and therefore, their explanation is omitted here.

It is possible to prepare the semiconductor chip 2 by, for example, after forming various semiconductor elements or semiconductor integrated circuits on the main surface of a semiconductor substrate (semiconductor wafer) including single crystal silicon etc., separating the semiconductor substrate into individual semiconductor chips by dicing etc.

In step S1, it may also be possible to prepare the semiconductor chip 2 after preparing the lead frame LF, or to prepare the lead frame LF after preparing the semiconductor chip 2, or to prepare the lead frame LF and the semiconductor chip 2 simultaneously.

Next, by performing the die bonding step, the semiconductor chip 2 is mounted and bonded over the die pad 3 and the member 9 of the lead frame LF with the adhesive 8 (step S2 in FIG. 33). The die bonding step in step S2 is explained below.

Figure 37:
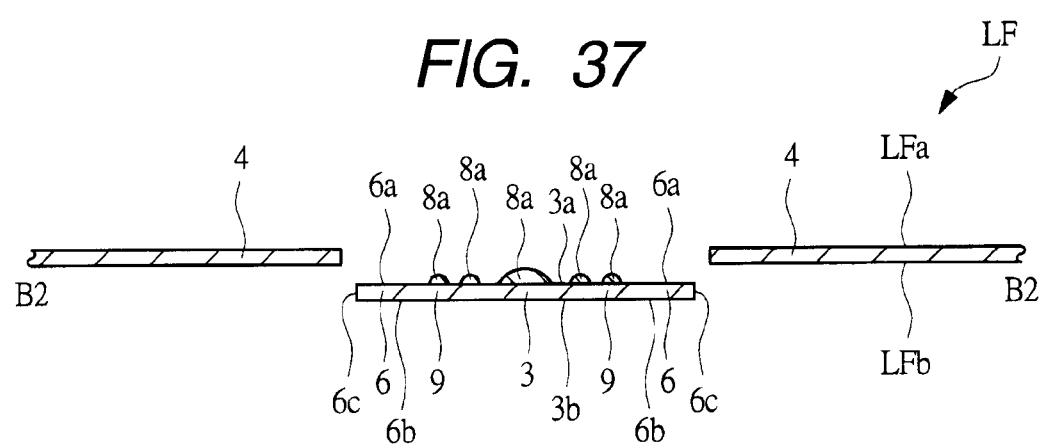
FIG. 37 is a section view during a manufacturing step of the semiconductor device in the second embodiment of the present invention.
Figure 38:
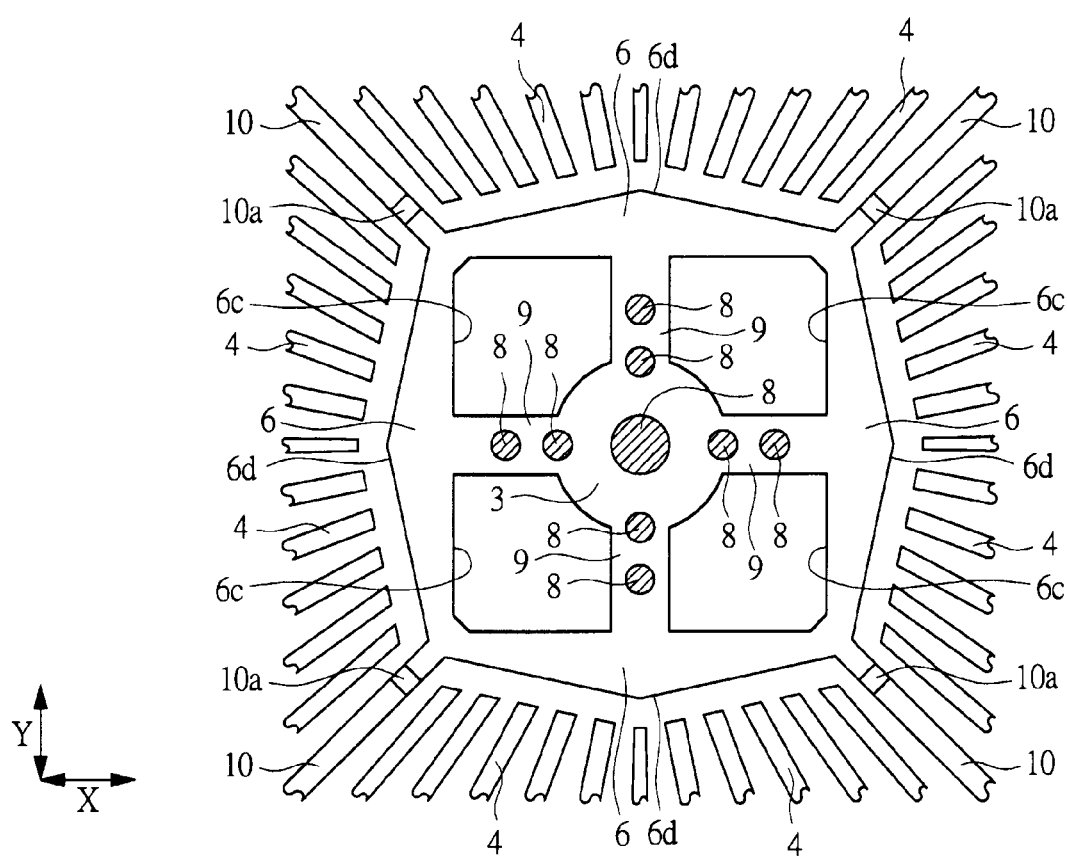
FIG. 38 is a plan view of essential parts during the manufacturing step of the semiconductor device, similar to FIG. 37.
Figure 39:
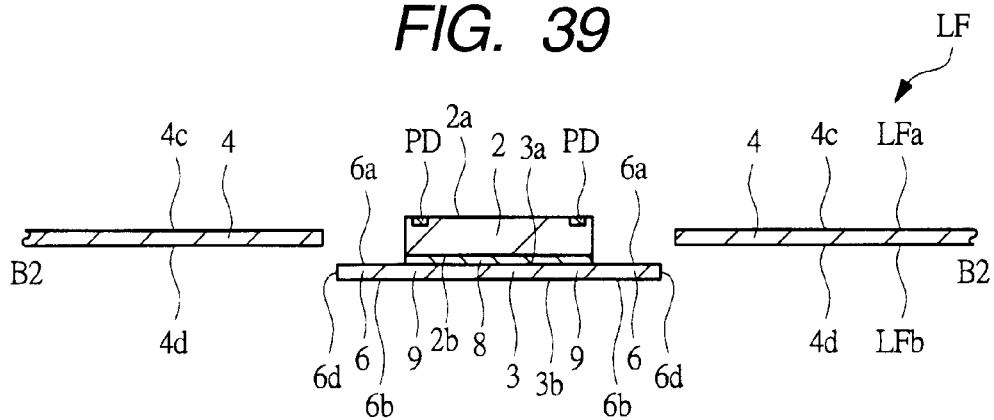
FIG. 39 is a section view during the manufacturing step of the semiconductor device, following FIG. 37.

FIG. 37 to FIG. 41 are each a section view of essential parts (FIG. 37, FIG. 39, and FIG. 40) or a plan view of essential parts (FIG. 38 and FIG. 41) showing the die bonding step in step S2. In FIG. 37 and FIG. 39, a section view of a region corresponding to FIG. 35 (that is, the section along the B2-B2 line) is shown, in FIG. 40, a section view of a region corresponding to FIG. 36 (that is, the section along the C2-C2 line) is shown, and in FIG. 38 and FIG. 41, a plan view of a region corresponding to FIG. 20 is shown. The section view in FIG. 37 and the plan view in FIG. 38 correspond to the same step stage and the section view in FIG. 39 and FIG. 40 and the plan view in FIG. 41 correspond to the same step stage.

In the die bonding step in step S2, first, as shown in FIG. 37 and FIG. 38, over the top surface 3a of the die pad 3 and the member 9 of the lead frame LF, an adhesive (die bond material) 8a is applied (arranged). The adhesive 8a will cure to be the adhesive 8 later. Although FIG. 38 is a plan view, the adhesive 8a is hatched to make the drawing easier-to-see.

As described above, in order to improve the heat dissipation characteristics, it is important to bond the entire surface of the part of the back surface 2b of the semiconductor chip 2, which is in opposition to the die pad 3 and the member 9, to the die pad 3 and the member 9 with the adhesive 8. Because of this, as shown in FIG. 37 and FIG. 38, it is preferable to apply (arrange) the adhesive 8a at a plurality of positions on the top surface 3a of the die pad 3 and the member 9. Further, it is preferable to apply (arrange) the adhesive 8a over the part of the top surface 3a of the member 9, which is in opposition to the back surface 2b of the semiconductor chip 2 to be mounted later, not only over the top surface 3a of the die pad 3. As a result, it becomes more likely for the adhesive 8a to spread over the entire part in opposition to the back surface 2b of the semiconductor chip 2 when mounting the semiconductor chip 2. In the step of applying (arranging) the adhesive 8a, it may be possible to apply (arrange) the adhesive 8a at a plurality of positions using one nozzle (an application device with one nozzle) or apply (arrange) the adhesive 8a at a plurality of positions using a multipoint nozzle (an application device with multiple nozzles). It is possible to shorten the time required for applying the adhesive 8a using the multipoint nozzle than when using a single point nozzle.

If the width W1 of the member 9 is reduced to the minimum dimension (for example, about 1 mm) with which the application of the adhesive 8a over the member 9 is possible, it becomes possible to apply the adhesive 8a over the member 9 and at the same time, to increase the adhesion area between the back surface 2b of the semiconductor chip 2 and the sealing resin part 7, and therefore, the reliability (solder reflow resistance) of the semiconductor device can be improved.

Figure 40:
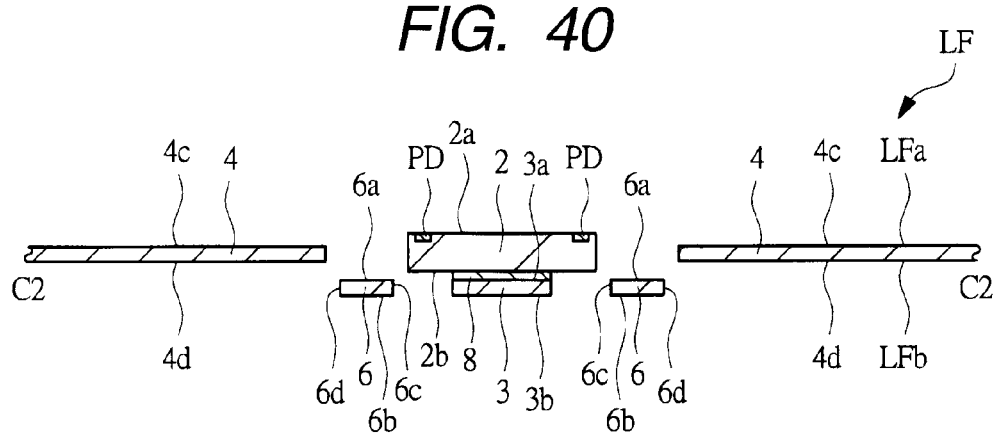
FIG. 40 is a section view during the manufacturing step of the semiconductor device, similar to FIG. 39.
Figure 41:
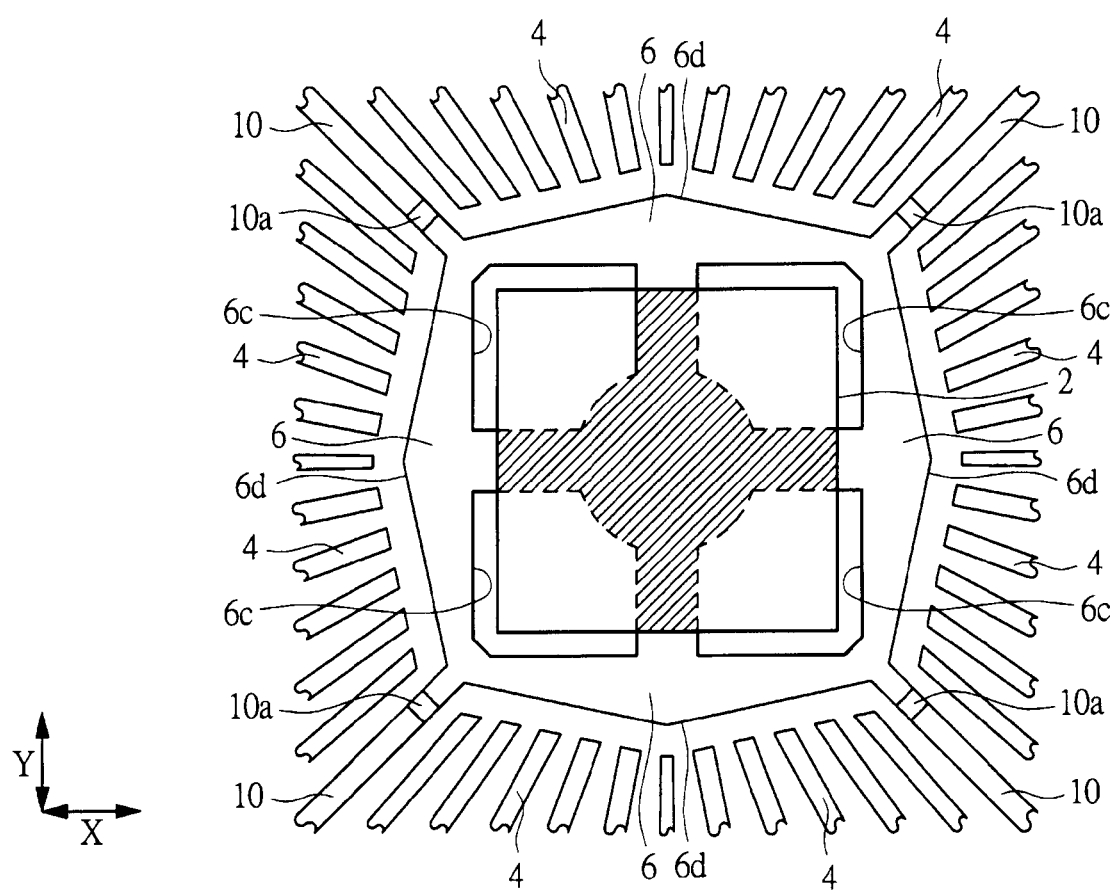
FIG. 41 is a plan view of essential parts during the manufacturing step of the semiconductor device, similar to FIG. 39.

After applying the adhesive 8a over the top surface 3a of the die pad 3 and the member 9 of the lead frame LF, the semiconductor chip 2 is arranged (mounted) over the top surface 3a of the die pad 3 and the member 9 as shown in FIG. 39 to FIG. 41. At this time, the semiconductor chip 2 is arranged (mounted) over the top surface 3a of the die pad 3 and the member 9 via the adhesive 8a so that the back surface 2b of the semiconductor chip 2 opposes the top surface 3a of the die pad 3 and the member 9, and a load is applied to the semiconductor chip 2 to press the semiconductor chip 2 against the die pad 3 and the member 9. As a result, the adhesive 8a is spread (in a wetted manner) over the entire surface of the part where the top surface 3a of the die pad 3 and the member 9 and the back surface 2b of the semiconductor chip 2 are in opposition to each other. Then, by performing curing processing for curing the adhesive 8a (for example, thermal processing for curing), the adhesive 8a cures into the adhesive 8 and the semiconductor chip 2 is fixed on the die pad 3 and the member 9 with the adhesive 8. For easier understanding, in the plan view of FIG. 41, the position of the die pad 3 and the member 9 located under the semiconductor chip 2 is shown by a dotted line and the region in which the adhesive 8 (that is, the adhesive 8a spread in a wetted manner) is arranged (applied) is hatched by slashes, however, in reality, the adhesive 8 (adhesive 8a) is hidden under the semiconductor chip 2 and not seen.

As described above, the die pad 3 is located in the center of the region surrounded by the heat dissipating plate 6 in the form of a frame and the die bonding step in step S2 is performed so that the center part of the back surface 2b of the semiconductor chip 2 is located immediately over the die pad 3.

In this manner, it is possible to perform the die bonding step in step S2.

Figure 42:
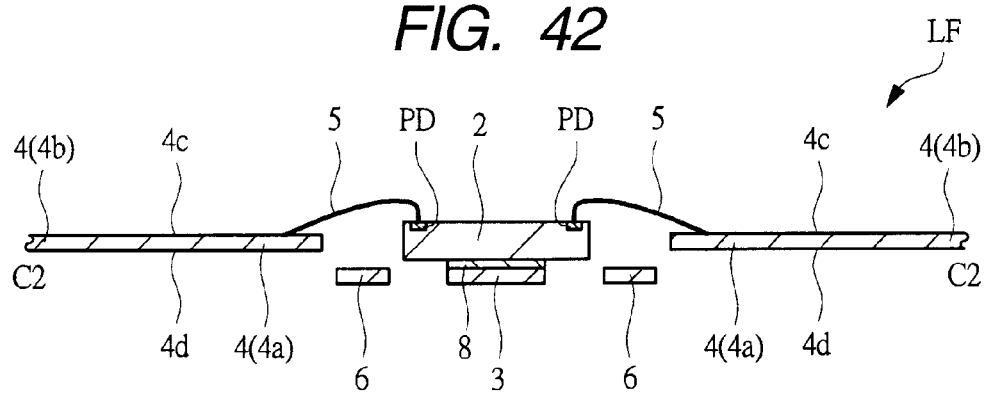
FIG. 42 is a section view during the manufacturing step of the semiconductor device, following FIG. 39.

By performing the wire bonding step after performing die bonding in step S2, the electrodes PD of the semiconductor chip 2 and (the top surface 4c of the inner lead part 4a of) the leads 4 of a lead frame LD are electrically coupled respectively via the bonding wires 5 as shown in FIG. 42 (step S3 in FIG. 33). FIG. 42 is a section view in the stage where the wire bonding step in step S3 is performed and shows a section view of the region corresponding to FIG. 36 and FIG. 40 (that is, the section along the C2-C2 line). The wire bonding process in step S3 is explained later in detail.

Figure 43:
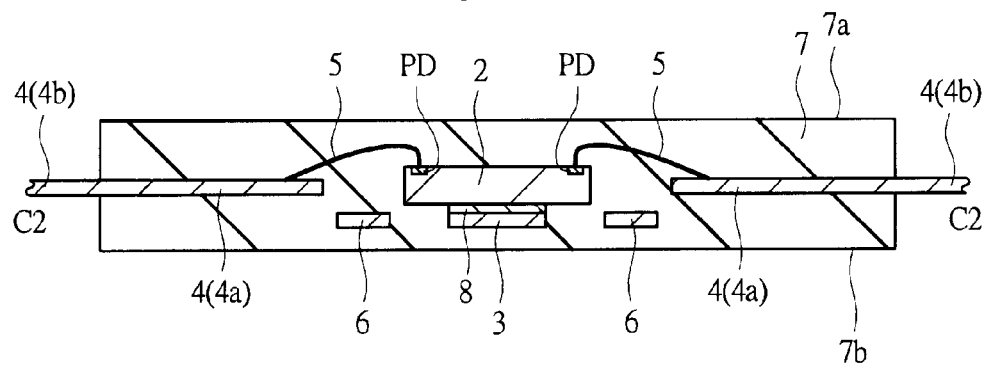
FIG. 43 is a section view during the manufacturing step of the semiconductor device, following FIG. 42.

After performing the wire bonding in step S3, resin sealing by the molding step (resin forming step, for example, transfer molding step) is performed and as shown in FIG. 43, the semiconductor chip 2 and the bonding wires 5 coupled thereto are sealed by the sealing resin part 7 (step S4 in FIG. 33). At this time, the inner lead part 4a of the lead part 4, the die pad 3, the heat dissipating plate 6, the member 9, and the suspension lead 10 are also sealed by the sealing resin part 7. Here, FIG. 43 is a section view in the stage where the molding step in step S4 is performed and shows a section view of the region corresponding to FIG. 36, FIG. 40, and FIG. 42 (that is the section along the C2-C2 line).

By the molding step in step S4, the sealing resin part 7 is formed, which seals the semiconductor chip 2, the die pad 3, the inner lead part 4a of the lead parts 4, the bonding wires 5, the heat dissipating plate 6, the members 9 (four, here), and the suspension leads 10 (four, here). The sealing resin part 7 includes a resin material, such as, for example, a thermosetting resin material, and may also include a filler etc.

In each lead part 4, the inner lead part 4a is sealed in the sealing resin part 7 and not exposed but the outer lead part 4b of each lead part 4 is located outside the sealing resin part 7 and exposed. Part of the suspension lead 10 is also located outside the sealing resin part 7 and exposed.

After the adhesive 8a is cured in the die bonding step in step S2 and until the sealing resin part 7 is formed in the molding step in step S4, at least part of the back surface 2b of the semiconductor chip 2 is in opposition to neither die pad 3 nor the member 9 and is exposed. Because of this, when the sealing resin part 7 is formed in the molding step in step S4, the sealing resin part 7 is bonded to the part of the back surface 2b of the semiconductor chip 2, which is in opposition to neither the die pad 3 nor the member 9 and is exposed, as a result.

Next, the tie bar 22 of the lead frame LF is cut (step S5 in FIG. 33). Before the tie bar 22 is cut in step S5, the outer lead parts 4b of the neighboring leads 4 are linked to each other by the tie bar 22. The tie bar 22 has a function to prevent the inner lead parts 4a of the leads 4 from coming into contact with each other to short-circuit and a function to prevent resin from flowing out when forming the sealing resin part 7, however, in the manufactured semiconductor device, it is necessary for the leads 4 to be electrically separated from each another, and therefore, the tie bar 22 that links the outer lead parts 4b of the leads 4 located outside the sealing resin part 7 is cut in step S5. By performing the cutting step of the tie bar 22 in step S5, the neighboring leads 4 enter a separated state.

Next, plating processing is performed for the outer lead part 4b of the lead 4 exposed from the sealing resin part 7 (step S6 in FIG. 33). As a result, it is made easier to join the outer lead part 4b of the lead 4 of the semiconductor device 1b and the terminal TE of the packaging substrate PWB via solder when packaging (solder-packaging) the semiconductor device 1b on the packaging substrate PWB etc.

Figure 44:
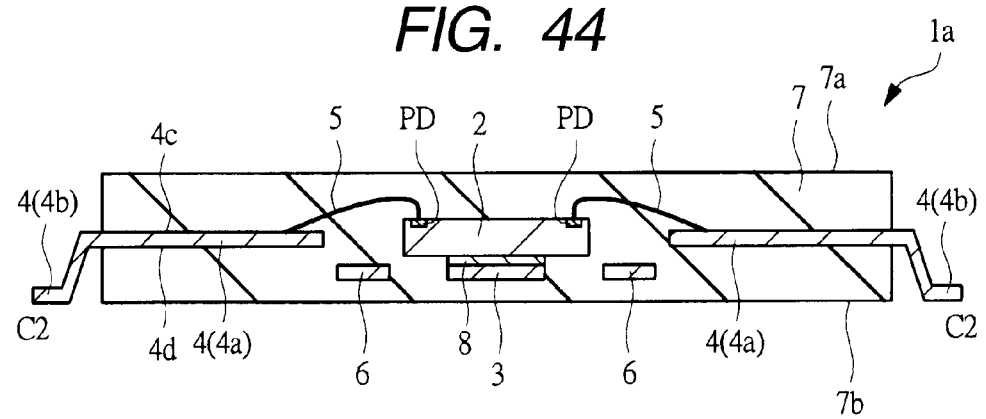
FIG. 44 is a section view during the manufacturing step of the semiconductor device, following FIG. 43.

Next, outside the sealing resin part 7, after the lead 4 is cut at a predetermined position, the outer lead part 4b of the lead 4, which projects from the sealing resin part 7, is bent (lead processing, lead formation) (step S7 in FIG. 33). FIG. 44 is a section view in the stage where the cutting and the forming step of the lead 4 in step S7 are performed, showing a section view of a region corresponding to FIG. 36, FIG. 40, FIG. 42, and FIG. 43 (that is, the section along the C2-C2 line).

In step S7, first by performing the cutting step of the lead 4, the lead 4 is separated from (the frame 21 of) the lead frame LF and a state is brought about where the outer lead part 4b of the lead 4 projects from the side surface of the sealing resin part 7. That is, the lead 4 is cut so that the outer lead part 4b with a predetermined length is left on the side of the semiconductor device 1. In the cutting step of the lead 4 in step S7, not only the lead 4 is cut but also the suspension lead 10 of the part projecting from the sealing resin part 7 is also cut. The suspension lead 10 is cut so that the suspension lead 10 does not project from the side surface of the sealing resin part 7 after the cutting. Because of this, the cut surface of the suspension lead 10 is exposed at the side surface of the sealing resin part 7.

In step S7, after the cutting step of the lead 4, the outer lead part 4b of the lead 4 projecting from the heat dissipating plate 6a is bent as shown in FIG. 44. As a result, the semiconductor device 1b divided into pieces is obtained (manufactured).

FIG. 45 to FIG. 52 are each an explanatory diagram of the wire bonding step in step S3. It is desirable to securely hold the semiconductor chip 2 in the wire bonding step so as to prevent ultrasonic waves from being emitted from the wire bonder. In the following, a technique is explained, which is for stably holding the semiconductor chip 2 in accordance with the magnitude of the plane dimensions of the semiconductor chip 2 in the wire bonding step in step S3.

Figure 45:
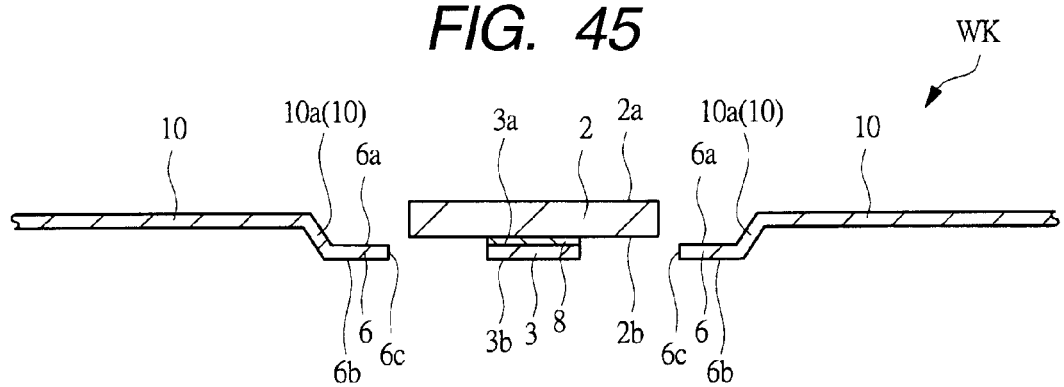
FIG. 45 is an explanatory diagram of a wire bonding step.
Figure 46:
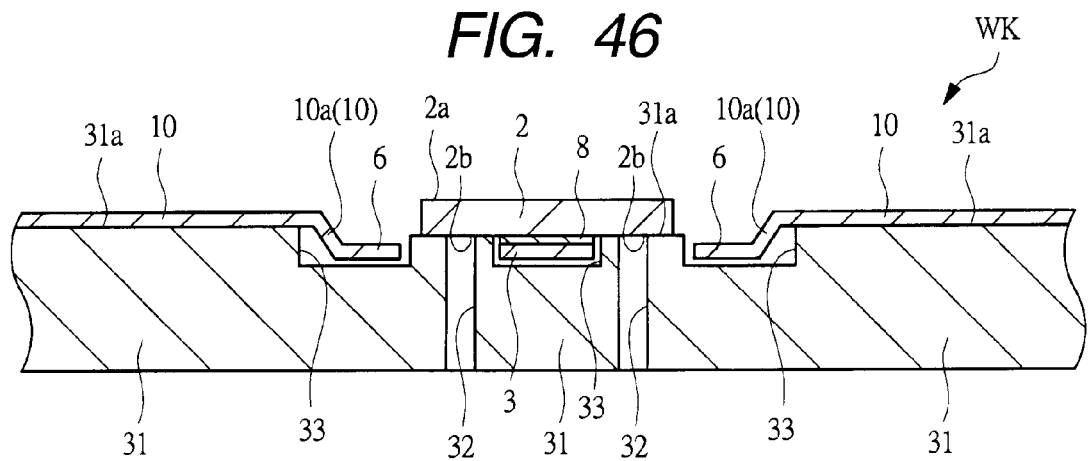
FIG. 46 is an explanatory diagram of the wire bonding step.
Figure 47:
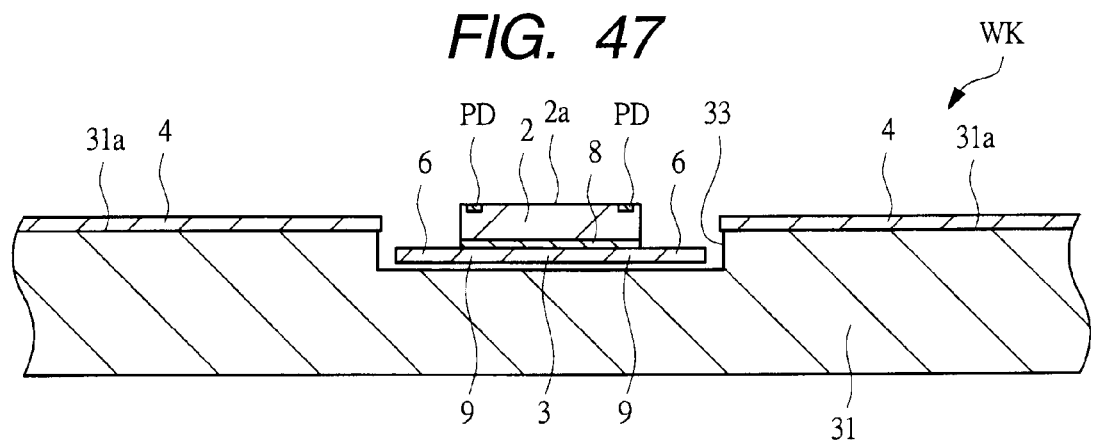
FIG. 47 is an explanatory diagram of the wire bonding step.
Figure 48:
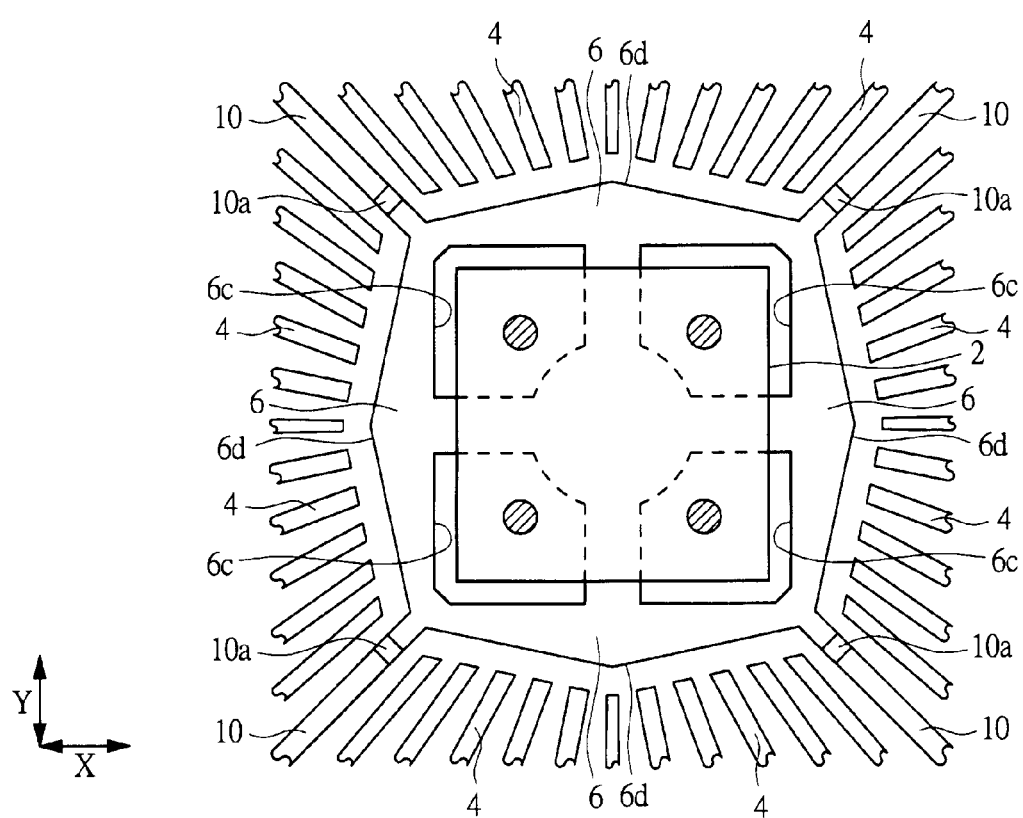
FIG. 48 is an explanatory diagram of the wire bonding step.

FIG. 46 to FIG. 48 of FIG. 45 to FIG. 52 show a technique suitable when applied to the case where the plane dimensions of the semiconductor chip 2 are large, and in the following, this technique is referred to as a first holding method, and the first holding method is explained.

FIG. 45 shows the lead frame LF in which the semiconductor chip 2 is mounted over the die pad 3 and the member 9 (hereinafter, referred to as a work WK) after the steps up to the die bonding step in step S2 are performed. FIG. 45 corresponds to the section at the position of the A2-A2 line in FIG. 34. FIG. 46 and FIG. 47 show a state where the work WK (the work WK in FIG. 45) is arranged on a stage 31 for wire bonding in the wire bonding step in step S3. FIG. 46 shows a section view corresponding to FIG. 45 (that is, the section along the A2-A2 line) and FIG. 47 shows a section view corresponding to FIG. 39 (that is, the section along the B2-B2 line). FIG. 48 shows a planar region corresponding to FIG. 41, showing the position of the die pad 3 and the member 9 located under the semiconductor chip 2 by a dotted line, and in FIG. 48, the planar position where it is attracted by an attracting hole part 32, to be described later, is hatched for easier understanding, however, in reality, the back surface 2b of the semiconductor chip 2 is attracted, and therefore, the attracted part is hidden under the semiconductor chip 2 and not seen.

In the first holding method shown in FIG. 46 to FIG. 48, the back surface 2b of the semiconductor chip 2 is attracted (vacuum attracted). To explain specifically, the part of the back surface 2b of the semiconductor chip 2, which is in opposition to the die pad 3 and the member 9, cannot be attracted, however, the part in opposition to neither the die pad 3 nor the member 9 (that is, the part located over the opening 13) is exposed, and therefore, can be attracted. Because of this, as shown in FIG. 46 and FIG. 47, a recess (recess part, groove part) 33 that can accommodate the die pad 3, the member 9, and the heat dissipating plate 6 is provided on a top surface 31a of the stage 31 and when arranging the work WK over the stage 31, the die pad 3, the member 9, and the heat dissipating plate 6 are accommodated in the recess 33. As a result, it is possible to make the back surface 2b of the semiconductor chip 2 (the part exposed from the opening 13) come into contact with (the attracting hole part 32 provided on) the top surface 31a of the stage 31. If the attracting hole part (attraction hole for vacuum attraction) 32 is arranged at a part of the contact surface of the back surface 2b of the semiconductor chip 2 (part exposed from the opening 13) and the top surface 31a of the stage 31, it is possible to attract (vacuum attract) the back surface 2b of the semiconductor chip 2 from the attracting hole part 32 by vacuum suction, and therefore, to hold the semiconductor chip 2.

That is, the wire bonding step in step S3 is performed while vacuum attracting the exposed part (that is, the part exposed from the opening 13) of the back surface 2b of the semiconductor chip 2, which is in opposition to neither the die pad 3 nor the member 9. In order to stably hold the semiconductor chip 2, it is preferable to attract a plurality of parts of the back surface 2b of the semiconductor chip 2 by a plurality of the attracting hole parts 32. Because of this, as shown in FIG. 48, it is preferable to attract the respective parts (four parts in FIG. 48) exposed from the openings 13 by the attracting hole part 32. By attracting the parts (preferably, four parts) of the back surface 2b of the semiconductor chip 2 to fix the semiconductor chip 2, ultrasonic waves are prevented from being emitted at the time of wire boding, and therefore, it is possible to perform wire bonding stably.

In the first holding method, the die pad 3, the member 9, and the heat dissipating plate 6 are accommodated in the recess 33 of the stage 31, however, it is preferable for the bottom surface 3b of the die pad 3 and the member 9 and the bottom surface 6b of the heat dissipating plate 6 not to come into contact with the stage 31. That is, it is preferable for there to be a gap of a certain size between the bottom surfaces 3b, 6b of the die pad 3, the member 9, and the heat dissipating plate 6 and the bottom of the recess 33 of the stage 31. As a result, it is possible to absorb the warp and twist of the die pad 3, the member 9, and the heat dissipating plate 6, or variations in thickness of the adhesive 8, and therefore, it becomes possible to appropriately attract the back surface 2b of the semiconductor chip 2 by the attracting hole part 32.

Figure 49:
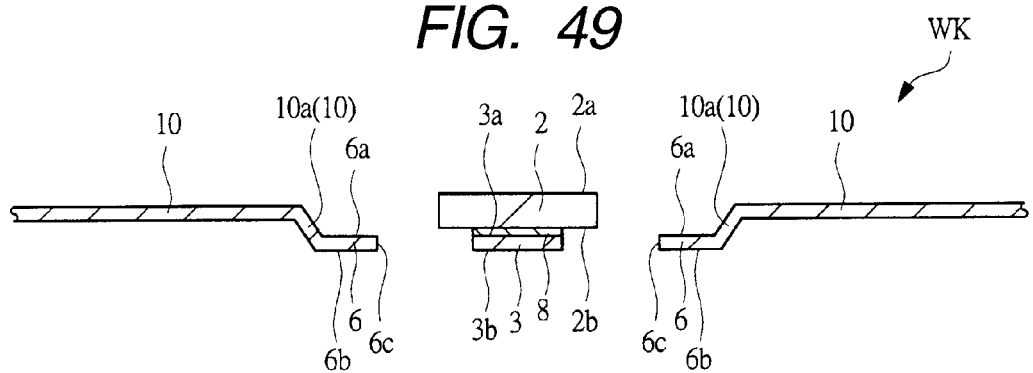
FIG. 49 is an explanatory diagram of the wire bonding step.
Figure 50:
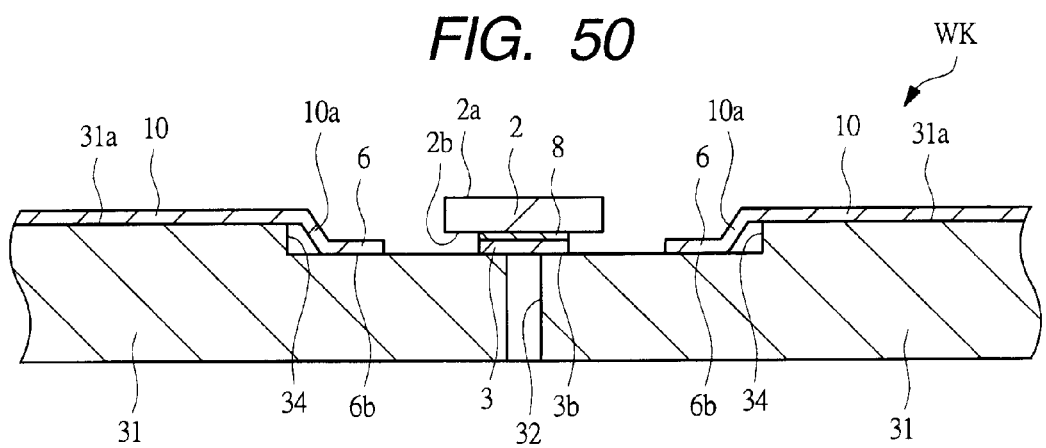
FIG. 50 is an explanatory diagram of the wire bonding step.
Figure 51:
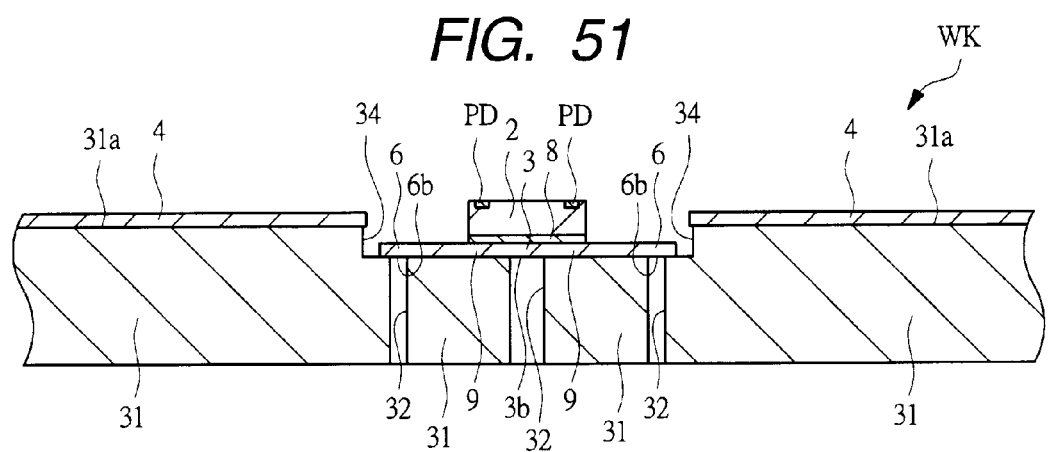
FIG. 51 is an explanatory diagram of the wire bonding step.
Figure 52:
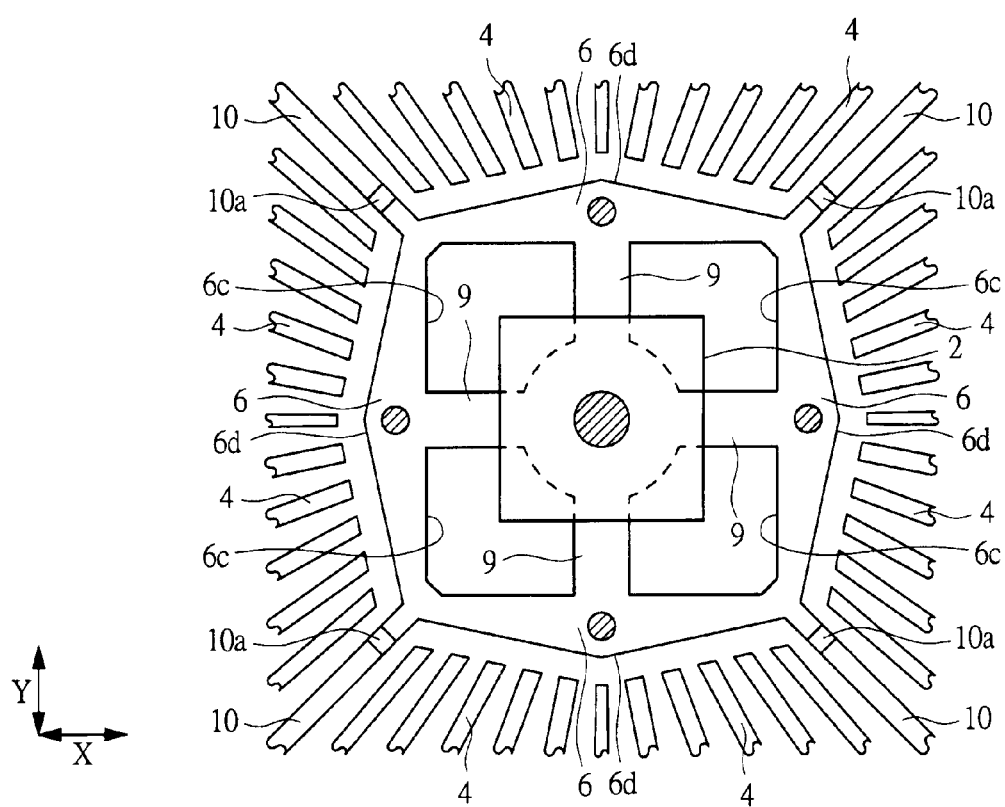
FIG. 52 is an explanatory diagram of the wire bonding step.

FIG. 50 to FIG. 52 of FIG. 45 to FIG. 52 show a technique suitable when applied to the case where the plane dimensions of the semiconductor chip 2 are small, and in the following it is referred to as a second holding method and the second holding method is explained.

FIG. 49 shows the lead frame LF in which the semiconductor chip 2 is mounted over the die pad 3 and the member 9 (hereinafter, referred to as the work WK) after the steps up to the die bonding step in step S2 are performed. Like FIG. 45, FIG. 49 corresponds to a section at the position of the A2-A2 line in FIG. 34, however, in the work WK, the dimensions of the semiconductor chip 2 mounted are smaller in FIG. 49 than those in FIG. 45. FIG. 50 and FIG. 51 show a state where the work WK (the work WK in FIG. 49) is arranged on the stage 31 for wire bonding in the wire bonding step in step S3. FIG. 50 shows a section view corresponding to FIG. 49 (that is, the section along the C2-C2 line) and FIG. 51 shows a section view corresponding to FIG. 39 (that is, the section along the B2-B2 line). FIG. 52 shows a planar region corresponding to FIG. 41, showing the position of the die pad 3 and the member 9 located under the semiconductor chip 2 by a dotted line, and in FIG. 48, the planar position where it is attracted by the attracting hole part 32, to be described later, is hatched by slashes for easier understanding, however, in reality, the bottom surface of the die pad 3 and the heat dissipating plate 6 is attracted, and therefore, the attracted part is hidden under the die pad 3 and the heat dissipating plate 6 and not seen.

When the plane dimensions of the semiconductor chip 2 are reduced, the area of the back surface 2b of the semiconductor chip 2, which is exposed from the opening 13, is reduced, and therefore, it becomes difficult to attract the back surface 2b of the semiconductor chip 2, while it is not by the first holding method. Because of this, in the second holding method shown in FIG. 50 to FIG. 52, the bottom surface 3b of the die pad 3 and the bottom surface 6b of the heat dissipating plate 6 are attracted (vacuum attracted).

Because of this, as shown in FIG. 50 and FIG. 51, a recess (recess part, groove part) 34 that can accommodate the die pad 3, the member 9, and the heat dissipating plate 6 is provided on the top surface 31a of the stage 31, and when arranging the work WK over the stage 31, the die pad 3, the member 9, and the heat dissipating plate 6 are accommodated in the recess 34 and the bottom surface 3b of the die pad 3 and the member 9 and the bottom surface 6b of the heat dissipating plate 6 are made to come into contact with the bottom of the recess 34. If the attracting hole part (attracting hole for vacuum attraction) 32 is arranged in a part of the contact surface of the bottom surfaces 3b, 6b of the die pad 3 and the heat dissipating plate 6 and the bottom of the recess 34, it is possible to attract (vacuum attract) the bottom surface 3b of the die pad 32 and the bottom surface 6b of the heat dissipating plate 6 from the attracting hole part 32 by vacuum suction. As a result, it is possible to hold the work WK and the semiconductor chip 2 bonded over the die pad 3 and the member 9. It is preferable to attract the bottom surface 3b of the die pad 3, however, if it is hard to attract the bottom surface 3b of the die pad 3, it may also be possible to attract the bottom surface 3b of the member 9 instead of the die pad 3, and it may also be possible to attract both the bottom surface 3b of the die pad 3 and the bottom surface 3b of the member 9. In order to hold the semiconductor chip 2 stably, it is important to attract also the bottom surface 6b of the heat dissipating plate 6 from the attracting hole part 32 in addition to at least one part of the bottom surface 3b of the die pad 3 and the member 9. That is, the wire bonding step in step S3 is performed while vacuum attracting the bottom surface of the chip mounting part including the die pad 3 and the member 9, and the bottom surface 6b of the heat dissipating plate 6.

Figure 53:
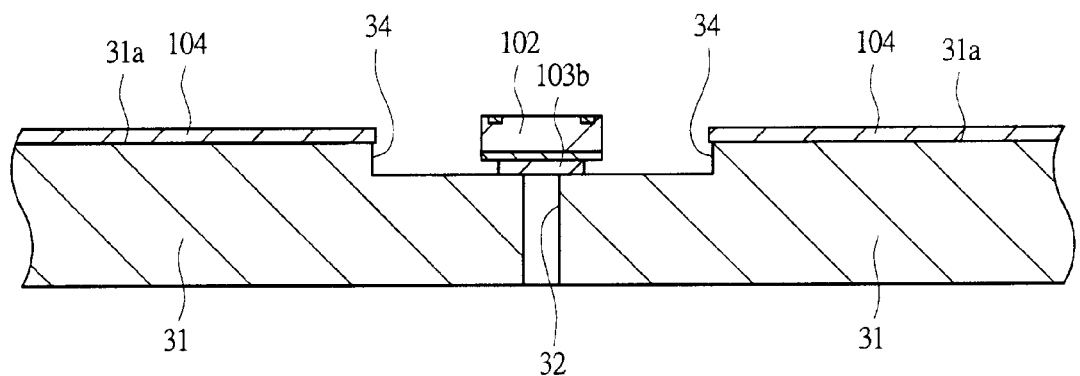
FIG. 53 is an explanatory diagram of a wire bonding step when the die pad in the second comparative example is applied.
Figure 54:
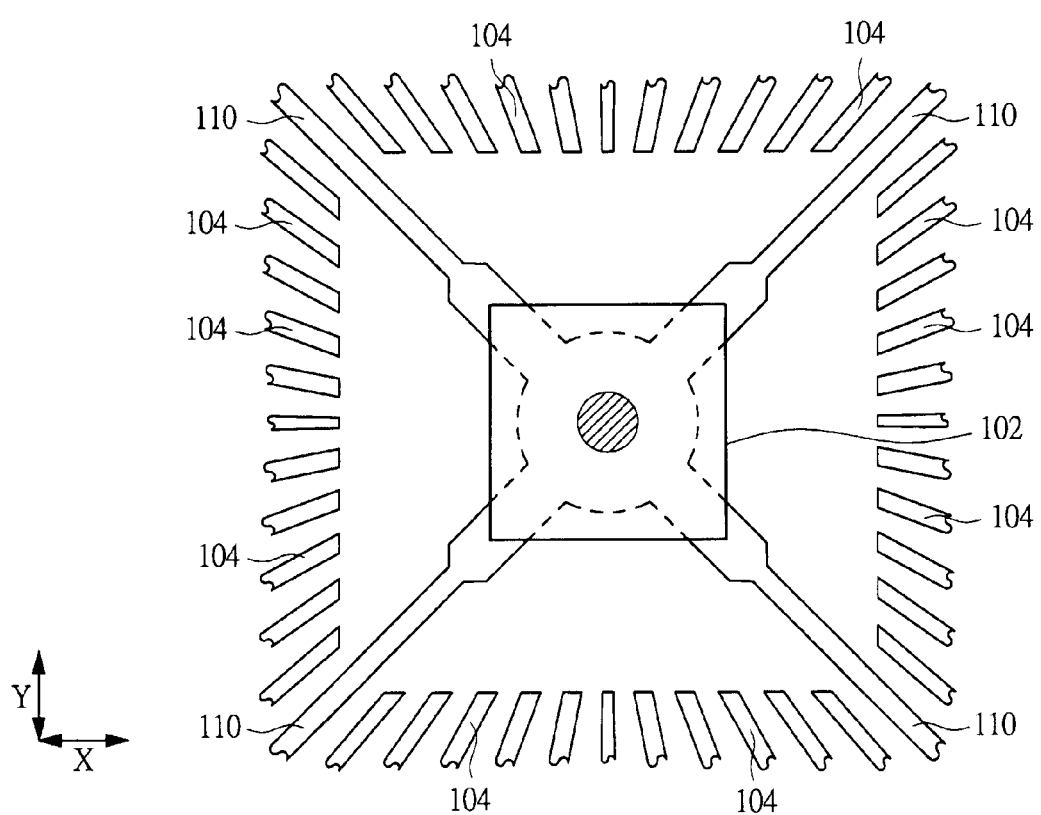
FIG. 54 is an explanatory diagram of the wire bonding step when the die pad in the second comparative example is applied.

FIG. 53 and FIG. 54 are each an explanatory diagram of the wire bonding step when the die pad 103b in the second comparative example in FIG. 2 is applied, corresponding to FIG. 51 and FIG. 52 in the present embodiment, respectively.

When the die pad 103b in the second comparative example is applied, if the plane dimensions of the semiconductor chip 2 to be mounted over the die pad 103b are reduced, it is not possible to attract the back surface of the semiconductor chip 102 but possible to attract only the bottom surface of the die pad 103b as shown in FIG. 53 and FIG. 54. Because of this, during the wire bonding, a θ rotation is caused by its vibrations and trouble becomes more likely to occur in the wire bonding.

In contrast to the above, in the second holding method, not only the bottom surface 3b of the die pad 3 but also the bottom surface 6b of the heat dissipating plate 6 is also attracted (vacuum attracted), and therefore, it is possible to stably hold and fix the work WK. In particular, it is preferable to attract (vacuum attract) the part where the width of the heat dissipating plate 6 is great (center part of each of the four sides of the heat dissipating plate 6) because it is easy to attract the heat dissipating plate 6. Further, if a plurality of parts of the bottom surface of the heat dissipating plate 6 is attracted (vacuum attracted), it is possible to hold the work WK more stably.

At the time of wire bonding, the heat dissipating plate 6 also plays a role to absorb heat from the stage 31, and therefore, compared to the case where the die pad 103b in the second comparative example, which has nothing corresponding to the heat dissipating plate 6, is applied, there is an advantage that the time required from when the work WK is set over the stage 31 to when the dimensions of each part of the work WK become stable is reduced. That is, it is possible to suppress a phenomenon that dimensions vary during wire bonding.

Next, a method of forming the lead frame LF, which is prepared in step S1 described above, is explained below.

It is possible to form the lead frame LF by a technique to etch a metal plate or a technique to press-work a metal plate. Here, a technique to form the lead frame LF by press-working a metal plate is explained. FIG. 55 to FIG. 58 are each an explanatory diagram of a technique to form the lead frame LF by press-working a metal plate 41.

Figure 55:
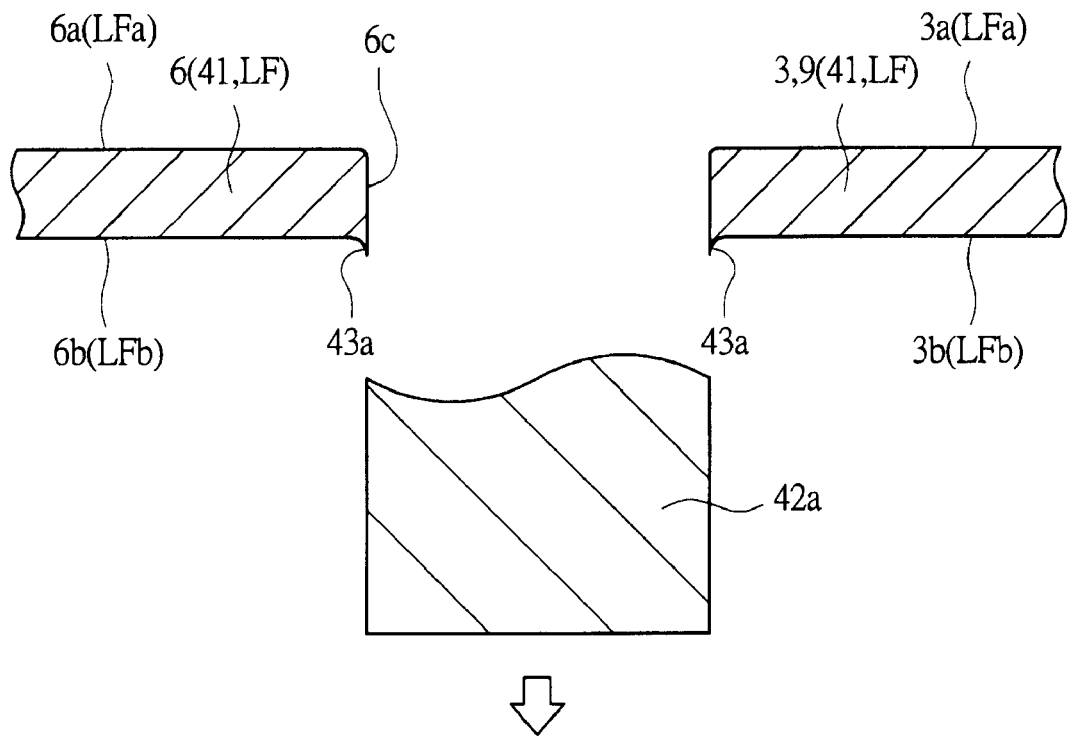
FIG. 55 is an explanatory diagram of a technique to form a lead frame.
Figure 57:
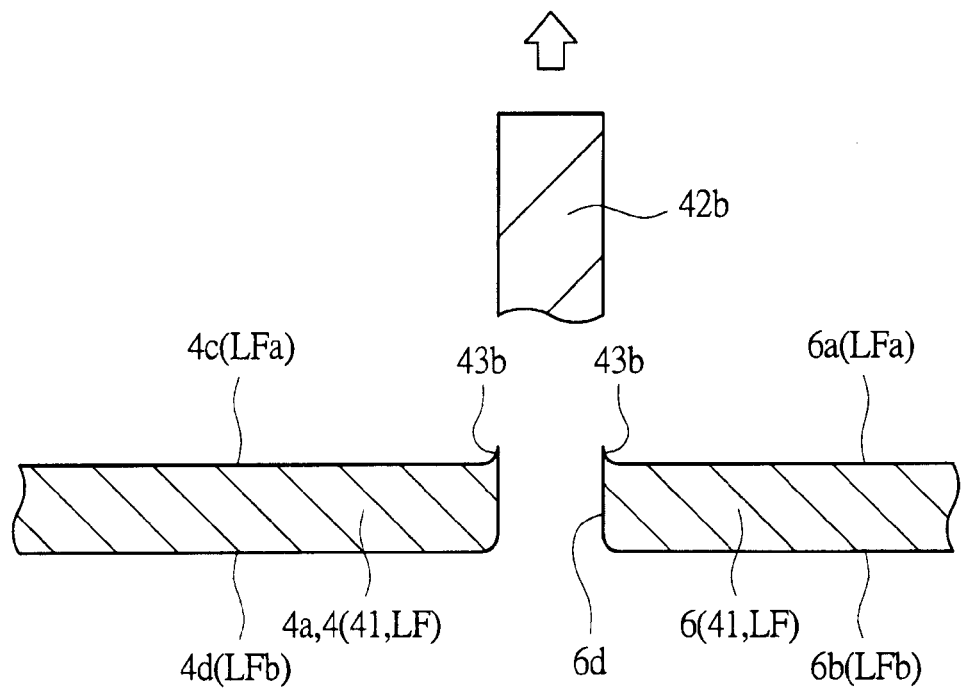
FIG. 57 is an explanatory diagram of the technique to form the lead frame.
Figure 58:
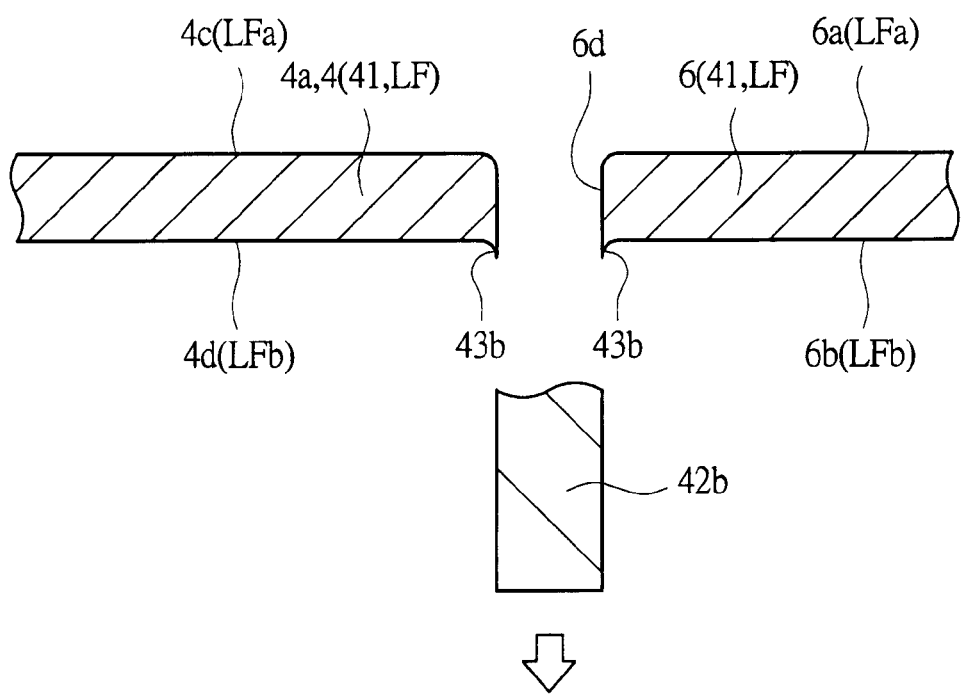
FIG. 58 is an explanatory diagram of the technique to form the lead frame.

As shown in FIG. 55, FIG. 57, and FIG. 58, it is possible to work the metal plate 41 into the form of the lead frame LF by punching out the metal plate 41 with pressing (cutting) punches 42a, 42b.

Here, the opening 13 is formed with the punch 42a, and at this time, it is preferable to punch out the metal plate 41 with the punch 42a in the direction from a top surface LFa side of the lead frame LF (that is, from the top surface 3a side of the die pad 3 and the member 9) toward a bottom surface LFb side of the lead frame LF (that is, the bottom surface 3b of the die pad 3 and the member 9). The reason for this is as follows.

That is, to the die pad 3, the heat dissipating plate 6 is linked via the member 9, and therefore, if coining is performed after the press working (punching out with the punch 42a), the die pad 3 and the member 9 are lengthened in the planar direction by an amount corresponding to the crushed part and there arises a problem that the heat dissipating plate 6, the member 9, and the die pad 3 deform in the direction toward the outside of the plane. Because of this, it is preferable not to perform coining for the die pad 3. However, if coining is not performed, a burr (metal burr) 43a produced by the punching out with the punch 42a remains in the die pad 3 and the member 9. If the burr 43a exists on the top surface 3a of the die pad 3 and the member 9, which is a chip mounting surface, it will cause trouble, such as that the semiconductor chip 2 mounted over the top surface 3a of the die pad 3 and the member 9 is inclined because of the burr 43a and that wetting of the adhesive 8 is insufficient.

Figure 56:
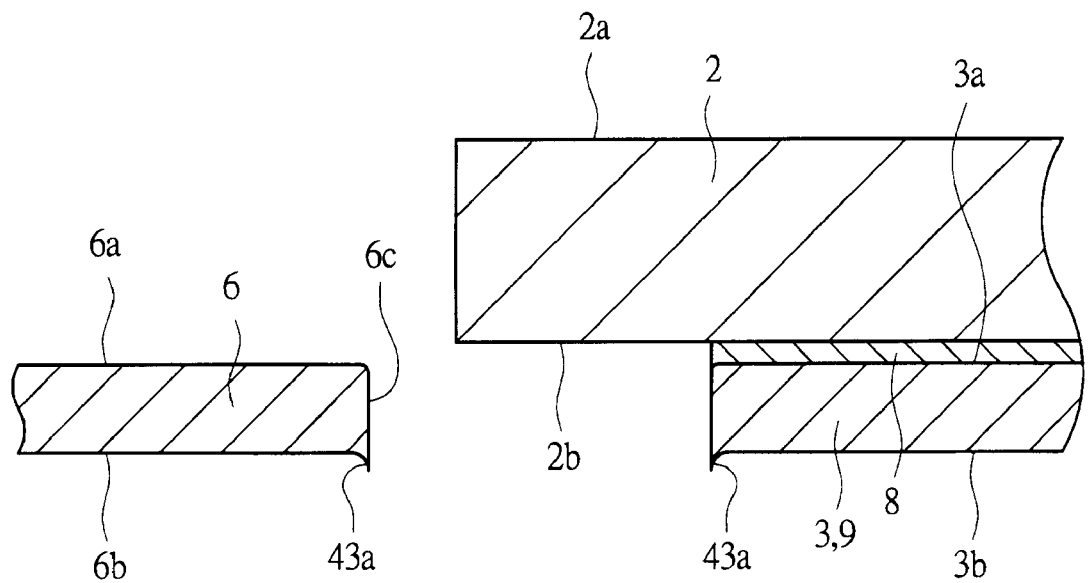
FIG. 56 is an explanatory diagram of the technique to form the lead frame.

In contrast to the above, in the present embodiment, when forming the die pad 3 and the member 9 by press working, it is recommended to punch out the metal plate 41 with the punch 42a in the direction from the top surface LFa side of the lead frame LF (that is, the top surface 3a side of the die pad 3 and the member 9) toward the bottom surface LFb side of the lead frame LF (that is, the bottom surface 3b side of the die pad 3 and the member 9), as shown in FIG. 55. As a result, the burr 43a is formed on (the end part of) the bottom surface 3b of the die pad 3 and the member 9, however, the burr 43a is not formed on (the end part of) the top surface 3a of the die pad 3 and the member 9, and (the end part of) the top surface 3a of the die pad 3 and the member 9 is in the form of a sag. Further, as shown in FIG. 56, even if the semiconductor chip 2 is mounted (bonded) over the top surface 3a of the die pad 3 and the member 9 via the adhesive 8, it is possible to suppress or prevent trouble, such as that the semiconductor chip 2 is inclined because of burr and that the wetting of the adhesive 8 is insufficient, because the burr 43a is not formed on the top surface 3a of the die pad 3 and the member 9, which is a chip mounting surface.

Consequently, in the die pad 3 and the member 9, the burr 43a formed on the bottom surface 3b side of the die pad 3 and the member 9 faces in the direction from the top surface 3a toward the bottom surface 3b of the die pad 3 and the member 9, and the burr 43a remains after the semiconductor device (here, the semiconductor device 1a) is manufactured.

The inner edge 6c of the heat dissipating plate 6 is formed simultaneously with the die pad 3 and the member 9 with the same punch 42a as that with which the die pad 3 and the member 9 are formed. Because of this, as shown in FIG. 55, on the inner edge 6c of the heat dissipating plate 6, the burr 43a is formed on the bottom surface 6b side of the heat dissipating plate 6, however, the burr 43a is not formed on the top surface 6a side of the heat dissipating plate 6, and the top surface 6a side of the heat dissipating plate 6 is in the form of a sag. On the inner edge 6c of the heat dissipating plate 6, the burr 43a formed on the bottom surface 6b side of the heat dissipating plate 6 faces in the same direction as that of the burr 43a formed on the bottom surface 3b side of the die pad 3 and the member 9, that is, in the direction from the top surface 6a toward the bottom surface 6b of the heat dissipating plate 6, and the burr 43a remains after the semiconductor device (here, the semiconductor device 1a) is manufactured.

On the other hand, the tip end of the inner lead part 4a of the lead 4 (tip end in opposition to the semiconductor chip 2) and the outer edge 6d of the heat dissipating plate 6 are formed simultaneously with the same punch 42b, as shown in FIG. 57 or FIG. 58. That is, by punching out the metal plate 41 with the same punch 42b, the tip end of the inner lead part 4a and the outer edge 6d of the heat dissipating plate 6 are formed simultaneously.

When forming the tip end of the inner lead part 4a and the outer edge 6d of the heat dissipating plate 6, there are two cases: a case where the metal plate 41 is punched out with the punch 42b in the direction from the bottom surface LFb side of the lead frame LF toward the top surface LFa side of the lead frame LF, as shown in FIG. 57; and a case where the metal plate 41 is punched out with the punch 42b in the direction from the top surface LFa side of the lead frame LF toward the bottom surface LFb side of the lead frame LF, as shown in FIG. 58. After the punching out with the punch 42b, the suspension lead 10 is bent at the bending part 10a, however, FIG. 57 shows a state before the bending, and therefore, the inner lead 4a and the heat dissipating plate 6 are at the same height position.

As shown in FIG. 57, when the metal plate 41 is punched out with the punch 42b in the direction from the bottom surface LFb side of the lead frame LF (the side of the bottom surfaces 6b, 4d of the heat dissipating plate 6 and the inner lead part 4a) toward the top surface LFa side of the lead frame LF (the side of the top surfaces 6a, 4c of the heat dissipating plate 6 and the inner lead part 4a), a burr (metal burr) 43b produced by the punching out with the punch 42b on the outer edge 6d of the heat dissipating plate 6 and on the tip end of the inner lead part 4a is as follows.

That is, as shown in FIG. 57, on the outer edge 6d of the heat dissipating plate 6, the burr 43b is formed on the top surface 6a side of the heat dissipating plate 6, however, on the bottom surface 6b side of the heat dissipating plate 6, the burr 43b is not formed but it is in the form of a sag. Because of this, the burr 43b formed on the outer edge 6d of the heat dissipating plate 6 faces in the direction from the bottom surface 6b of the heat dissipating plate 6 toward the top surface 6a. Similarly, on the tip end of the inner lead part 4a, the burr 43b is formed on the top surface 4c side of the inner lead part 4a, however, on the bottom surface 4d side of the inner lead part 4a, the burr 43 is not formed but it is in the form of a sag.

Because of this, the burr 43b formed on the tip end of the inner lead part 4a faces in the direction from the bottom surface 4d of the inner lead part 4a toward the top surface 4c. That is, on the outer edge 6d of the heat dissipating plate 6 and on the tip end of the inner lead part 4a, the burr 43b facing in the opposite direction of the burr 43a (the burr 43a formed on the inner edge 6c of the die pad 3, the member 9, and the heat dissipating plate 6) is formed on the top surfaces 6a, 4c side of the heat dissipating plate 6 and the inner lead part 4a, and the burr 43b remains after the semiconductor device (here, the semiconductor device 1a) is manufactured.

It is necessary to perform wire bonding for the flat surface while avoiding the region with the burr 43b or in the form of a sag, however, the burr 43b is formed locally by the punching out with the punch 42b, but the form of a sag occurs in an area larger than the area of the burr 43b, and therefore, it is more advantageous to select the burr 43b formation side rather than the surface side in the form of a sag as the surface side for bonding in order to increase the bonding area of wire bonding. It is possible to crush the burr on the tip end part of the inner lead part 4a by coining, however, in general, the depth of the coining is less than the depth of the form of a sag, and therefore, even when the burr on the tip end part of the inner lead part 4a is crushed by coining, it is more advantageous to select the burr 43b formation side rather than the surface side in the form of a sag as the surface side for bonding in order to increase the bonding area of wire bonding.

Because of this, when the burr 43b is formed on the top surface 4c side of the inner lead part 4a and the bottom surface 4d side of the inner lead part 4a is in the form of a sag, it is possible to ensure a large area of the part (that is, the bonding surface) against which a capillary is pressed on the top surface 4C of the inner lead 4a in the wire boding step in step S3. This is preferable when applied to the case where the area of the bonding surface is desired to be increased in the inner lead part 4a (for example, when the area of the bonding surface is desired to be increased as much as possible because the width of the inner lead part 4a is small).

On the other hand, as shown in FIG. 58, when the metal plate 41 is punched out with the punch 42b in the direction from the top surface LFa side of the lead frame LF (the side of the top surfaces 6a, 4c of the heat dissipating plate 6 and the inner lead part 4a) toward the bottom surface LFb side of the lead frame LF (the side of the bottom surfaces 6b, 4d of the heat dissipating plate 6 and the inner lead part 4a), the burr (metal burr) 43b produced by the punching out with the punch 42b on the outer edge 6d of the heat dissipating plate 6 and on the tip end of the inner lead part 4a is as follows.

That is, as shown in FIG. 58, on the outer edge 6d of the heat dissipating plate 6, the burr 43b is formed on the bottom surface 6b side of the heat dissipating plate 6, however, on the top surface 6a side of the heat dissipating plate 6, the burr 43b is not formed but it is in the form of a sag. Because of this, the burr 43b formed on the outer edge 6d of the heat dissipating plate 6 faces in the direction from the top surface 6a of the heat dissipating plate 6 toward the bottom surface 6b. Similarly, on the tip end of the inner lead part 4a, the burr 43b is formed on the bottom surface 4d side of the inner lead part 4a, however, on the top surface 4c side of the inner lead part 4a, the burr 43 is not formed but it is in the form of a sag. Because of this, the burr 43b formed on the tip end of the inner lead part 4a faces in the direction from the top surface 4c of the inner lead part 4a toward the bottom surface 4d. That is, on the outer edge 6d of the heat dissipating plate 6 and on the tip end of the inner lead part 4a, the burr 43b facing in the same direction as that of the burr 43a (the burr 43a formed on the inner edge 6c of the die pad 3, the member 9, and the heat dissipating plate 6) is formed on the bottom surfaces 6b, 4d side of the heat dissipating plate 6 and the inner lead part 4a, and the burr 43b remains after the semiconductor device (here, the semiconductor device 1a) is manufactured.

In this case, the direction of punching out with the punch 42a is the same as the direction of the punching out with the punch 42b, and therefore, it is possible to form (work) the inner edge 6c of die pad 3, the member 9, and the heat dissipating plate 6, the outer edge 6d of the heat dissipating plate 6, and the tip end of the inner lead part 4a by one-time punching out using the punches 42a, 42b. Because of this, it is possible to reduce the number of steps required to form the lead frame LF. This is preferable when applied to the case where it is not necessary to ensure a large area of the bonding surface in the inner lead part 4a (for example, when it is not necessary to ensure a large area of the bonding surface because the width of the inner lead part 4a is great).

The reason why it is preferable not to perform coining for the die pad 3 is already stated above, and this also applies to the heat dissipating plate 6. To the heat dissipating plate 6, the die pad 3 is linked via the member 9, and therefore, if coining is performed after the press working, the heat dissipating plate 6 and the member 9 are lengthened by an amount corresponding to the crushed part in the planar direction and there is a possibility that the die pad 3, the member 9, and the heat dissipating plate 6 deform in the direction toward the outside of the plane.

Consequently, even if it is possible to crush the burr 43b formed on the tip end of the inner lead part 4a by coining, coining cannot be performed for the heat dissipating plate 6 because of the reason described above, and therefore, the burr 43b formed on the outer edge 6d of the heat dissipating plate 6 remains after the semiconductor device (here, the semiconductor device 1a) is manufactured.

The present embodiment can be applied to any of the first to fifth embodiments described above and seventh to ninth embodiments, to be described later.

Seventh Embodiment

Figure 59:
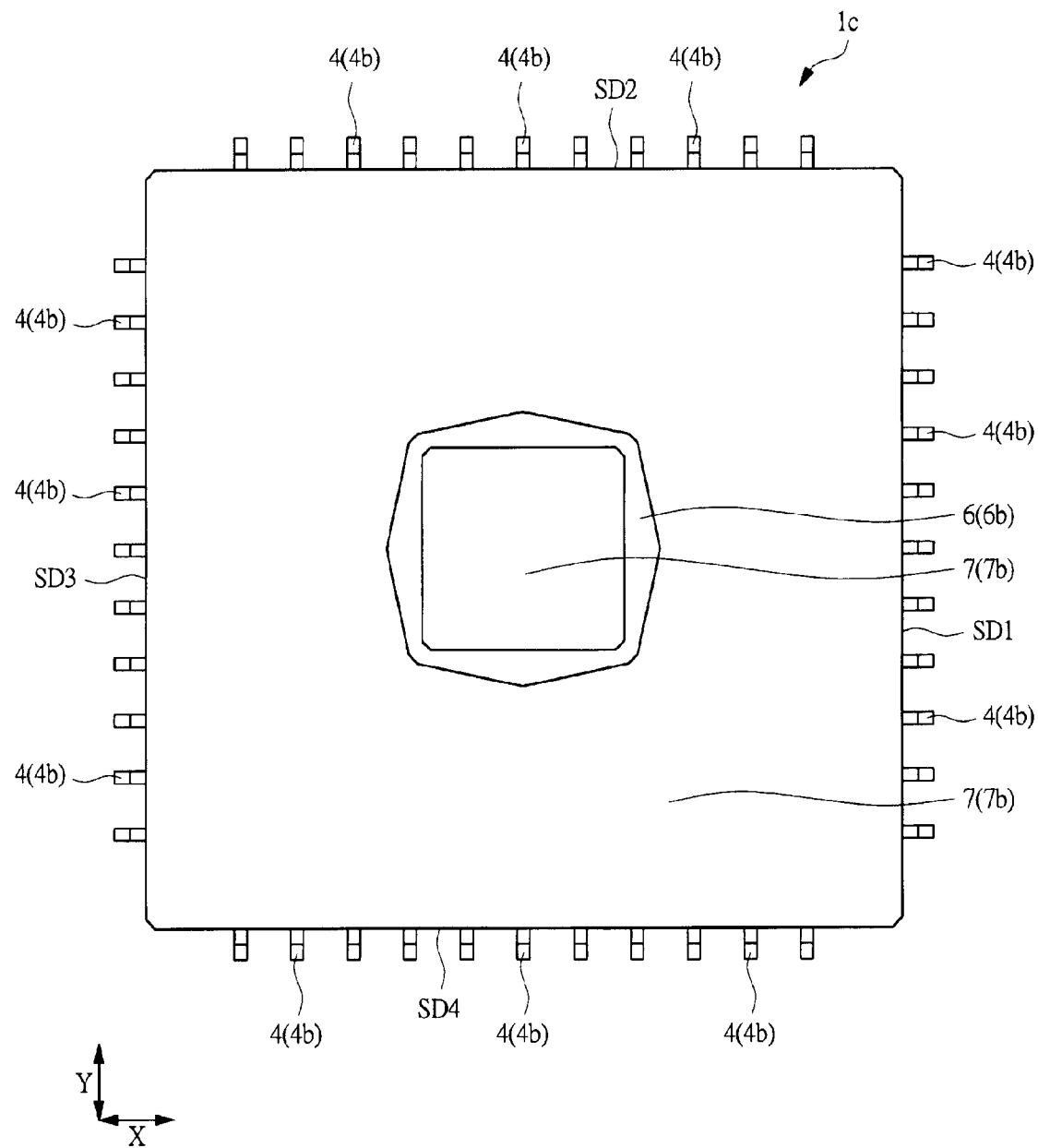
FIG. 59 is a bottom view of a semiconductor device in a seventh embodiment of the present invention.
Figure 60:
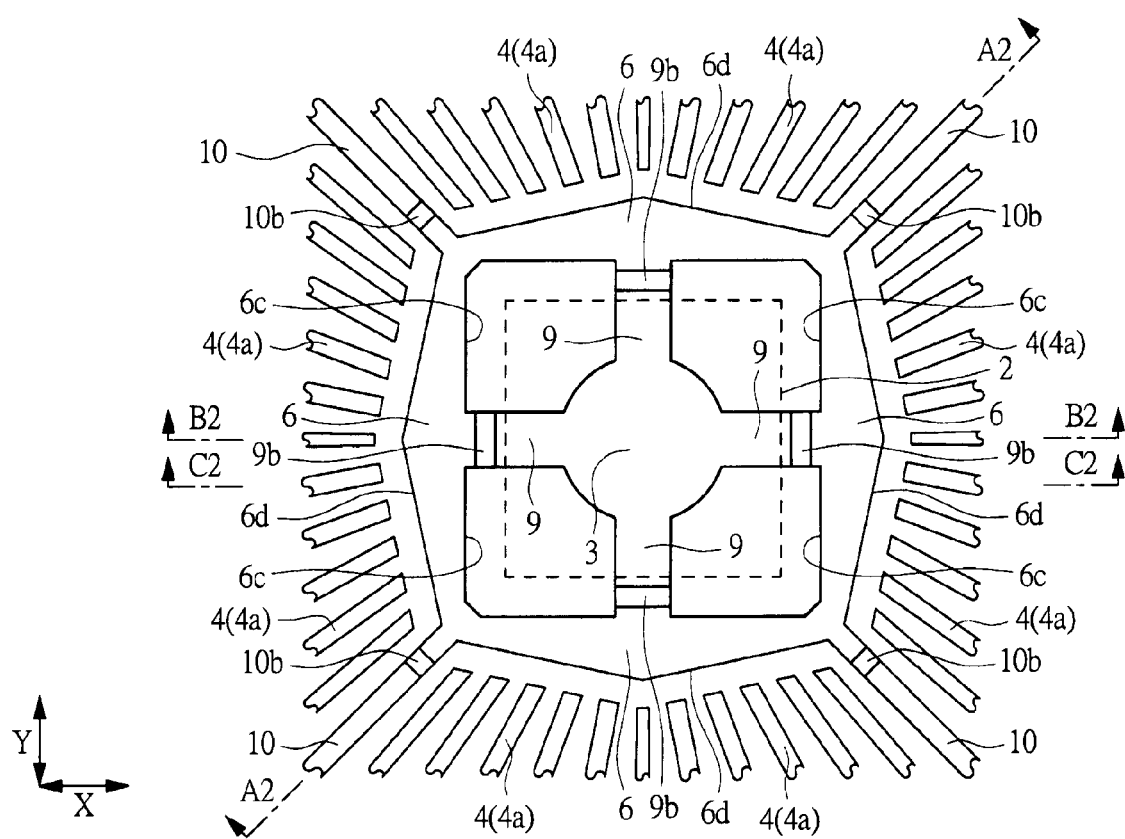
FIG. 60 is a partially enlarged plan perspective view of the semiconductor in the seventh embodiment of the present invention.
Figure 61:
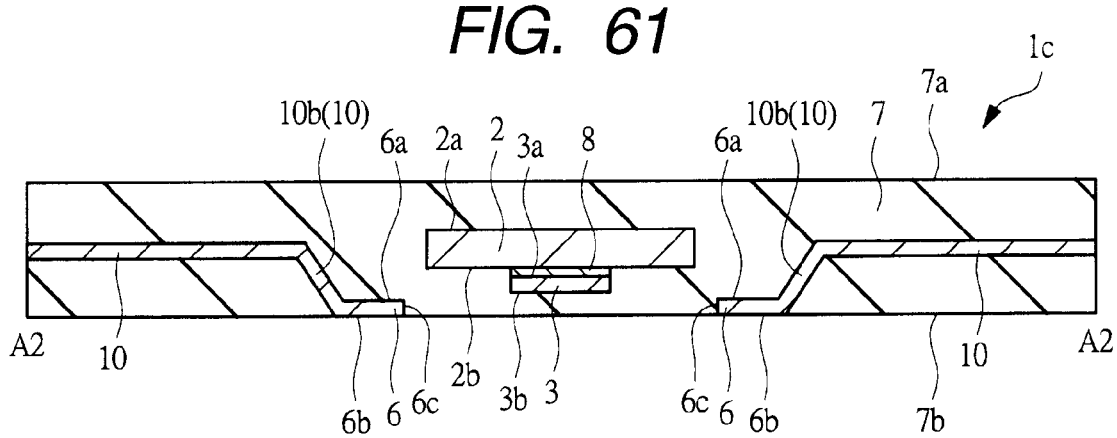
FIG. 61 is a section view of the semiconductor device in the seventh embodiment of the present invention.
Figure 62:
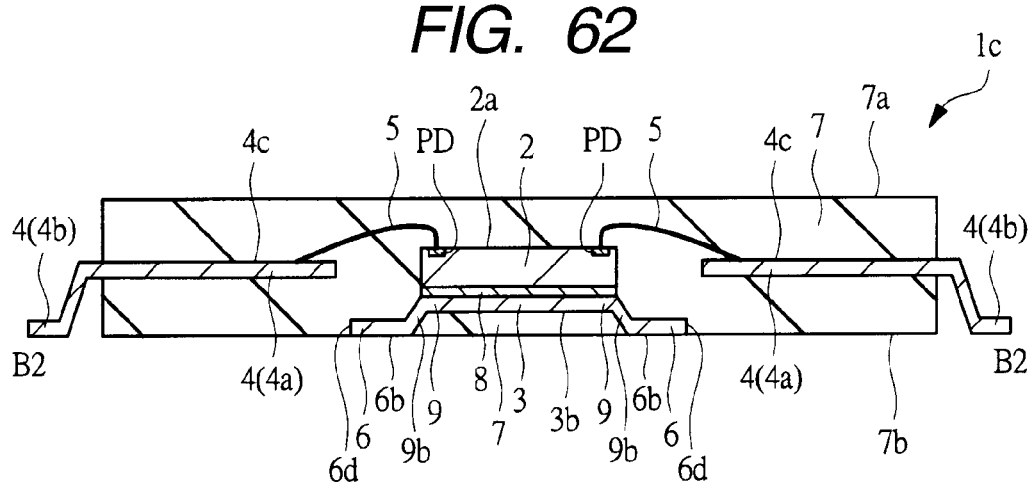
FIG. 62 is a section view of the semiconductor device in the seventh embodiment of the present invention.
Figure 63:
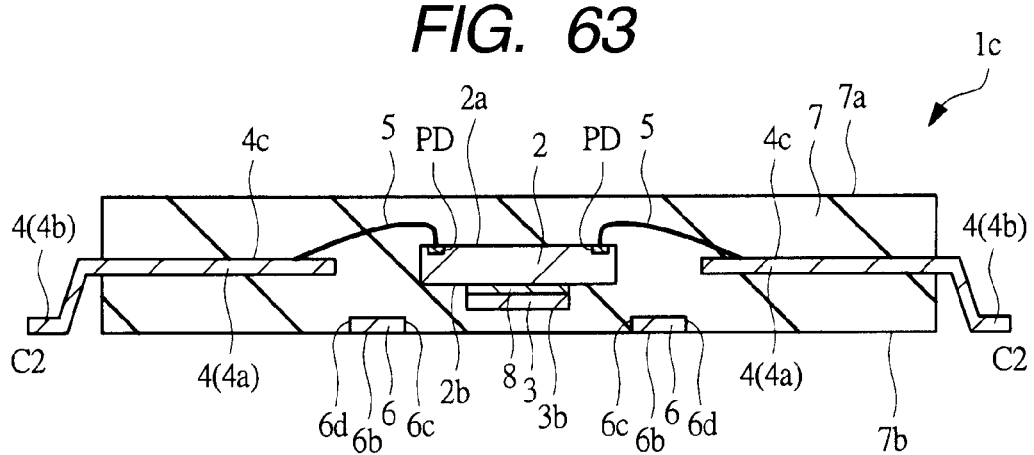
FIG. 63 is a section view of the semiconductor device in the seventh embodiment of the present invention.

FIG. 59 is a bottom view (back view) of a semiconductor device is in the present embodiment, FIG. 60 is a partially enlarged plan perspective view of the semiconductor device is in the present embodiment, and FIG. 61 to FIG. 63 are each a section view (side surface section view) of the semiconductor device 1c in the present embodiment. The present embodiment corresponds to a modified example of the second embodiment and the fifth embodiment described above. FIG. 60 corresponds to FIG. 20 of the second embodiment, showing a plan perspective view of essential parts of the semiconductor device when the sealing resin part 7 is viewed perspectively and further, the semiconductor chip 2 and the bonding wire 5 are removed (viewed perspectively), and for easier understanding, the position where the semiconductor chip 2 is mounted (arranged) is shown by a dotted line. FIG. 61 corresponds to FIG. 21 of the second embodiment (that is, the section at the position corresponding to the A2-A2 line in FIG. 18), FIG. 62 corresponds to FIG. 22 of the second embodiment (that is, the section at the position corresponding to the B2-B2 line in FIG. 18), and FIG. 63 corresponds to FIG. 23 of the second embodiment (that is, the section at the position corresponding to the C2-C2 line in FIG. 18). In FIG. 60 also, for easier understanding, the positions corresponding to the A2-A2 line, the B2-B2 line, and the C2-C2 line in FIG. 18 are assigned the A2-A2 line, the B2-B2 line, and the C2-C2 line, however, while only part of the semiconductor device 1c is shown in FIG. 60, FIG. 61 to FIG. 63 are each a section view of the entire semiconductor device 1c (the entire region shown in FIG. 18).

In the semiconductor device 1a in the second embodiment, the heat dissipating plate 6 is sealed in the sealing resin part 7 and not exposed from the sealing resin part 7. In contrast to this, in the semiconductor device 1c in the present embodiment, as can also be seen from FIG. 59, the bottom surface 6b of the heat dissipating plate 6 is exposed at the bottom surface 7b of the sealing resin part 7. The top surface 6a and the side surface of the heat dissipating plate 6 are sealed in the sealing resin part 7.

In any of the second and fifth embodiments and the present embodiment also, the height position of the die pad 3 and the member 9 is set lower than the height position of the inner lead part 4a so that wire bonding between the inner lead part 4a and the electrode PD of the semiconductor chip 2 is easy to perform, however, the bottom surface 3a of the die pad 3 and the member 9 is not exposed from the bottom surface 7b of the sealing resin part 7. However, the height position of the heat dissipating plate 6 is different among the second embodiment, the fifth embodiment, and the present embodiment.

That is, in the second embodiment, as can also be seen from FIG. 21 to FIG. 23, the heat dissipating plate 6 is arranged at a position lower than the inner lead part 4a, however, the heat dissipating plate 6 is at the same height position as the die pad 3 and the member 9 and none of the heat dissipating plate 6, the member 9, and the die pad 3 is exposed at the bottom surface 7b of the sealing resin part 7. In the fifth embodiment, the height position of the heat dissipating plate 6 is set higher than the die pad 3 and the member 9 and none of the heat dissipating plate 6, the member 9, and the die pad 3 is exposed at the bottom surface 7b of the sealing resin part 7. In contrast to the above, in the present embodiment, the height position of the heat dissipating plate 6 is set further lower than the die pad 3 and the member 9, and thereby, the bottom surface 3b of the die pad 3 and the member 9 is not exposed at the bottom surface 7b of the sealing resin part 7, however, the bottom surface 6b of the heat dissipating plate 6 is exposed at the bottom surface 7b of the sealing resin part 7.

To explain specifically, in the semiconductor device is in the present embodiment, as can also be seen from FIG. 60 to FIG. 63, a bending part (flexing part) 10b is provided in the middle of the suspension lead 10 (in the vicinity of the part linked to the heat dissipating plate 6). The direction of bending of the bending part 10b in the present embodiment is the same as the direction of the bending of the bending part 10a in the second embodiment, however, the difference in height due to the bending is larger in the bending part 10b in the present embodiment than that in the bending part 10a in the second embodiment. That is, in the present embodiment, the bending part 10b of each of the suspension leads 10 (four, here) is bent so that the height position of the heat dissipating plate 6 is lower than the height position of the inner lead part 4a and the bottom surface 6b of the heat dissipating plate 6 is exposed at the bottom surface 7b of the sealing resin part 7. As a result, while the bottom surface 6b of the heat dissipating plate 6 is not exposed at the bottom surface 7b of the sealing resin part 7 in the second embodiment, it is possible to expose the bottom surface 6b of the heat dissipating plate 6 at the bottom surface 7b of the sealing resin part 7 in the semiconductor device is in the present embodiment.

That is, the height position of the suspension lead 10 outside the bending part 10b is substantially the same as the height position of the inner lead part 4a, however, because the suspension lead 10 is provided with the bending part 10b, it is possible to arrange the heat dissipating plate 6 at a position lower than the inner lead part 4a. Then, it is possible to expose the bottom surface 6b of the heat dissipating plate 6 at the bottom surface 7b of the sealing resin part 7 by forming the sealing resin part 7 so that the bottom surface 6b of the heat dissipating plate 6 is exposed in the molding step in step S4.

Further, in the present embodiment, as can also be seen from FIG. 60 to FIG. 63, the height position of (the top surface 3a of) the die pad 3 and the member 9 is higher than the height position of (the top surface 6a of) the heat dissipating plate 6. Because of this, in the present embodiment, the bending part (flexing part) 9b is provided between each member 9 and the inner edge 6c of the heat dissipating plate 6, however, the direction of bending of the bending part 9b in the present embodiment is opposite to the direction of bending of the bending part 9a in the fifth embodiment. That is, while the bending part 9a is bent so that the top surface 3a of the die pad 3 and the member 9 is lower than the top surface 6a of the heat dissipating plate 6 in the fifth embodiment, the bending part 9b is bent so that the top surface 3a of the die pad 3 and the member 9 is higher than the top surface 6a of the heat dissipating plate 6 in the present embodiment. The bending part 9b is formed integrally with the heat dissipating plate 6 and the member 9. By the bending part 9, the height position of the member 9 and the die pad 3 is made higher than the height position of the heat dissipating plate 6. As a result, it is possible to expose the bottom surface 6b of the heat dissipating plate 6 at the bottom surface 7b of the sealing resin part 7 while preventing the bottom surface 3b of the member 9 and the die pad 3 from being exposed at the bottom surface 7b of the sealing resin part 7.

In the present embodiment, the bending part 9b is provided between the member 9 and the heat dissipating plate 6, however, it is not possible to bond the semiconductor chip 2 over the bending part 9b, and the semiconductor chip 2 is bonded to the member 9 and the die pad 3, which are flat, other than the bending part 9b with the adhesive 8. Because of this, as also shown in FIG. 60, the semiconductor chip 2 is arranged over the member 9 and the die pad 3, which are flat, inside the bending part 9b (on the side nearer to the center of the die pad 3) so as not to overlap the bending part 9b in a planar manner and is bonded to the member 9 and the die pad 3, which are flat, via the adhesive 8. Preferably, the bending part 9b is provided at a position as close as possible to the inner edge 6 of the heat dissipating plate 6 so that the upper limit of the plane dimensions of the semiconductor chip 2 that can be mounted is as great as possible.

Other configurations of the semiconductor device 1c in the present embodiment are the same as those of the semiconductor device 1a in the second embodiment and the semiconductor device 1b in the fifth embodiment, and therefore, their explanation is omitted here.

In the present embodiment, by exposing the bottom surface 6b of the heat dissipating plate 6 at the bottom surface 7b of the sealing resin part 7, it is possible to conduct heat produced in the semiconductor chip 2 to the heat dissipating plate 6 via the adhesive 8, the die pad 3, and the member and to dissipate the heat to the outside of the semiconductor device is (under the semiconductor device 1c) from the heat dissipating plate 6. Because of this, it is possible to dissipate heat in the semiconductor chip 2 to the outside of the semiconductor device is (under the semiconductor device 1c) from the heat dissipating plate 6 via the adhesive 8 having a thermal conductivity higher than that of the sealing resin part 7, the die pad 3, the member 9, and the heat dissipating plate 6, not via the sealing resin part 7 having a low thermal conductivity, and therefore, the heat dissipation characteristics of the semiconductor device 1c can be improved further. When packaging the semiconductor device is on the packaging substrate PWB, if the bottom surface 6b of the heat dissipating plate 6 exposed at the bottom surface 7b of the sealing resin part 7 is joined (solder-coupled) to the terminal TE of the top surface of the packaging substrate PWB, it is possible to efficiently dissipate heat from the bottom surface 6b of the heat dissipating plate 6 to the packaging substrate PWB, and therefore, the effect to improve the heat dissipation characteristics of the semiconductor device 1c can be further magnified.

Unlike the present embodiment, when not only the bottom surface 6b of the heat dissipating plate 6 but also the bottom surface 3b of the die pad 3 and the member 9 is exposed at the bottom surface 7b of the sealing resin part 7, the boundary surface between the die pad 3 and the member 9 7 exposed at the bottom surface 7b of the sealing resin part 7 and the sealing resin part 7 is close to the semiconductor chip 2, and therefore, in a high-temperature and high-humidity load test, there is a possibility that moisture etc. may be conducted to the semiconductor chip 2 through the boundary surface. This may degrade the reliability (moisture resistance) of the semiconductor device.

In contrast to the above, in the present embodiment, the bottom surface 6b of the heat dissipating plate 6 is exposed at the bottom surface 7b of the sealing resin part 7, however, the die pad 3 and the member 9 that mount the semiconductor chip 2 are not exposed from the sealing resin part 7. Then, the boundary surface between the heat dissipating plate 6 exposed at the bottom surface 7b of the sealing resin part 7 and the sealing resin part 7 is comparatively distant from the semiconductor chip 2. Because of this, when compared to the case where the die pad 3 and the member 9 are exposed at the bottom surface 7b of the sealing resin part 7, in the case where only the heat dissipating plate 6 is exposed at the bottom surface 7b of the sealing resin part 7, as in the present embodiment, moisture etc. is unlikely to be conducted to the semiconductor chip 2 through the boundary surface formed on the bottom surface 7b of the sealing resin part 7 in a high-temperature and high-humidity load test, and therefore, it is possible to suppress or prevent the deterioration of the moisture resistance of the semiconductor device. Because of this, it is possible to improve the heat dissipation characteristics while suppressing deterioration of the moisture resistance.

On the other hand, like the semiconductor device 1a in the second embodiment and the semiconductor device 1b in the fifth embodiment, when not only the die pad 3 and the member 9 but also the heat dissipating plate 6 is sealed in the sealing resin part 7 and not exposed at the bottom surface 7b of the sealing resin part 7, the boundary surface that leads to the semiconductor chip 2 is only the exposed surface of the suspension lead 10 at the side surface of the sealing resin part 7. The exposed surface of the suspension lead 10 is sufficiently distant from the semiconductor chip 2. Because of this, from the standpoint of the durability (moisture resistance) in a high-temperature and high-humidity load test, such a structure in which the heat dissipating plate 6 is also sealed in the sealing resin part 7, like the semiconductor device 1a in the second embodiment and the semiconductor device 1b in the fifth embodiment, is most excellent.

Consequently, when creating a design to improve the heat dissipation characteristics as much as possible while aiming at the coexistence of the improvement of heat dissipation characteristics and that of the moisture resistance (durability in a high-humidity load test), it is recommended to employ such a structure in which the bottom surface 6b of the heat dissipating plate 6 is exposed from the sealing resin part 7 like the semiconductor device 1c in the present embodiment. On the other hand, when creating a design to improve the moisture resistance as much as possible while aiming at the coexistence of the improvement of heat dissipation characteristics and that of the moisture resistance, it is recommended to employ such a structure in which the heat dissipating plate 6 is not exposed from the sealing resin part 7 like the semiconductor device 1a in the second embodiment and the semiconductor device 1b in the fifth embodiment.

The present embodiment can be applied to any of the first to sixth embodiments and eighth and ninth embodiments, to be described later.

Eighth Embodiment

Figure 64:
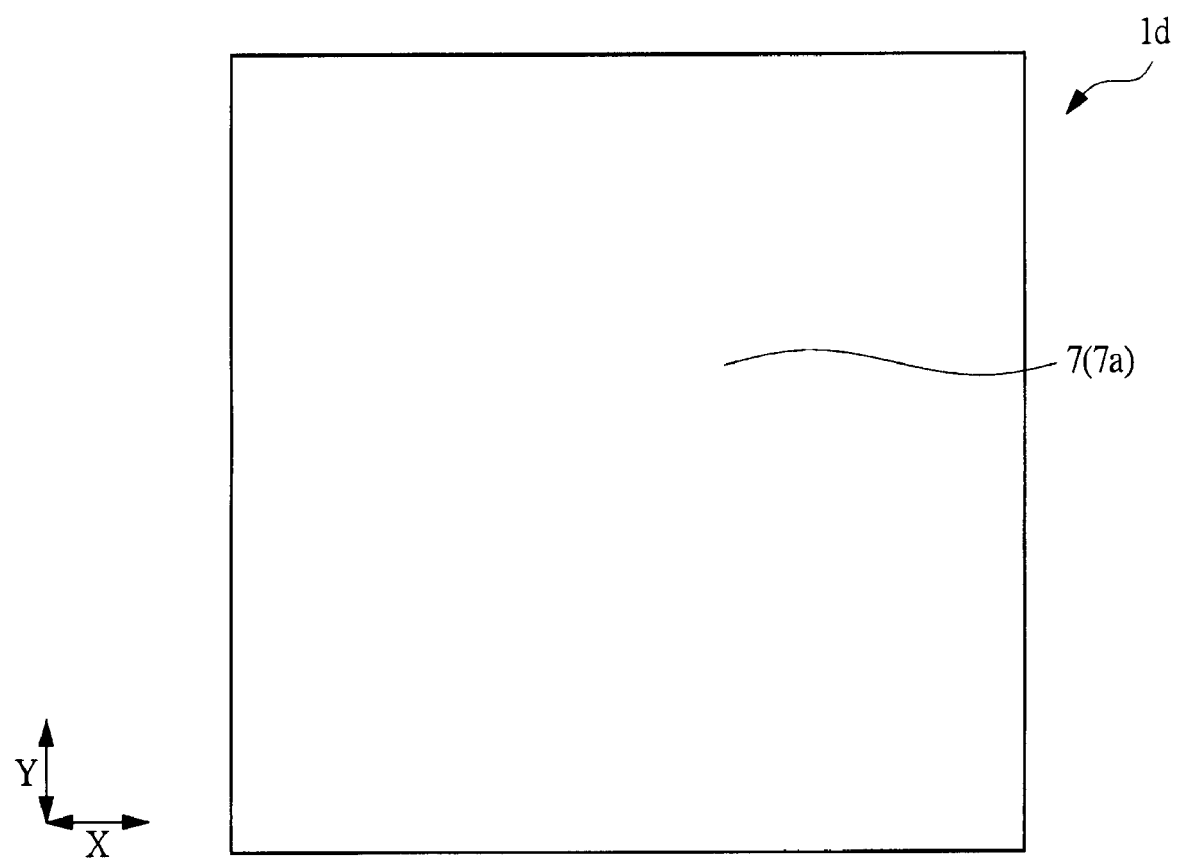
FIG. 64 is a top view of a semiconductor device in an eighth embodiment of the present invention.
Figure 65:
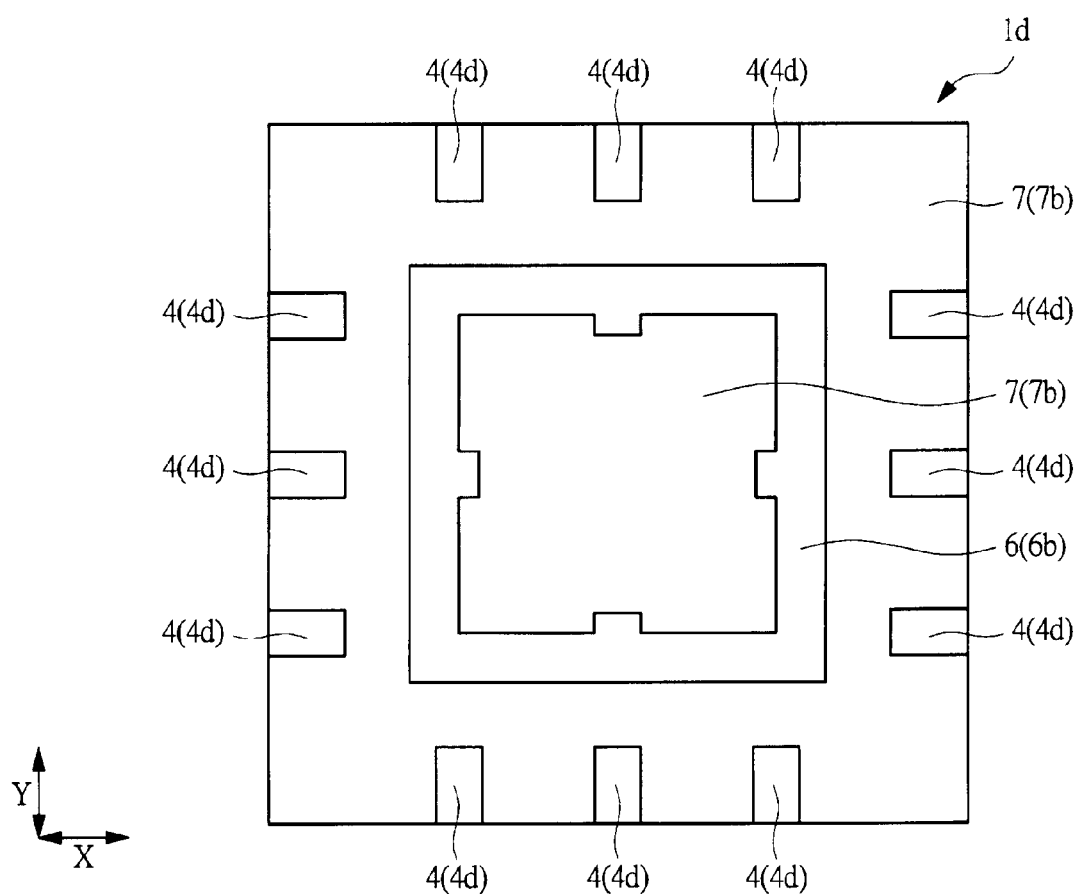
FIG. 65 is a bottom view of the semiconductor device in the eighth embodiment of the present invention.
Figure 66:
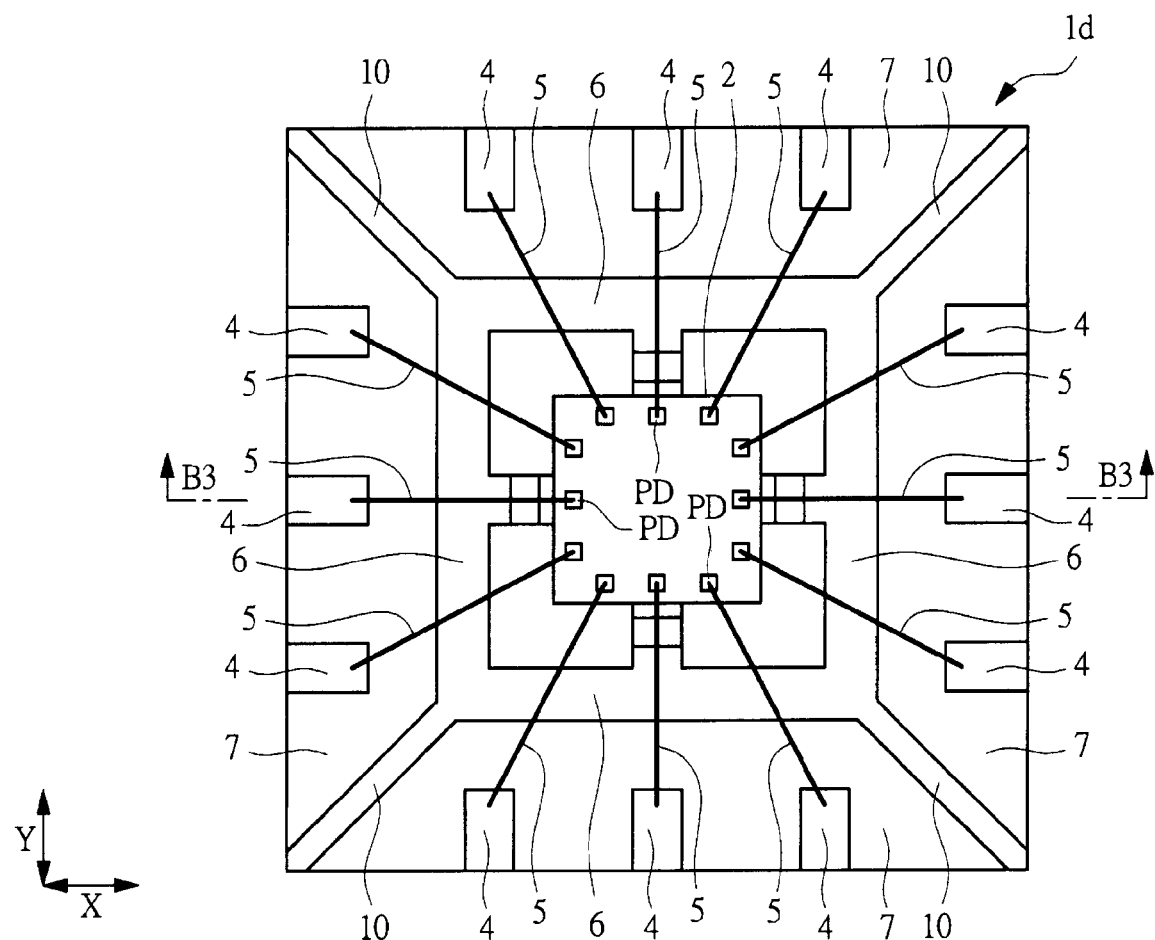
FIG. 66 is a plan perspective view of the semiconductor device in the eighth embodiment of the present invention.
Figure 67:
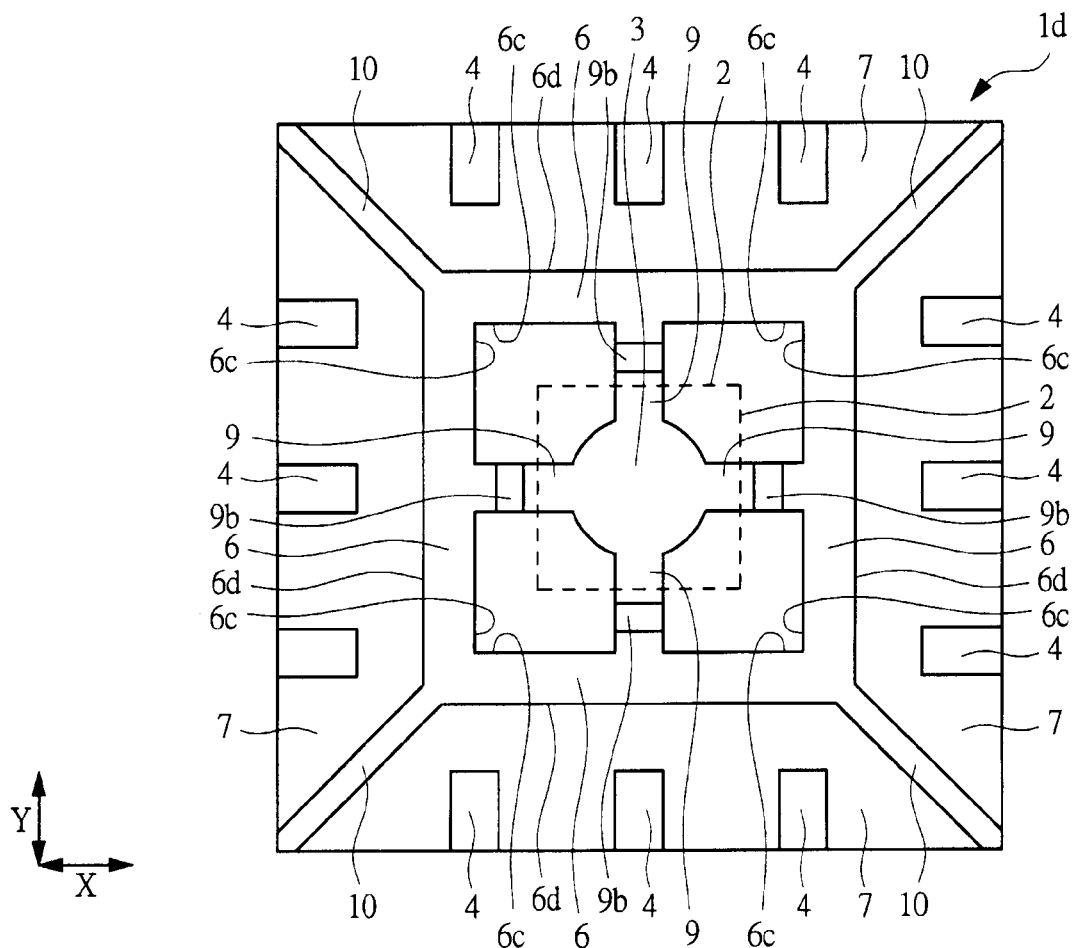
FIG. 67 is a plan perspective view of the semiconductor device in the eighth embodiment of the present invention.
Figure 68:
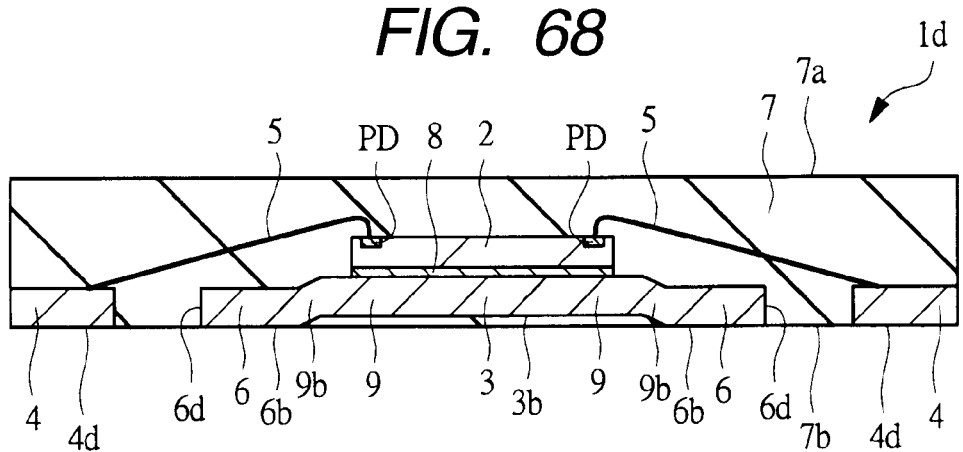
FIG. 68 is a section view of the semiconductor device in the eighth embodiment of the present invention.

FIG. 64 is a top view (plan view) of a semiconductor device 1d in the present embodiment, FIG. 65 is a bottom view (back view) of the semiconductor device 1d, and FIG. 66 is a plan perspective view (top view) of the semiconductor device 1d when the sealing resin part 7 is viewed perspectively. FIG. 67 is a plan perspective view (top view) of the semiconductor device 1d when the semiconductor chip 2 and the bonding wire 5 are removed (viewed perspectively) in FIG. 66. In FIG. 67, for easier understanding, the position where the semiconductor chip 2 is mounted (arranged) is indicated by a dotted line. FIG. 68 is a section view (side surface section view) of the semiconductor device 1d and the section view at the position along the B3-B3 line in FIG. 66 substantially corresponds to FIG. 68.

In the present embodiment, the structure in the seventh embodiment is applied to a QFN (Quad Flat Non leaded package) semiconductor device. Because of this, the semiconductor device 1d in the present embodiment shown in FIG. 64 to FIG. 68 is a resin-sealed, surface-mount type semiconductor package, that is, a QFN semiconductor device, and different from the semiconductor device 1c in the seventh embodiment in the following points.

The semiconductor device is in the seventh embodiment is a QFP semiconductor device and part of each lead 4 (that is, the outer lead part 4b) projects from the side surface of the sealing resin part 7 and is bent and worked. In contrast to the above, in the semiconductor device 1d in the present embodiment, the lead 4 has both functions as an inner lead embedded in the sealing resin part 7 and an outer lead exposed at the bottom surface 7b of the sealing resin part 7. That is, the bottom surface 4d of each lead 4 is exposed at the bottom surface 7b of the sealing resin part 7 and functions as an external coupling terminal (external terminal) of the semiconductor device id, and the end part (the surface of the lead 4 cut from the lead frame) on the opposite side of the side in opposition to the heat dissipating plate 6 of each lead 4 is exposed at the side surface of the sealing resin part 7, and the side surface and the top surface of each of the other leads 4 are sealed by the sealing resin part 7. The exposed surface (bottom surface 4d) of the lead 4 at the bottom surface 7b of the sealing resin part 7 has substantially a rectangular shape. Like that the bonding wire 5 is coupled to the top surface of the inner lead part 4a of the lead 4 in the semiconductor devices 1a, 1c in the second and seventh embodiments, in the present embodiment also, to the top surface of each lead 4 sealed by the sealing resin part 7, one end of the bonding wire 5 is coupled and the other end of the bonding wire 5 is coupled to the electrode PD of the semiconductor chip 2. As a result, as in the second and seventh embodiments, in the present embodiment also, the electrodes PD and the leads 4 of the semiconductor chip 2 are electrically coupled via the bonding wires 5.

In the semiconductor device 1d in the present embodiment, as can also be seen from FIG. 65, the bottom surface 6b of the heat dissipating plate 6 is exposed at the bottom surface 7b of the sealing resin part 7 and this is the same as the semiconductor device 1c in the seventh embodiment. On the other hand, the bottom surface of the suspension lead 10 is not exposed at the bottom surface 7b of the sealing resin part 7 as shown in FIG. 65, however, it is also possible to expose the bottom surface of the suspension lead 10 at the bottom surface 7b of the sealing resin part 7 in another embodiment. When, the bottom surface of the suspension lead 10 is not exposed at the bottom surface 7b of the sealing resin part 7, as shown in FIG. 65, it is recommended to make the height position of suspension lead 10 higher than the heat dissipating plate 6 by providing a bending part, such as the bending part 10b, to the suspension lead 10, or to form the suspension lead 10 so as to be thinner than the heat dissipating plate 6. As a result, the bottom surface 6b of the heat dissipating plate 6 is exposed at the bottom surface 7b of the sealing resin part 7, however, it is possible to prevent the suspension lead 10 from being exposed at the bottom surface 7b of the sealing resin part 7. If the suspension lead 10 and the heat dissipating plate 6 are made to have the same thickness without providing the bending part 10b to the suspension lead 10, it is possible to expose not only the bottom surface 6b of the heat dissipating plate 6 but also the bottom surface of the suspension lead 10 at the bottom surface 7b of the sealing resin part 7.

In the semiconductor device 1d in the present embodiment, the bottom surface 6b of the heat dissipating plate 6 is exposed at the bottom surface 7b of the sealing resin part 7, however, the die pad 3 and the member 9 at the part where the semiconductor chip 2 is bonded by the adhesive 8 are sealed in the sealing resin part 7 and not exposed from the sealing resin part 7, and this is the same as the semiconductor device 1c in the seventh embodiment. Because of this, in the present embodiment also, the bending part 9b similar to that in the seventh embodiment is provided between each member 9 and the inner edge 6c of the heat dissipating plate 6 and the bending part 9b is bent so that the top surface 3a of the die pad 3 and the member 9 is higher than the top surface 6a of the heat dissipating plate 6 (that is, the bottom surface 3b of the die pad 3 and the member 9 is higher than the bottom surface 6b of the heat dissipating plate 6). By the bending part 9b formed integrally with the heat dissipating plate 6 and the member 9, the height position of the member 9 and the die pad 3 is made higher than the height position of the heat dissipating plate 6. As a result, the bottom surface 6b of the heat dissipating plate 6 is exposed at the bottom surface 7b of the sealing resin part 7, however, it is possible to prevent the bottom surface 3b of the member 9 and the die pad 3 from being exposed at the bottom surface 7b of the sealing resin part 7.

Other configurations of the semiconductor device 1d in the present embodiment are substantially the same as those of the semiconductor device 1c in the seventh embodiment, and therefore, their explanation is omitted here.

In the present embodiment also, as in the seventh embodiment, it is possible to conduct heat produced in the semiconductor chip 2 to the heat dissipating plate 6 via the adhesive 8, the die pad 3, and the member 9 and to dissipate the heat to the outside of the semiconductor device 1*d* (under the semiconductor device 1*d*) from the heat dissipating plate 6, and thus, the heat dissipation characteristics of the semiconductor device 1*d* can be improved. When packaging the semiconductor device 1*d* on the packaging substrate PWB, if the bottom surface 6*b* of the heat dissipating plate 6 exposed at the bottom surface 7*b* of the sealing resin part 7 is joined (solder coupled) to the terminal TE of the top surface of the packaging substrate PWB, it is possible to efficiently dissipate heat from the bottom surface 6*b* of the heat dissipating plate 6 to the packaging substrate PWB, and therefore, the effect to improve the heat dissipation characteristics of the semiconductor device 1*d* can be magnified further.

In the present embodiment also, as in the seventh embodiment, the bottom surface 6*b* of the heat dissipating plate 6 is exposed at the bottom surface 7*b* of the sealing resin part 7, however, the die pad 3 and the member 9 that mount the semiconductor chip 2 are not exposed from the sealing resin part 7. Because of this, compared to the case where the die pad 3 and the member 9 are exposed at the bottom surface 7*b* of the sealing resin part 7, it is possible to more suppress or prevent the degradation of the moisture resistance of the semiconductor device. Consequently, it is possible to improve the heat dissipation characteristics while suppressing the degradation of the moisture resistance.

Ninth Embodiment

Figure 69:
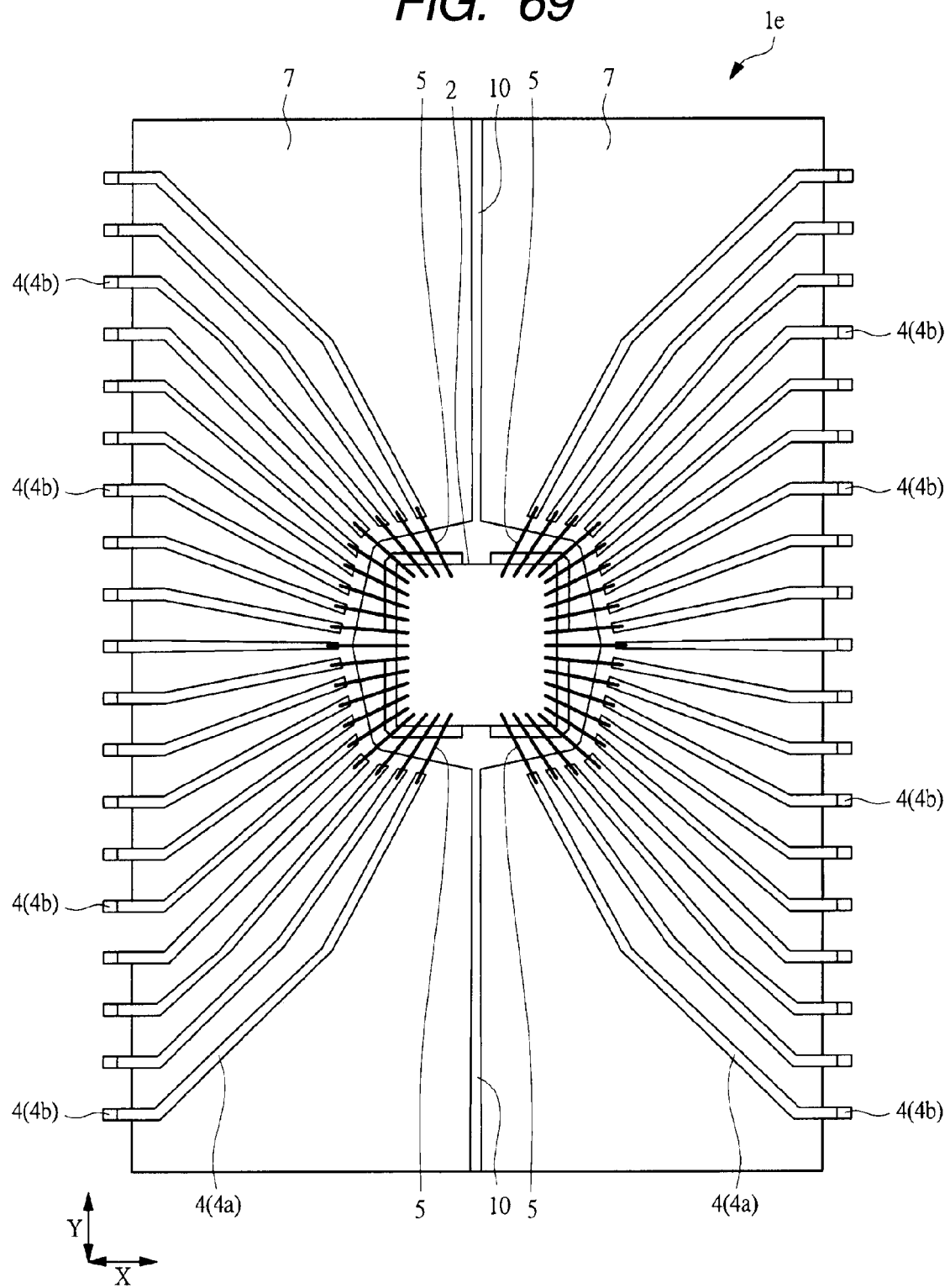
FIG. 69 is a plan perspective view of a semiconductor device in a ninth embodiment of the present invention.
Figure 70:
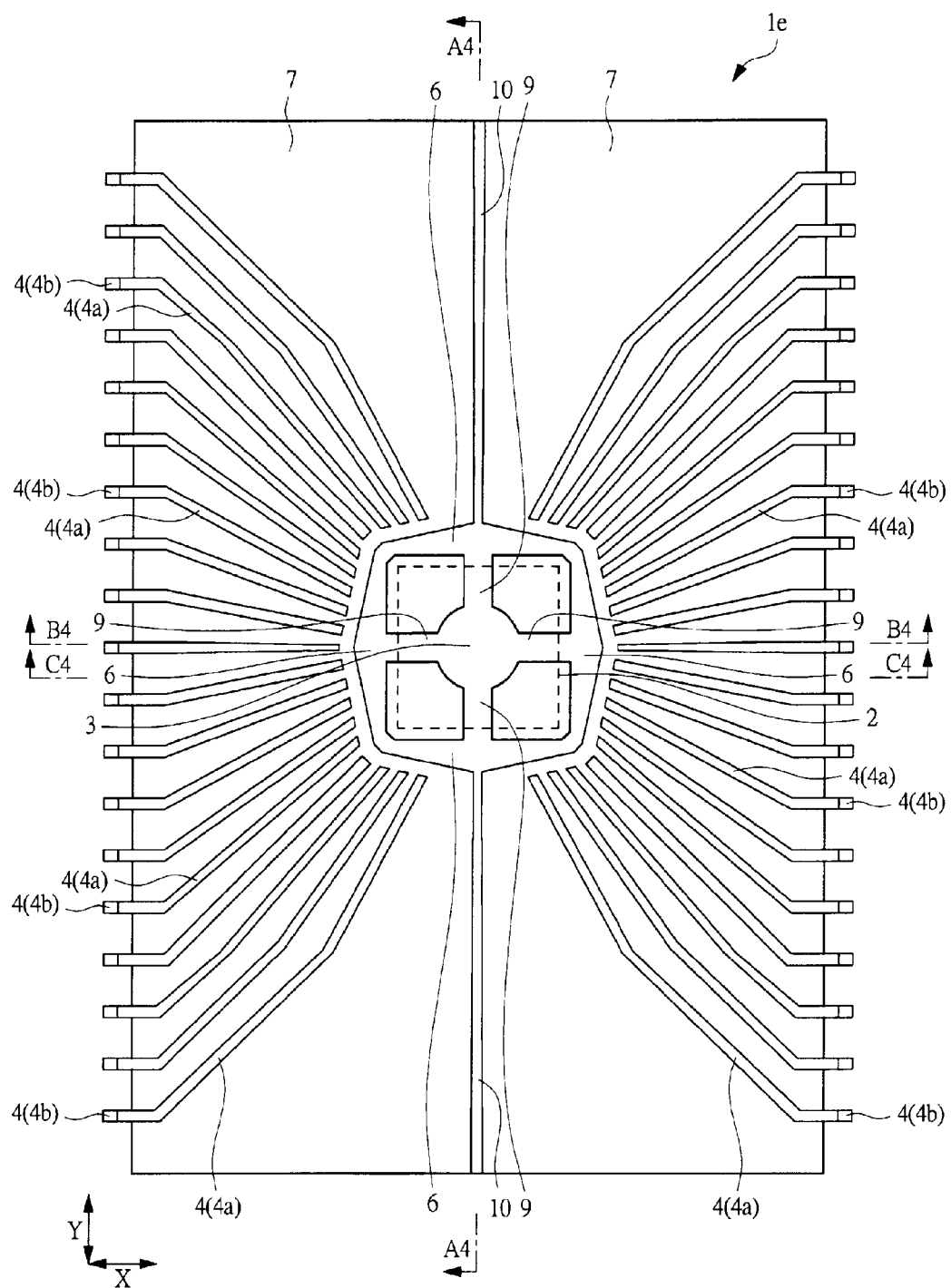
FIG. 70 is a plan perspective view of the semiconductor device in the ninth embodiment of the present invention.
Figure 71:
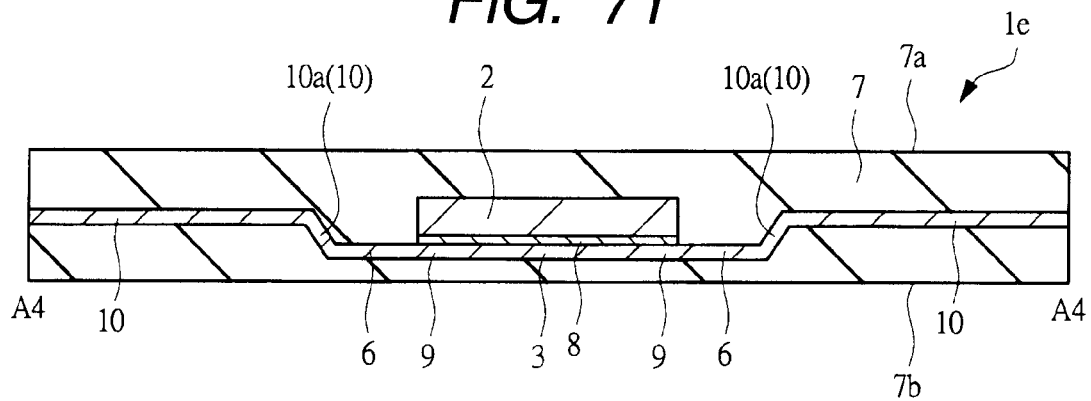
FIG. 71 is a section view of the semiconductor device in the ninth embodiment of the present invention.
Figure 72:
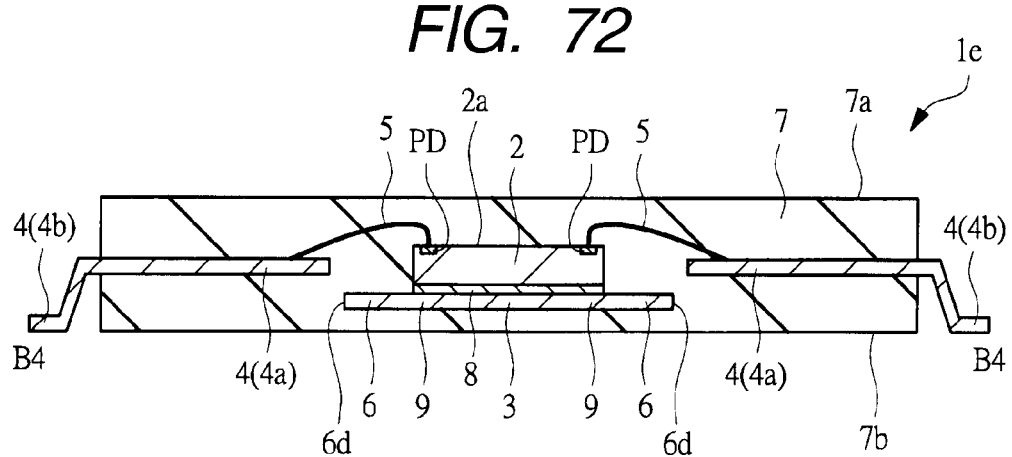
FIG. 72 is a section view of the semiconductor device in the ninth embodiment of the present invention.
Figure 73:
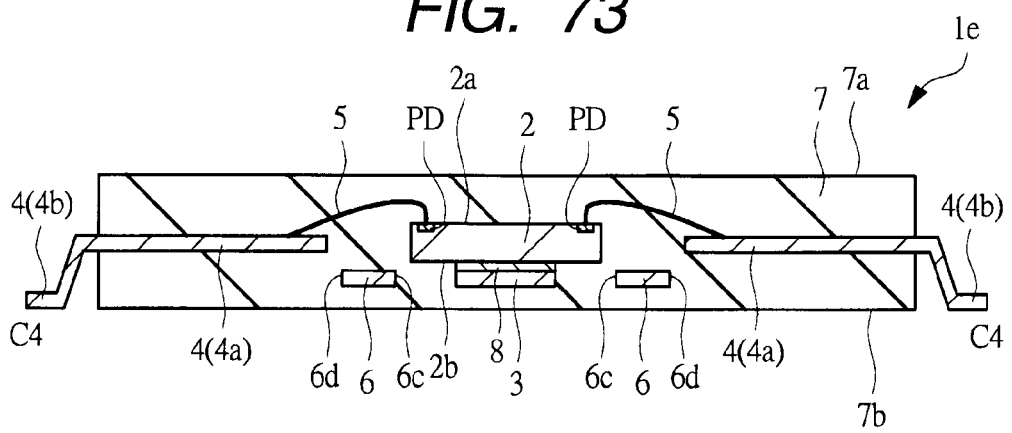
FIG. 73 is a section view of the semiconductor device in the ninth embodiment of the present invention.

FIG. 69 is a plan perspective view (top view) of a semiconductor device 1*e* in the present embodiment, showing a state where the sealing resin part 7 is viewed perspectively. FIG. 70 is a plan perspective view (top view) of the semiconductor device 1*e* when the semiconductor chip 2 and the bonding wire 5 are removed (viewed perspectively) in FIG. 69 and for easier understanding, the position where the semiconductor chip 2 is mounted (arranged) is indicated by a dotted line. FIG. 71 to FIG. 73 are each a section view (side surface section view) of the semiconductor device 1*e*. The section view at the position along the A4-A4 line shown in FIG. 70 substantially corresponds to FIG. 71, the section view at the position along the B4-B4 line shown in FIG. 70 substantially corresponds to FIG. 72, and the section view at the position along the C4-C4 line shown in FIG. 70 substantially corresponds to FIG. 73.

In the present embodiment, the structure in the second embodiment is applied to an SOP (Small Outline Package) semiconductor device. Because of this, the semiconductor device 1*e* in the present embodiment shown in FIG. 69 to FIG. 73 is a resin-sealed semiconductor package, that is, an SOP semiconductor device, and different from the semiconductor device 1*a* in the second embodiment in the following points.

The semiconductor device 1*a* in the second embodiment is a QFP semiconductor device and from the four sides (side surface constituting the four sides) of the sealing resin part 7 in the shape of a plane rectangle, the outer lead parts 4*b* of the leads 4 project, respectively. Then, the four suspension leads 10 are provided and the four suspension leads 10 extend in the sealing resin part 7 from the four corner parts of the heat dissipating plate 6 in the form of a frame toward the four corner parts of the sealing resin part 7 in the shape of a plane rectangle.

In contrast to the above, in the semiconductor device 1*e* in the present embodiment shown in FIG. 69 to FIG. 73, the outer lead parts 4*b* of the leads 4 project, respectively, from the two long sides (side surface constituting the two long sides) of the sealing resin part 7 in the shape of a plane rectangle having long sides and short sides. Then, the two suspension leads 10 are provided and the two suspension leads 10 extend in the sealing resin part 7 from the center part of the two sides in opposition to each other of the heat dissipating plate 6 in the form of a frame toward the center part of the two sides in opposition to each other of the sealing resin part 7 in the shape of a plane rectangle.

Other configurations of the semiconductor device 1*e* in the present embodiment are substantially the same as those of the semiconductor device 1*a* in the second embodiment, and therefore, their explanation is omitted here.

As in the second embodiment, in the present embodiment also, it is possible to dissipate heat in the semiconductor chip 2 through a path through which heat is dissipated from the back surface 2*b* of the semiconductor chip 2 to the heat dissipating plate 6 via the adhesive 8, the die pad 3, and the member 9, and the heat is dissipated from the heat dissipating plate 6 to the inner lead part 4*a* via the sealing resin part 7, in addition to the path through which heat is dissipated from the side surface of the semiconductor chip 2 to the inner lead 4*a* via the sealing resin part 7 as the second heat dissipation path (heat dissipation path shown by the arrow H2 in FIG. 8). Because of this, it is possible to improve the heat dissipation characteristics of the semiconductor device 1*e*.

The invention developed by the inventors is specifically explained as above based on the embodiments, however, it is needless to say that the present invention is not limited to the embodiments and there can be various modifications in the scope without departing from its gist.

The present invention is suitable when applied to a semiconductor device in the form of a semiconductor package and a method of manufacturing the same.

What is claimed is:
1. A semiconductor device comprising:
a semiconductor chip having a first main surface, a plurality of electrodes formed on the first main surface, and a first back surface on the opposite side of the first main surface;
a plurality of leads arranged around the semiconductor chip;
a bonding wire that electrically couples the leads and the electrodes, respectively;
a chip mounting part having a second main surface on which the semiconductor chip is mounted and a second back surface on the opposite side of the second main surface;
a frame body part having a third main surface facing in the same direction as that of the second main surface and a third back surface on the opposite side of the third main surface, and arranged between the chip mounting part and the lead so as to surround the chip mounting part;
a plurality of suspension leads linked to the outer edge of the frame body part; and
a sealing body that seals the semiconductor chip, the bonding wire, the chip mounting part, the frame body part, the suspension lead, and part of the lead,
wherein the chip mounting part is located immediately under the semiconductor chip and has a first part smaller than the outer shape of the semiconductor chip and a plurality of second parts that connect the first part and the inner edge of the frame body part, and
wherein the second main surface of the first part and the second main surface of the second part of the part in opposition to the first back surface of the semiconductor chip are bonded to the first back surface of the semiconductor chip in their entire surfaces with an adhesive.

2. The semiconductor device according to claim 1,
wherein the sealing body has the shape of a plane rectangle, and
wherein the respective directions in which the second parts extend are perpendicular to each side of the sealing body.

3. The semiconductor device according to claim 2,
wherein the chip mounting part is provided with the four second parts,
wherein the frame body part has four sides along the four sides of the semiconductor chip, respectively, and
wherein the positions of the inner edges of the frame body part, where the four second parts are linked, are center parts of the four sides of the frame body part, respectively.

4. The semiconductor device according to claim 3,
wherein as to the width from the outer edge to the inner edge of the frame body part, the width from the outer edge to the inner edge at the respective center parts of the four sides of the frame body part is greater than the width of parts other than the center parts, and
wherein the tip ends of the leads are arranged along the outer edge of the frame body part.

5. The semiconductor device according to claim 4,
wherein the frame body part does not overlap the semiconductor chip in a planar manner, and
wherein the outer circumference of the semiconductor chip is located inside the inner edge of the frame body part.

6. The semiconductor device according to claim 5,
wherein the width in the direction perpendicular to the direction in which the second part extends is greater than the width in the direction perpendicular to the direction in which the suspension leads extend.

7. The semiconductor device according to claim 6,
wherein the thermal conductivity of the adhesive is higher than the thermal conductivity of the sealing body.

8. The semiconductor device according to claim 7,
wherein the adhesive is a silver paste.

9. The semiconductor device according to claim 8,
wherein the sealing body is bonded to the part in opposition to neither the first part of the first back surface of the semiconductor chip nor the second parts.

10. The semiconductor device according to claim 9,
wherein the plane figure of the first part of the chip mounting part is a circle, and
wherein the diameter of the circle is greater than the width in the direction perpendicular to the direction in which the second part extends.

11. The semiconductor device according to claim 10,
wherein the suspension leads extend within the sealing body so that the end part on the opposite side of the side linked to the outer edge of the frame body part reaches the side surface of the sealing body,
wherein the respective leads have a fourth main surface facing in the same direction as that of the second main surface of the chip mounting part, and
wherein the respective suspension leads are bent so that the second main surface of the chip mounting part and the third main surface of the frame body part are lower than the fourth main surface of the leads.

12. The semiconductor device according to claim 10,
wherein the chip mounting part further has a third part between the second part and the inner edge of the frame body part, and
wherein the third part is bent so that the second main surface of the first part and the second parts of the chip mounting part is lower than the third main surface of the frame body part.

13. A semiconductor device comprising:
a semiconductor chip having a first main surface, a plurality of electrodes formed on the first main surface, and a first back surface on the opposite side of the first main surface;
a plurality of leads arranged around the semiconductor chip;
a bonding wire that electrically couples the leads and the electrodes, respectively;
a chip mounting part having a second main surface on which the semiconductor chip is mounted and a second back surface on the opposite side of the second main surface;
a frame body part having a third main surface facing in the same direction as that of the second main surface and a third back surface on the opposite side of the third main surface, and arranged between the chip mounting part and the lead so as to surround the chip mounting part;
a plurality of suspension leads linked to the outer edge of the frame body part; and
a sealing body part that seals the semiconductor chip, the bonding wire, the chip mounting part, the frame body part, the suspension lead, and part of the lead,
wherein the chip mounting part is located immediately under the semiconductor chip and has a first part smaller than the outer shape of the semiconductor chip and a plurality of second parts that connect the first part and the inner edge of the frame body part,
wherein the second main surface of the first part and the second main surface of the second part of the part in opposition to the first back surface of the semiconductor chip are bonded to the first back surface in their entire surfaces with an adhesive, and
wherein the thermal conductivity of the adhesive is higher than the thermal conductivity of the sealing body.

14. A semiconductor device comprising:
a semiconductor chip having a first main surface, a plurality of electrodes formed on the first main surface, and a first back surface on the opposite side of the first main surface;
a plurality of leads arranged around the semiconductor chip;
a bonding wire that electrically couples the leads and the electrodes, respectively;
a chip mounting part having a second main surface on which the semiconductor chip is mounted and a second back surface on the opposite side of the second main surface;
a plurality of suspension leads linked to the chip mounting part; and
a sealing body that seals the semiconductor chip, the bonding wire, the chip mounting part, the suspension lead, and part of the lead,
wherein the outer edge of the chip mounting part is located outside the outer circumference of the semiconductor chip,
wherein in the chip mounting part, a plurality of openings that penetrate through from the second main surface to the second back surface is formed,
wherein the respective openings have a part that overlaps the semiconductor chip in a planar manner and a part that does not, and wherein the second main surface of the chip mounting part in the region in which the second main surface is in opposition to the first back surface of the semiconductor chip and in which the openings are not formed is bonded to the first back surface of the semiconductor chip in its entire surface with an adhesive.

15. The semiconductor device according to claim 14, wherein the opening is arranged on a plane so as to surround the corners of the semiconductor chip.

16. A method of manufacturing a semiconductor device, comprising the steps of:
   (a) preparing a lead frame having:
      a chip mounting part having a frame body part, a first part located in the center of a region surrounded by the frame body part, and a plurality of second parts that connect the first part and the inner edge of the frame body part;
      and a plurality of leads arranged around the frame body part;
   (b) applying an adhesive over the main surface of the chip mounting part of the lead frame;
   (c) after the step (b), arranging the semiconductor chip via the adhesive over the main surface of the chip mounting part of the lead frame so that the back surface of the semiconductor chip is in opposition to the main surface of the chip mounting part, and spreading the adhesive on the entire surface of the part where the main surface of the chip mounting part and the back surface of the semiconductor chip are in opposition to each other by applying a load to the semiconductor chip; and
   (d) after the step (c), curing the adhesive.

17. The method of manufacturing a semiconductor device according to claim 16,
   wherein in the step (b), the adhesive is applied over the main surface of the chip mounting part of the lead frame using a multipoint nozzle.

18. The method of manufacturing a semiconductor device according to claim 17, further comprising the steps of:
   (e) after the step (d), electrically coupling a plurality of electrodes formed on the main surface on the opposite side of the back surface of the semiconductor chip and the leads via a plurality of bonding wires, respectively; and
   (f) forming a sealing resin part that seals the semiconductor chip, the chip mounting part, the bonding wire, and part of the lead,
   wherein the step (e) is performed while vacuum-attracting the exposed part of the back surface of the semiconductor chip in opposition to neither the first part of the semiconductor chip nor the second parts.

19. The method of manufacturing a semiconductor device according to claim 16, further comprising the steps of:
   (e) after the step (d), electrically coupling a plurality of electrodes formed on the main surface on the opposite side of the back surface of the semiconductor chip and the leads via a plurality of bonding wires, respectively; and
   (f) forming a sealing resin part that seals the semiconductor chip, the chip mounting part, the bonding wire, and part of the lead,
   wherein the step (e) is performed while vacuum-attracting the back surface of the chip mounting part and the back surface of the frame body part.

* * * * *